United States Patent
Liu et al.

(10) Patent No.: US 12,080,226 B2
(45) Date of Patent: Sep. 3, 2024

(54) DISPLAY SUBSTRATE, AND DISPLAY DEVICE

(71) Applicants: Beijing BOE Technology Development Co., Ltd., Beijing (CN); BOE Technology Group Co., Ltd., Beijing (CN)

(72) Inventors: Miao Liu, Beijing (CN); Xueguang Hao, Beijing (CN); Jingbo Xu, Beijing (CN); Xing Yao, Beijing (CN); Jingquan Wang, Beijing (CN); Xinyin Wu, Beijing (CN); Xinguo Li, Beijing (CN); Zhichong Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/275,012

(22) PCT Filed: Jul. 8, 2022

(86) PCT No.: PCT/CN2022/104688
§ 371 (c)(1),
(2) Date: Jul. 30, 2023

(87) PCT Pub. No.: WO2023/280314
PCT Pub. Date: Jan. 12, 2023

(65) Prior Publication Data
US 2024/0112623 A1    Apr. 4, 2024

(30) Foreign Application Priority Data
Jul. 9, 2021   (CN) .......................... 202110774729.4

(51) Int. Cl.
G09G 3/3266 (2016.01)
G09G 3/32 (2016.01)
G09G 3/3208 (2016.01)

(52) U.S. Cl.
CPC ............. *G09G 3/32* (2013.01); *G09G 3/3266* (2013.01); *G09G 3/3208* (2013.01);
(Continued)

(58) Field of Classification Search
CPC ...... G09G 3/32; G09G 3/3266; G09G 3/3208; G09G 2300/0408; G09G 2300/0426;
(Continued)

(56) References Cited

U.S. PATENT DOCUMENTS 11,475,844 B2 * 10/2022 Dai ..................... G09G 3/3266
2008/0297495 A1   12/2008 Jung et al.
(Continued)

FOREIGN PATENT DOCUMENTS

CN    101853705 A    10/2010
CN    101861625 A    10/2010
(Continued)

OTHER PUBLICATIONS

International Search Report for PCT/CN2022/104688 Mailed Sep. 21, 2022.
(Continued)

*Primary Examiner* — Mihir K Rayan
(74) *Attorney, Agent, or Firm* — Ling Wu; Stephen Yang; Ling and Yang Intellectual Property

(57) ABSTRACT

A display substrate, comprising a base substrate and a scan drive control circuit which is disposed in a non-display area of the base substrate. The scan drive control circuit comprises an input circuit, an output control circuit, and an output circuit. The output control circuit is connected to the
(Continued)

input circuit and the output circuit. The output control circuit comprises a first node control capacitor and a second node control capacitor. The length of the first node control capacitor in a first direction $L_{C1k}$, the length of the second node control capacitor in the first direction $L_{C2k}$ and the length of the scan drive control circuit in the first direction $L_Y$ satisfy the following formula:

$$\frac{L_{C1k}}{L_Y} < \frac{L_{C2k}}{L_Y}; \frac{L_{C1k}}{L_Y} < 0.20.$$

20 Claims, 19 Drawing Sheets

(52) U.S. Cl.
CPC ............. *G09G 2300/0408* (2013.01); *G09G 2300/0426* (2013.01); *G09G 2300/0809* (2013.01); *G09G 2310/0267* (2013.01); *G09G 2310/0286* (2013.01); *G09G 2320/0223* (2013.01)

(58) Field of Classification Search
CPC ... G09G 2300/0809; G09G 2310/0267; G09G 2310/0286; G09G 2320/0223; G09G 3/20; G11C 19/28
See application file for complete search history.

(56) References Cited

U.S. PATENT DOCUMENTS

| | | | |
|---|---|---|---|
| 2010/0214206 A1 | 8/2010 | Yokoyama et al. | |
| 2013/0222352 A1 | 8/2013 | Jeong | |
| 2016/0351128 A1 | 12/2016 | Li | |
| 2017/0110060 A1 | 4/2017 | Han et al. | |
| 2020/0035162 A1* | 1/2020 | In | H10K 59/131 |
| 2020/0342808 A1 | 10/2020 | Han et al. | |
| 2021/0142713 A1 | 5/2021 | Feng et al. | |
| 2021/0193025 A1 | 6/2021 | Xu et al. | |
| 2021/0201751 A1 | 7/2021 | Feng et al. | |
| 2021/0201806 A1 | 7/2021 | Feng et al. | |
| 2022/0068212 A1* | 3/2022 | Yao | H10K 59/131 |
| 2022/0114969 A1* | 4/2022 | Wang | G09G 3/3266 |
| 2022/0310010 A1 | 9/2022 | Cheng et al. | |
| 2022/0343855 A1 | 10/2022 | Shang et al. | |
| 2023/0005415 A1 | 1/2023 | Shang et al. | |
| 2023/0084070 A1 | 3/2023 | Feng et al. | |
| 2023/0252933 A1 | 8/2023 | Guo et al. | |

FOREIGN PATENT DOCUMENTS

| | | |
|---|---|---|
| CN | 105243995 A | 1/2016 |
| CN | 105719613 A | 6/2016 |
| CN | 107093414 A | 8/2017 |
| CN | 107966860 A | 4/2018 |
| CN | 207489447 U | 6/2018 |
| CN | 108538256 A | 9/2018 |
| CN | 109584799 A | 4/2019 |
| CN | 109658865 A | 4/2019 |
| CN | 109935269 A | 6/2019 |
| CN | 110148382 A | 8/2019 |
| CN | 110164352 A | 8/2019 |
| CN | 111128080 A | 5/2020 |
| CN | 111243650 A | 6/2020 |
| CN | 111415624 A | 7/2020 |
| CN | 111445832 A | 7/2020 |
| CN | 111477181 A | 7/2020 |
| CN | 210956110 U | 7/2020 |
| CN | 111816691 A | 10/2020 |
| CN | 112419960 A | 2/2021 |
| CN | 112687230 A | 4/2021 |
| CN | 113241040 A | 8/2021 |
| CN | 113920937 A | 1/2022 |
| EP | 4280202 A1 | 11/2023 |
| JP | 2000187461 A | 7/2000 |
| WO | 2021022554 A1 | 2/2021 |

OTHER PUBLICATIONS

Office Action dated Aug. 18, 2021 for Chinese Patent Application No. 202110774729.4 and English Translation.
Xue et al., A low power TG a-IGZO TFT gate driver circuit for AMOLED display, IEEE 2019.
Zhang et al., Low Power Driver method based on TFT-LCD, Chinese Journal of Liquid Crystals and Displays, Mar. 2016, pp. 291-294, vol. 31 No. 3.

* cited by examiner

DISPLAY SUBSTRATE, AND DISPLAY DEVICE

CROSS-REFERENCE TO RELATED APPLICATIONS

The present application is a U.S. National Phase Entry of International Application PCT/CN2022/104688 having an international filing date of Jul. 8, 2022, which claims priority of Chinese Patent Application No. 202110774729.4, filed to the CNIPA on Jul. 9, 2021 and entitled "Display substrate and Display Device", the contents of which should be regarded as being incorporated herein by reference.

TECHNICAL FIELD

The present disclosure relates to, but is not limited to, the field of display technology, in particular to a display substrate and a display device.

BACKGROUND

An Organic Light Emitting Diode (OLED) and a Quantum dot Light Emitting Diode (QLED) are active light emitting display devices, which have advantages of self-luminescence, wide angle of view, high contrast ratio, low power consumption, very high response speed, lightness and thinness, bendability, low cost, etc. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matter described herein in detail. The summary is not intended to limit the protection scope of claims.

Embodiments of the present disclosure provide a display substrate and a display device.

In one aspect, an embodiment of the present disclosure provides a display substrate including a base substrate and a scan drive control circuit disposed in a non-display area of the base substrate. The scan drive control circuit includes an input circuit, an output control circuit and an output circuit. The output control circuit is connected to the input circuit and the output circuit. The output control circuit includes a first node control capacitor and a second node control capacitor. A length $L_{C1k}$ of the first node control capacitor in a first direction, a length $L_{C2k}$ of the second node control capacitor in the first direction, and a length $L_Y$ of the scan drive control circuit in the first direction satisfy:

$$\frac{L_{C1k}}{L_Y} < \frac{L_{C2k}}{L_Y}; \frac{L_{C1k}}{L_Y} < 0.20.$$

In some exemplary embodiments, the first node control capacitor includes a first capacitor and a third capacitor. Lengths of the first capacitor, the third capacitor, the second node control capacitor and the scan drive control circuit in the first direction satisfy:

$$\frac{L_{C3}}{L_Y} < \frac{L_{C1}}{L_Y} < \frac{L_{C2k}}{L_Y};$$

$$\frac{L_{C3}}{L_Y} < \frac{L_{C1}}{L_Y} < 0.20;$$

where $L_{C1}$ is a length of the first capacitor in the first direction, $L_{C3}$ is a length of the third capacitor in the first direction, $L_{C2k}$ is the length of the second node control capacitor in the first direction, $L_Y$ is the length of the scan drive control circuit in the first direction.

In some exemplary embodiments, the lengths of the first capacitor and the scan drive control circuit in the first direction satisfy:

$$0.07 \leq \frac{L_{C1}}{L_Y} < 0.20;$$

the lengths of the second node control capacitor and the scan drive control circuit in the first direction satisfy:

$$0.20 \leq \frac{L_{C2k}}{L_Y} \leq 0.60;$$

the lengths of the third capacitor and the scan drive control circuit in the first direction satisfy:

$$0.03 \leq \frac{L_{C3}}{L_Y} \leq 0.09.$$

In some exemplary embodiments, $$\frac{L_{C1}}{L_Y}$$

is one of the following: 0.09, 0.10, 0.14;

$$\frac{L_{C2k}}{L_Y}$$

is one of the following: 0.22, 0.35, 0.48;

$$\frac{L_{C3}}{L_Y}$$

is one of the following: 0.07, 0.06, 0.05.

In some exemplary embodiments, $$0.07 \leq \frac{L_{C1}}{L_Y} \leq 0.09.$$

In some exemplary embodiments, $$0.48 \leq \frac{L_{C2k}}{L_Y} \leq 0.60.$$

In some exemplary embodiments, $$0.06 \leq \frac{L_{C3}}{L_Y} \leq 0.09.$$

In some exemplary embodiments, the lengths of the first capacitor, the second node control capacitor, and the third capacitor in the first direction satisfy:

$$\frac{L_{C3}}{L_{C2k}} < \frac{L_{C1}}{L_{C2k}} < \frac{L_{C3}}{L_{C1}}.$$

In some exemplary embodiments, the third capacitor is connected to a first power supply line; projections of the third capacitor and the first power supply line on the base substrate are overlapped with each other, and an overlapped area between the projections of the third capacitor and the first power supply line satisfies:

$$\tfrac{1}{3}S_{C3} < S_{C3-1} \leq S_{C2};$$

wherein $S_{C3}$ is an area of the projection of the third capacitor on the base substrate, $S_{C3-1}$ is the overlapped area between the projections of the third capacitor and the first power supply line on the base substrate; the second node control capacitor includes a second capacitor, $S_{C2}$ is an area of the projection of the second capacitor on the base substrate.

In some exemplary embodiments, projections of the second node control capacitor and the first power supply line on the base substrate are overlapped with each other, and an overlapped area between the projections of the second capacitor and the first power supply line satisfies:

$$\tfrac{1}{4}X2*L5 < S_{C2k-1} \leq X2*L5;$$

where, $S_{C2k-1}$ is the overlapped area between the projections of the second node control capacitor and the first power supply line on the base substrate, X2 is a length of the first power supply line in the first direction, L5 is a length of an overlapped area between a projection of one of capacitors in the second node control capacitor on the base substrate and a projection of the first power supply line on the base substrate in a second direction; the second direction intersects the first direction.

In some exemplary embodiments, the input circuit is connected to a second power supply line; projections of the second node control capacitor and the second power supply line on the base substrate are overlapped with each other, and the overlapped area between the projections of the second node control capacitor and the second power supply line satisfies:

$$\tfrac{1}{4}X3*L6 < S_{C2k-2} \leq X3*L6;$$

where $S_{C2k-2}$ is the overlapped area between the projections of the second node control capacitor and the second power supply line on the base substrate, X3 is a length of the second power supply line in the first direction, L6 is a length of an overlapped area between a projection of one of capacitors in the second node control capacitor on the base substrate and a projection of the second power supply line on the base substrate in a second direction; the second direction intersects the first direction.

In some exemplary embodiments, a projection of the first capacitor on the base substrate is between projections of the first power supply line and the second power supply line on the base substrate. A distance L7 between a center of the first capacitor in the first direction and a side edge of the first power supply line away from the first capacitor in the first direction is greater than a distance L8 between the center of the first capacitor in the first direction and a side edge of the second power supply line close to the first capacitor in the first direction, and L7≥2*L8.

In some exemplary embodiments, the input circuit includes a first transistor; a control electrode of the first transistor is connected to a first clock signal line, a first electrode of the first transistor is connected to a signal input terminal, and a second electrode of the first transistor is connected to a second node. An active layer of the first transistor is adjacent to a second power supply line. A distance L2 between a side edge of a channel region of the active layer of the first transistor close to the second power supply line and a side edge of the second power supply line away from the first transistor satisfies: 0≤L2≤4$W_{PL2}$; where $W_{PL2}$ is a width of the second power supply line.

In some exemplary embodiments, the input circuit includes a third transistor. A control electrode of the third transistor is connected to the first clock signal line, a first electrode of the third transistor is connected to the second power supply line, and a second electrode of the third transistor is connected to a third node. The second power supply line is located at a side of the third transistor away from the first clock signal line or a second clock signal line. A distance L3 between a side edge of a channel region of an active layer of the third transistor close to the second power supply line and a side edge of the second power supply line away from the third transistor satisfies: 0≤L3≤4$W_{PL2}$; where $W_{PL2}$ is a width of the second power supply line.

In some exemplary embodiments, the input circuit is connected to the first clock signal line and the second power supply line, and the output control circuit is connected to the second clock signal line; the input circuit includes a second transistor; a control electrode of the second transistor is connected to the second node, a first electrode of the second transistor is connected to the first clock signal line, and a second electrode of the second transistor is connected to the third node. The second power supply line is located at a side of the second transistor away from the first clock signal line. An active layer of the second transistor is adjacent to the second power supply line. A distance L4 between a side edge of a channel region of the active layer of the second transistor close to the second power supply line and a side edge of the second power supply line away from the second transistor satisfies: 0≤L4≤3 $W_{PL2}$; where $W_{PL2}$ is a width of the second power supply line.

In some exemplary embodiments, the output control circuit includes a first output control sub-circuit. The first output control sub-circuit includes a fourth transistor and a fifth transistor. A control electrode of the fourth transistor is connected to the second node, a first electrode of the fourth transistor is connected to a second electrode of the fifth transistor, and a second electrode of the fourth transistor is connected to a second clock signal line; a control electrode of the fifth transistor is connected to a third node, and a first electrode of the fifth transistor is connected to a first power supply line. The fourth transistor and the fifth transistor are located at a side of the second power supply line away from the second clock signal line. An angle between an extension direction of an active layer of the fourth transistor and an extension direction of an active layer of the fifth transistor is greater than 85° and less than 95°.

In some exemplary embodiments, a width $W_{T4}$ of a channel region of the active layer of the fourth transistor and a width $W_{T5}$ of a channel region of the active layer of the fifth transistor satisfy: 2$W_{T4}$<$W_{T5}$.

In some exemplary embodiments, an angle between the extension direction of the active layer of the fourth transistor and an extension direction of an active layer of the first transistor of the input circuit is greater than 85° and less than 95°.

In some exemplary embodiments, the output control circuit includes a second output control sub-circuit which includes a seventh transistor. A control electrode of the seventh transistor is connected to a second electrode of the first capacitor, and a first electrode of the seventh transistor is connected to the first node. The seventh transistor is adjacent to the first capacitor, and the seventh transistor is located between the first capacitor and the first power supply line.

In some exemplary embodiments, the second output control sub-circuit further includes a sixth transistor. A control electrode of the sixth transistor is connected to the first electrode of the first capacitor, a second electrode of the sixth transistor is connected to the second electrode of the seventh transistor, and a first electrode of the sixth transistor is connected to the second signal terminal. An extension direction of an active layer of the seventh transistor is approximately parallel to an extension direction of an active layer of the sixth transistor.

In some exemplary embodiments, the output control circuit includes a third output control sub-circuit which includes an eighth transistor and a third capacitor. A control electrode of the eighth transistor is connected to the second node, a first electrode of the eighth transistor is connected to the first power supply line, and a second electrode of the eighth transistor is connected to the first node. A first electrode of the third capacitor is connected to the first node, and a second electrode of the third capacitor is connected to the first power supply line. The input circuit includes a first transistor. The first transistor, the eighth transistor, and the third capacitor are sequentially arranged along the first direction, and an extension direction of the active layer of the first transistor is approximately parallel to an extension direction of an active layer of the eighth transistor.

In some exemplary embodiments, a distance L9 between a side edge of the active layer of the eighth transistor close to the third capacitor and a side edge of the third capacitor close to the eighth transistor satisfies: $W_{CLK} < L9 \leq W_{PL1}$; where $W_{CLK}$ is a width of a clock signal line, $W_{PL1}$ is a width of the first power supply line.

In some exemplary embodiments, the input circuit is connected to the first clock signal line; the output control circuit is connected to the second clock signal line and the first power supply line; the output circuit is connected to the first power supply line and a third power supply line. The first clock signal line, the second clock signal line, an initial signal line, the first power supply line and the third power supply line are sequentially arranged along the first direction.

In some exemplary embodiments, capacitance values of a first capacitor, a third capacitor, and a second node control capacitor satisfy:

$$C_1 < C_3 < C_{2k};$$

$$\frac{C_1}{C_{2k}} < \frac{C_3}{C_{2k}} < \frac{C_1}{C_3};$$

where $C_1$ is a capacitance value of the first capacitor, $C_3$ is a capacitance value of the third capacitor, $C_{2k}$ is a capacitance value of the second node control capacitor.

In some exemplary embodiments, the first electrode of the first capacitor is connected to the third node and the second electrode of the first capacitor is connected to a seventh transistor. A first electrode of the third capacitor is connected to the first node, and a second electrode of the third capacitor is connected to the first power supply line. A first electrode of the second node control capacitor is connected to the second node. A sum of the capacitance values of the first capacitor and the third capacitor is smaller than the capacitance value of the second node control capacitor.

In some exemplary embodiments, the second node control capacitor includes a second capacitor having a first electrode connected to the second node and a second electrode connected to the signal output terminal.

In some exemplary embodiments, the second node control capacitor further includes a fourth capacitor. A first electrode of the fourth capacitor is connected to the second node and a second electrode of the fourth capacitor is connected to the fourth transistor and the fifth transistor.

In some exemplary embodiments, the first electrode of the second capacitor of the scan drive control circuit of current stage and a first electrode of a fourth capacitor of a scan drive control circuit of a next stage form an integrated structure.

In some exemplary embodiments, the output circuit includes a tenth transistor. The second node control capacitor includes a second capacitor, and the first electrode of the second capacitor and a control electrode of the tenth transistor form an integrated structure.

In another aspect, an embodiment of the present disclosure provides a display device, which includes the aforementioned di splay substrate.

In another aspect, an embodiment of the present disclosure provides a display substrate including a scan drive control circuit. The scan drive control circuit includes an input circuit, an output control circuit and an output circuit. The input circuit is connected to a signal input terminal, a first clock signal terminal, a first voltage terminal and an output control circuit, and is configured to transmit a signal of the signal input terminal to the output control circuit and transmit a signal of the first clock signal terminal or the first voltage terminal to the output control circuit under control of the first clock signal terminal. The output control circuit is connected to a first signal terminal, a second signal terminal, a second clock signal terminal, a second voltage terminal, a first node, a second node and an input circuit, and is configured to store a signal of the first signal terminal under control of the input circuit, and transmit a signal of the second signal terminal to the first node under control of the input circuit and the second clock signal terminal; or, the output control circuit is configured to store a signal of the second clock signal terminal under the control of the input circuit, and transmit a signal of the second voltage terminal to the first node under control of the second node. The output circuit is connected to the first voltage terminal, a second voltage terminal, a signal output terminal, the first node and the second node, and is configured to output a signal of the first voltage terminal to the signal output terminal under the control of the second node, or to output the signal of the second voltage terminal to the signal output terminal under control of the first node.

In some exemplary embodiments, the input circuit includes a first input sub-circuit and a second input sub-circuit. The output control circuit includes a first output control sub-circuit, a second output control sub-circuit and a third output control sub-circuit; the output circuit includes a first output sub-circuit and a second output sub-circuit. The first input sub-circuit is connected to the signal input terminal, the first clock signal terminal and the first output control sub-circuit, and is configured to transmit the signal of the signal input terminal to the first output control sub-circuit under the control of the first clock signal terminal. The second input sub-circuit is connected to the first voltage terminal, the first clock signal terminal, the first input sub-circuit and the second output control sub-circuit, and is configured to transmit a signal of the first clock signal terminal or the first voltage terminal to the second output control sub-circuit under control of the first input sub-circuit or the first clock signal terminal. The first output control sub-circuit is connected to the first signal terminal, the second clock signal terminal, the second node, the first input sub-circuit and the second input sub-circuit, and is configured to store a signal of the first signal terminal or the second clock signal terminal under the control of the first input sub-circuit or the second input sub-circuit. The second output control sub-circuit is connected to the second signal terminal, the second clock signal terminal, the first node and the second input sub-circuit, and is configured to transmit the signal of the second signal terminal to the first node under the control of the second input sub-circuit and the second clock signal terminal. The third output control sub-circuit is connected to the second voltage terminal, the first node and the second node, and is configured to transmit the signal of the second voltage terminal to the first node under the control of the second node. The first output sub-circuit is connected to the first voltage terminal, the signal output terminal and the second node, and is configured to output the signal of the first voltage terminal to the signal output terminal under the control of the second node. The second output sub-circuit is connected to the second voltage terminal, the signal output terminal and the first node, and is configured to output the signal of the second voltage terminal to the signal output terminal under the control of the first node.

In some exemplary embodiments, the first input sub-circuit includes: a first transistor. A control electrode of the first transistor is connected to the first clock signal terminal, a first electrode of the first transistor is connected to the signal input terminal, and a second electrode of the first transistor is connected to the second node. The second input sub-circuit includes a second transistor and a third transistor. A control electrode of the second transistor is connected to the second node, a first electrode of the second transistor is connected to the first clock signal terminal, and a second electrode of the second transistor is connected to a third node; a control electrode of the third transistor is connected to the first clock signal terminal, a first electrode of the third transistor is connected to the first voltage terminal, and a second electrode of the third transistor is connected to the third node. The first output control sub-circuit includes a fourth transistor and a fifth transistor. A control electrode of the fourth transistor is connected to the second node, a first electrode of the fourth transistor is connected to the second clock signal terminal, and a second electrode of the fourth transistor is connected to a second electrode of the fifth transistor; a control electrode of the fifth transistor is connected to the third node, and a first electrode of the fifth transistor is connected to the first signal terminal. The first output sub-circuit includes a tenth transistor. A control electrode of the tenth transistor is connected to the second node, a first electrode of the tenth transistor is connected to the first voltage terminal, and a second electrode of the tenth transistor is connected to the signal output terminal.

In some exemplary embodiments, the first input sub-circuit includes: a first transistor. A control electrode of the first transistor is connected to the first clock signal terminal, a first electrode of the first transistor is connected to the signal input terminal, and a second electrode of the first transistor is connected to the fourth node. The second input sub-circuit includes a second transistor and a third transistor. A control electrode of the second transistor is connected to the fourth node, a first electrode of the second transistor is connected to the first clock signal terminal, and a second electrode of the second transistor is connected to a third node; a control electrode of the third transistor is connected to the first clock signal terminal, a first electrode of the third transistor is connected to the first voltage terminal, and a second electrode of the third transistor is connected to the third node. The first output control sub-circuit includes a fourth transistor, a fifth transistor and an eleventh transistor. A control electrode of the fourth transistor is connected to the second node, a first electrode of the fourth transistor is connected to the second clock signal terminal, and a second electrode of the fourth transistor is connected to a second electrode of the fifth transistor; a control electrode of the fifth transistor is connected to the third node, and a first electrode of the fifth transistor is connected to the first signal terminal; a control electrode of the eleventh transistor is connected to the first voltage terminal, a first electrode of the eleventh transistor is connected to the fourth node, and a second electrode of the eleventh transistor is connected to the second node. The first output sub-circuit includes a tenth transistor. A control electrode of the tenth transistor is connected to the second node, a first electrode of the tenth transistor is connected to the first voltage terminal, and a second electrode of the tenth transistor is connected to the signal output terminal.

In some exemplary embodiments, the second output control sub-circuit further includes: a fourth capacitor. A first electrode of the fourth capacitor is connected to the control electrodes of the fourth transistor and the tenth transistor.

In some exemplary embodiments, the second output control sub-circuit further includes: a fourth capacitor. A first electrode of the fourth capacitor is connected to the control electrodes of the fourth transistor and the tenth transistor.

In some exemplary embodiments, the first output control sub-circuit further includes a second capacitor. A first electrode of the second capacitor is connected to the second node.

In some exemplary embodiments, a second electrode of the second capacitor is connected to the signal output terminal.

In some exemplary embodiments, the second input sub-circuit is connected to the third node. The second output control sub-circuit includes a sixth transistor, a seventh transistor and a first capacitor. A control electrode of the sixth transistor is connected to the third node, a first electrode of the sixth transistor is connected to the second signal terminal, and a second electrode of the sixth transistor is connected to a second electrode of the seventh transistor. A control electrode of the seventh transistor is connected to the second clock signal terminal, and a first electrode of the seventh transistor is connected to the first node. A first electrode of the first capacitor is connected to the control electrode of the sixth transistor, and a second electrode of the first capacitor is connected to the seventh transistor.

In some exemplary embodiments, the second input sub-circuit is connected to the fifth node. The second output control sub-circuit includes a first capacitor, a sixth transistor, a seventh transistor, and a twelfth transistor. A control electrode of the sixth transistor is connected to the third node, a first electrode of the sixth transistor is connected to the second signal terminal, and the second electrode of the sixth transistor is connected to the second electrode of the seventh transistor. A control electrode of the seventh transistor is connected to the second clock signal terminal, and the first electrode of the seventh transistor is connected to the first node. A control electrode of the twelfth transistor is connected to the first voltage terminal, a first electrode of the twelfth transistor is connected to the fifth node, and a second electrode of the twelfth transistor is connected to the third node. A first electrode of the first capacitor is connected to the control electrode of the sixth transistor, and a second electrode of the first capacitor is connected to the seventh transistor.

In some exemplary embodiments, the third output control sub-circuit includes an eighth transistor and a third capacitor. A control electrode of the eighth transistor is connected to the second node, a first electrode of the eighth transistor is connected to the second voltage terminal, and a second electrode of the eighth transistor is connected to the first node. A first electrode of the third capacitor is connected to the first node, and a second electrode of the third capacitor is connected to the second voltage terminal. The second output sub-circuit includes a ninth transistor. A control electrode of the ninth transistor is connected to the first node, a first electrode of the ninth transistor is connected to the second voltage terminal, and a second electrode of the ninth transistor is connected to the signal output terminal.

In some exemplary embodiments, the first signal terminal is connected to the second voltage terminal or the first clock signal terminal.

In some exemplary embodiments, the second signal terminal is connected to the first voltage terminal or the second clock signal terminal.

In another aspect, an embodiment of the present disclosure provides a method for driving a display substrate, which is applied to the display substrate as described above. The driving method includes: the input circuit transmits the signal of the signal input terminal to the output control circuit and transmits the signal of the first clock signal terminal or the first voltage terminal to the output control circuit under control of a first clock signal terminal; the output control circuit stores the signal of the first signal terminal under control of the input circuit, and transmits the signal of the second signal terminal to the first node under control of the input circuit and the second clock signal terminal, and outputs the signal of the second voltage terminal to the signal output terminal under control of the first node; the output control circuit stores the signal of the second clock signal terminal under the control of the input circuit, and transmits the signal of the second voltage terminal to the first node under control of a second node; the output circuit outputs the signal of the first voltage terminal to the signal output terminal under the control of the second node.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
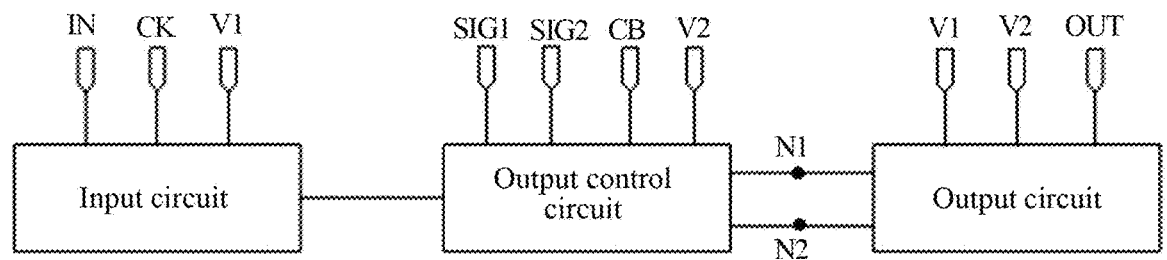
FIG. 1 is a schematic diagram of a structure of a scan drive control circuit according to at least one embodiment of the present disclosure.

The embodiments of the present disclosure will be described below with reference to the drawings in detail. Implementations may be practiced in a plurality of different forms. Those of ordinary skills in the art may easily understand such a fact that implementations and contents may be transformed into one or more forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, an implementation of the present disclosure is not necessarily limited to the size, and a shape and a size of one or more components in the drawings do not reflect an actual scale. In addition, the drawings schematically illustrate ideal examples, and one implementation of the present disclosure is not limited to the shapes, numerical values, or the like shown in the drawings.

Ordinal numerals such as "first", "second" and "third" in the present disclosure are set to avoid confusion between constituent elements, but not intended for restriction in quantity. In the present disclosure, "a plurality of/multiple" represents two or more than two.

In the present disclosure, for convenience, wordings "central", "up", "down", "front", "rear", "vertical", "horizontal", "top", "bottom", "inside", "outside" and the like indicating orientation or positional relationships are used to illustrate positional relationships between constituent elements with reference to the drawings, which are only used to facilitate describing the present specification and simplify the description, rather than indicating or implying that involved devices or elements must have specific orientations and be structured and operated in the specific orientations, and thus should not be understood as limitations on the present disclosure. The positional relationships between the constituent elements are changed as appropriate based on directions for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, a connection may be a fixed connection, a detachable connection, or an integrated connection; it may be a mechanical connection or an electrical connection; it may be a direct mutual connection, or an indirect connection through middleware, or internal communication between two elements. Those of ordinary skills in the art may understand meanings of the above-mentioned terms in the present disclosure according to situations. An "electrical connection" includes a case where constituent elements are connected together through an element with a certain electrical action. The "element with the certain electrical action" is not particularly limited as long as electrical signals can be transmitted between the connected constituent elements. Examples of "an element with a certain electrical action" not only include electrodes and wirings, but also include switching elements such as transistors, resistors, inductors, capacitors, other elements with one or more functions, etc.

In the present disclosure, a transistor refers to an element at least including three terminals, i.e., a gate electrode (gate), a drain electrode, and a source electrode. The transistor has a channel area between the drain electrode (drain electrode terminal, drain region, or drain) and the source electrode (source electrode terminal, source region, or source), and a current can flow through the drain electrode, the channel region, and the source electrode. In the present disclosure, the channel region refers to a region through which a current mainly flows.

In the present disclosure, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In a case that transistors with opposite polarities are used or a current direction is changed during operation of a circuit, functions of the "source electrode" and the "drain electrode" are sometimes interchangeable. Therefore, the "source electrode" and the "drain electrode" are interchangeable in the present disclosure.

In the present disclosure, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

In the present disclosure, "film" and "layer" are interchangeable. For example, a "conductive layer" may be replaced with a "conductive film" sometimes. Similarly, an "insulation film" may be replaced with an "insulation layer" sometimes.

In the present disclosure, "about", "approximate" and "approximately" refer to a case that a boundary is defined not so strictly and a process and measurement error within a range is allowed.

In some exemplary embodiments, the display substrate may include: a display area and a non-display area. For example, the non-display area may be located at a periphery of the display area. However, this embodiment is not limited thereto. The display area at least includes a plurality of pixel circuits regularly arranged, a plurality of gate lines (for example, including a scan line, a reset signal line, and a light emitting control line) extending along a first direction, a plurality of data lines extending along a second direction, and a power supply line. The first direction and the second direction are located in a same plane, and the first direction interacts with the second direction, for example, the first direction is perpendicular to the second direction.

In some exemplary embodiments, the non-display area is provided with a plurality of scan drive control circuits which may be configured to provide a gate drive signal to a pixel circuit of the display area.

FIG. 1 is a schematic diagram of a structure of a scan drive control circuit according to at least one embodiment of the present disclosure. As shown in FIG. 1, the scan drive control circuit provided in this embodiment includes an input circuit, an output control circuit and an output circuit.

The input circuit is connected to a signal input terminal IN, a first clock signal terminal CK, a first voltage terminal V1 and the output control circuit, and is configured to transmit a signal of the signal input terminal IN to the output control circuit and to transmit a signal of the first clock signal terminal CK or the first voltage terminal V1 to the output control circuit under control of the first clock signal terminal CK.

The output control circuit is connected to a first signal terminal SIG1, a second signal terminal SIG2, a second clock signal terminal CB, a second voltage terminal V2, a first node N1, a second node N2 and the input circuit, and is configured to store a signal of the first signal terminal SIG1 under control of the input circuit, and transmit a signal of the second signal terminal SIG2 to the first node N1 under control of the input circuit and the second clock signal terminal CB. Or, the output control circuit is configured to store a signal of the second clock signal terminal CB under the control of the input circuit, and transmit a signal of the second voltage terminal V2 to the first node N1 under control of the second node N2.

The output circuit is connected to the first voltage terminal V1, the second voltage terminal V2, a signal output terminal OUT, the first node N1 and the second node N2, and is configured to output the signal of the first voltage terminal V1 to the signal output terminal OUT under the control of the second node N2, or to output the signal of the second voltage terminal V2 to the signal output terminal OUT under control of the first node N1.

In some exemplary embodiments, input signals of the signal input terminal IN, the first clock signal terminal CK, and the second clock signal terminal CB may be pulse signals. The first voltage terminal V1 may provide a low-level signal continuously, and the second voltage terminal V2 may provide a high-level signal continuously. However, this embodiment is not limited thereto.

In some exemplary embodiments, the first signal terminal SIG1 may be connected to the second voltage terminal V2 or the first clock signal terminal CK. The second signal terminal SIG2 may be connected to the first voltage terminal V1 or the second clock signal terminal CB. However, this embodiment is not limited thereto.

In some exemplary embodiments, an output signal of the scan drive control circuit provided in this embodiment may be provided as a gate drive signal (e.g., a scan signal or a reset signal, or a light emitting control signal) to a pixel circuit of the display area. In some examples, the scan drive control circuit of this embodiment may be applied to a LTPO (Low Temperature Polycrystalline Oxide) display substrate, and may provide a gate driving signal to an N-type transistor in a pixel circuit of a display area. However, this embodiment is not limited thereto.

The scan drive control circuit provided in this embodiment can improve stability of the first node N1 and the second node N2 by the output control circuit, thereby improving the output stability of the output circuit.

Figure 2:
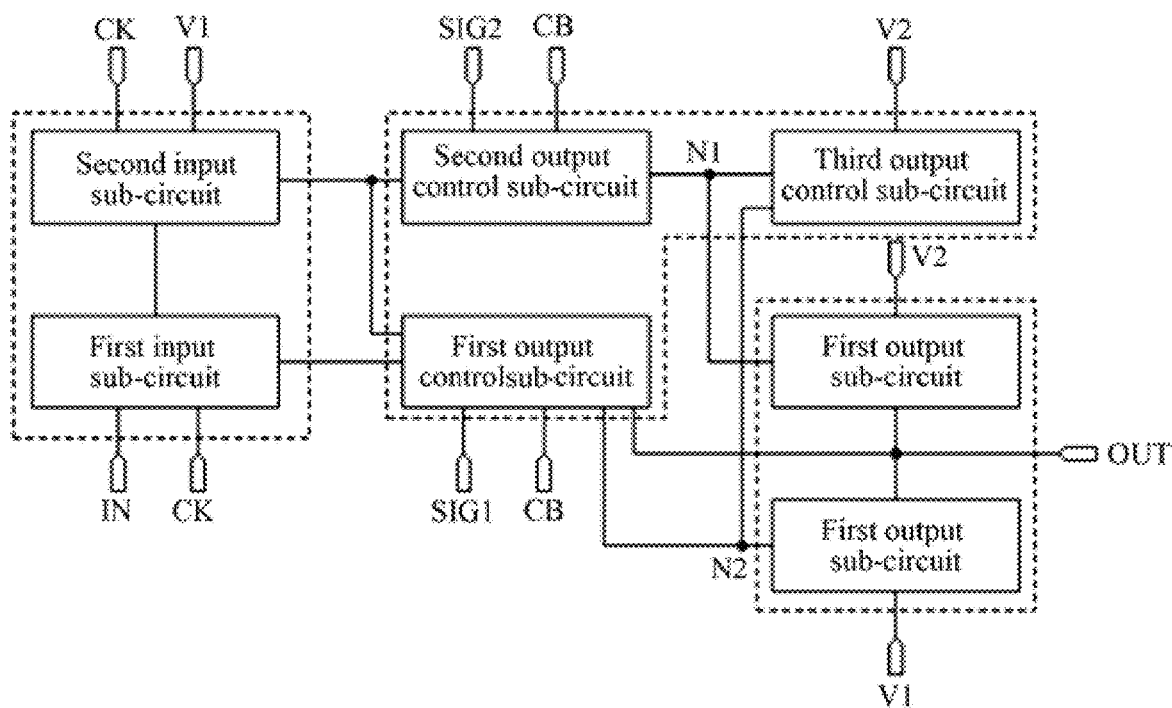
FIG. 2 is a schematic diagram of a structure of a scan drive control circuit according to at least one embodiment of the present disclosure.

FIG. 2 is an exemplary schematic diagram of a structure of a scan drive control circuit according to at least one embodiment of the present disclosure. In some exemplary embodiments, as shown in FIG. 2, the input circuit includes a first input sub-circuit and a second input sub-circuit. The output control circuit includes a first output control sub-circuit, a second output control sub-circuit and a third output control sub-circuit. The output circuit includes a first output sub-circuit and a second output sub-circuit. The first input sub-circuit is connected to a signal input terminal IN, a first clock signal terminal CK, and the first output control sub-circuit, and is configured to transmit a signal of the signal input terminal IN to the first output control sub-circuit under control of the first clock signal terminal CK. The second input sub-circuit is connected to a first voltage terminal V1, the first clock signal terminal CK, the first input sub-circuit and the second output control sub-circuit, and is configured to transmit a signal of the first clock signal terminal CK or the first voltage terminal V1 to the second output control sub-circuit under control of the first input sub-circuit or the first clock signal terminal CK. The first output control sub-circuit is connected to a first signal terminal SIG1, a second clock signal terminal CB, a second node N2, the first input sub-circuit and the second input sub-circuit, and is configured to store a signal of the first signal terminal SIG1 or the second clock signal terminal CB under the control of the first input sub-circuit or the second input sub-circuit. The second output control sub-circuit is connected to the second signal terminal SIG2, the second clock signal terminal CB, the first node N1 and the second input sub-circuit, and is configured to transmit a signal of the second signal terminal SIG2 to the first node N1 under control of the second input sub-circuit and the second clock signal terminal CB. The third output control sub-circuit connected to a second voltage terminal V2, the first node N1 and the second node N2, and is configured to transmit a signal of the second voltage terminal V2 to the first node N1 under control of the second node N2.

The first output sub-circuit is connected to the first voltage terminal V1, the signal output terminal OUT and the second node N2, and is configured to output a signal of the first voltage terminal V1 to the signal output terminal OUT under the control of the second node N2. The second output sub-circuit is connected to the second voltage terminal V2, the signal output terminal OUT and the first node N1, and is configured to output the signal of the second voltage terminal V2 to the signal output terminal OUT under the control of the first node N1.

In some exemplary embodiments, both the first input sub-circuit and the first output control sub-circuit are connected to the second node N2. The second input sub-circuit, the first output control sub-circuit and the second output control sub-circuit are all connected to the third node. However, this embodiment is not limited thereto.

Figure 3:
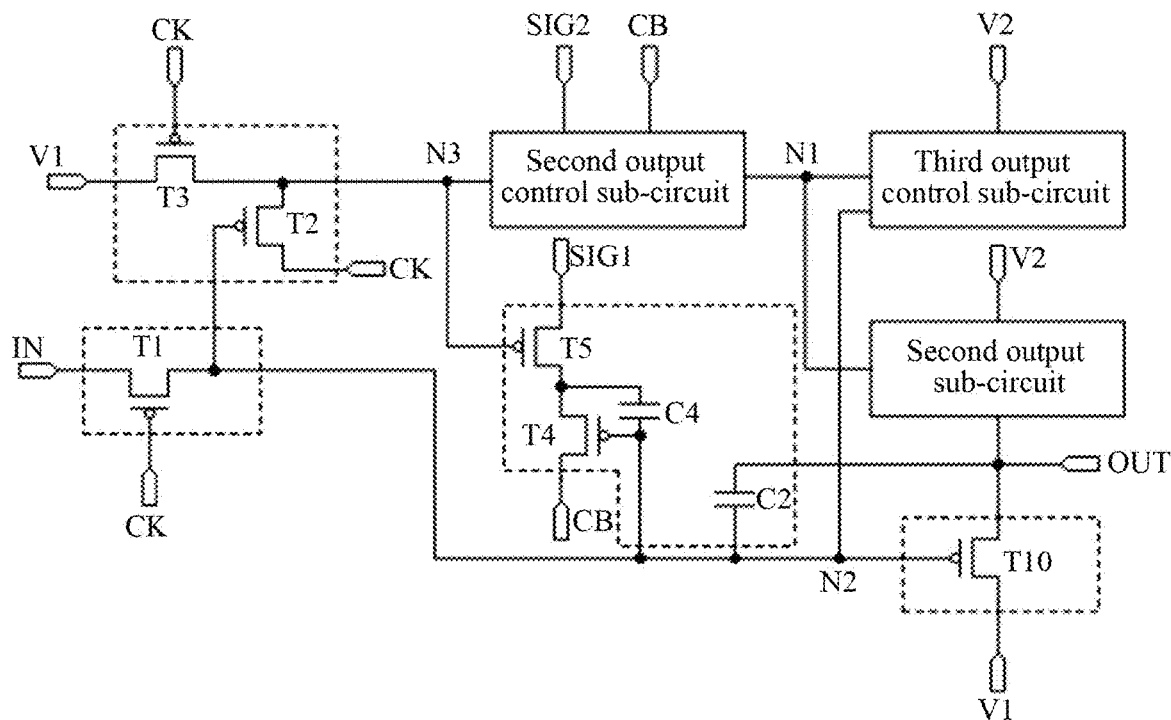
FIG. 3 is an equivalent circuit diagram of a first input sub-circuit, a second input sub-circuit, a first output control sub-circuit and a first output sub-circuit of a scan drive control circuit according to at least one embodiment of the present disclosure.

FIG. 3 is an equivalent circuit diagram of an input circuit, a first output control sub-circuit and a first output sub-circuit of a scan drive control circuit according to at least one embodiment of the present disclosure. As shown in FIG. 3, the first input sub-circuit of the scan drive control circuit provided by this exemplary embodiment includes a first transistor T1. A control electrode of the first transistor T1 is connected to a first clock signal terminal CK, a first electrode of the first transistor T1 is connected to a signal input terminal IN, and a second electrode of the first transistor T1 is connected to a second node N2.

As shown in FIG. 3, the second input sub-circuit includes a second transistor T2 and a third transistor T3. A control electrode of the second transistor T2 is connected to a second node N2, a first electrode of the second transistor T2 is connected to the first clock signal terminal CK, and a second electrode of the second transistor T2 is connected to a third node N3. A control electrode of the third transistor T3 is connected to the first clock signal terminal CK, a first electrode of the third transistor T3 is connected to a first voltage terminal V1, and a second electrode of the third transistor T3 is connected to the third node N3.

As shown in FIG. 3, the first output sub-circuit includes a tenth transistor T10. A control electrode of the tenth transistor T10 is connected to the second node N2, a first electrode of the tenth transistor T10 is connected to the first voltage terminal V1, and a second electrode of the tenth transistor T10 is connected to a signal output terminal OUT.

As shown in FIG. 3, the first output control sub-circuit includes a fourth transistor T4, a fifth transistor T5, and a second capacitor C2 and a fourth capacitor C4. A control electrode of the fourth transistor T4 is connected to the second node N2, a first electrode of the fourth transistor T4 is connected to a second clock signal terminal CB, and a second electrode of the fourth transistor T4 is connected to a second electrode of the fifth transistor T5. A control electrode of the fifth transistor T5 is connected to the third node N3, and a first electrode of the fifth transistor T5 is connected to a first signal terminal SIG1. A first electrode of the second capacitor C2 is connected to the second node N2, and a second electrode of the second capacitor C2 is connected to the signal output terminal OUT. A first electrode of the fourth capacitor C4 is connected to the control electrode of the fourth transistor T4 and the control electrode of the tenth transistor T10 (i.e., to the second node N2), and a second electrode of the fourth capacitor C4 is connected to the second electrode of the fifth transistor T5 and the second electrode of the fourth transistor T4.

In this exemplary embodiment, by the second capacitor C2 and the fourth capacitor C4 arranged in series, a potential of the second node N2 can be kept stable when the tenth transistor T10 is turned on, so that the first output sub-circuit provides a stable output.

In this exemplary embodiment, an exemplary structure of the input circuit, the first output control sub-circuit, and the first output sub-circuit is shown in FIG. 3. Those skilled in the art may easily understand that implementations of the input circuit, the first input control sub-circuit and the first output sub-circuit are not limited thereto as long as their functions can be achieved.

Figure 4:
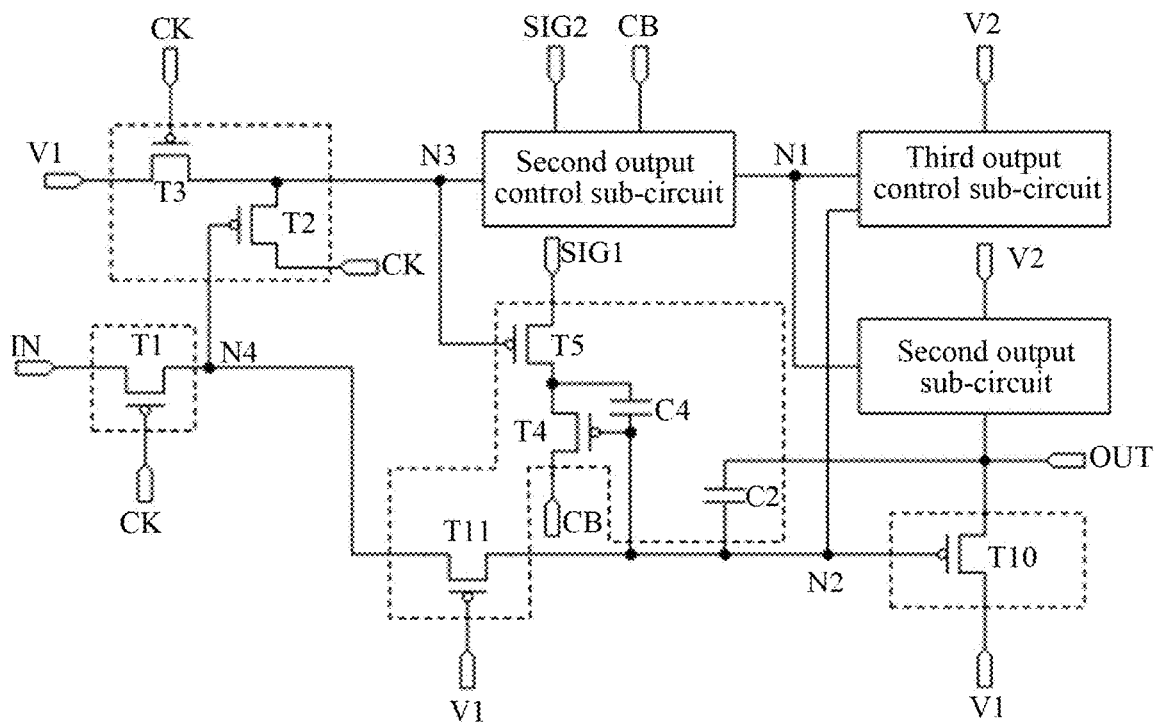
FIG. 4 is another equivalent circuit diagram of a first input sub-circuit, a second input sub-circuit, a first output control sub-circuit and a first output sub-circuit of a scan drive control circuit according to at least one embodiment of the present disclosure.

FIG. 4 is another equivalent circuit diagram of an input circuit, a first output control sub-circuit and a first output sub-circuit of a scan drive control circuit according to at least one embodiment of the present disclosure. As shown in FIG. 4, the first input sub-circuit of the scan drive control circuit provided by this exemplary embodiment includes a first transistor T1. A control electrode of the first transistor T1 is connected to a first clock signal terminal CK, a first electrode of the first transistor T1 is connected to a signal input terminal IN, and a second electrode of the first transistor T1 is connected to a fourth node N4.

As shown in FIG. 4, the second input sub-circuit includes a second transistor T2 and a third transistor T3. A control electrode of the second transistor T2 is connected to the fourth node N4, a first electrode of the second transistor T2 is connected to the first clock signal terminal CK, and a second electrode of the second transistor T2 is connected to a third node N3. A control electrode of the third transistor T3 is connected to the first clock signal terminal CK, a first electrode of the third transistor T3 is connected to a first voltage terminal V1, and a second electrode of the third transistor T3 is connected to the third node N3.

As shown in FIG. 4, the first output sub-circuit includes a tenth transistor T10. A control electrode of the tenth transistor T10 is connected to a second node N2, the first electrode of the tenth transistor T10 is connected to the first voltage terminal V1, and a second electrode of the tenth transistor T10 is connected to a signal output terminal OUT.

As shown in FIG. 4, the first output control sub-circuit includes a fourth transistor T4, a fifth transistor T5, and an eleventh transistor T11, a second capacitor C2, and a fourth capacitor C4. A control electrode of the fourth transistor T4 is connected to the second node N2, a first electrode of the fourth transistor T4 is connected to a second clock signal terminal CB, and a second electrode of the fourth transistor T4 is connected to a second electrode of the fifth transistor T5. A control electrode of the fifth transistor T5 is connected to the third node N3, and a first electrode of the fifth transistor T5 is connected to a first signal terminal SIG1. A control electrode of the eleventh transistor T11 is connected to the first voltage terminal V1, a first electrode of the eleventh transistor T11 is connected to the fourth node N4, and a second electrode of the eleventh transistor T11 is connected to the second node N2. A first electrode of the second capacitor C2 is connected to the second node N2, and a second electrode of the second capacitor C2 is connected to the signal output terminal OUT. A first electrode of the fourth capacitor C4 is connected to the control electrode of the fourth transistor T4 and the control electrode of the tenth transistor T10 (i.e. to the second node N2), and a second electrode of the fourth capacitor C4 is connected to the second electrode of the fourth transistor T4 and the second electrode of the fifth transistor T5.

In this exemplary embodiment, by the second capacitor C2 and the fourth capacitor C4 arranged in series, a potential of the second node N2 can be kept stable when the tenth transistor T10 is turned on, so that the first output sub-circuit provides a stable output. By providing the eleventh transistor T11, the influence of the second node N2 on the fourth node N4 can be isolated.

In this exemplary embodiment, an exemplary structure of the input circuit, the first output control sub-circuit, and the first output sub-circuit is shown in FIG. 4. Those skilled in the art may easily understand that implementations of the input circuit, the first input control sub-circuit and the first output sub-circuit are not limited thereto as long as their functions can be achieved.

Figure 5:
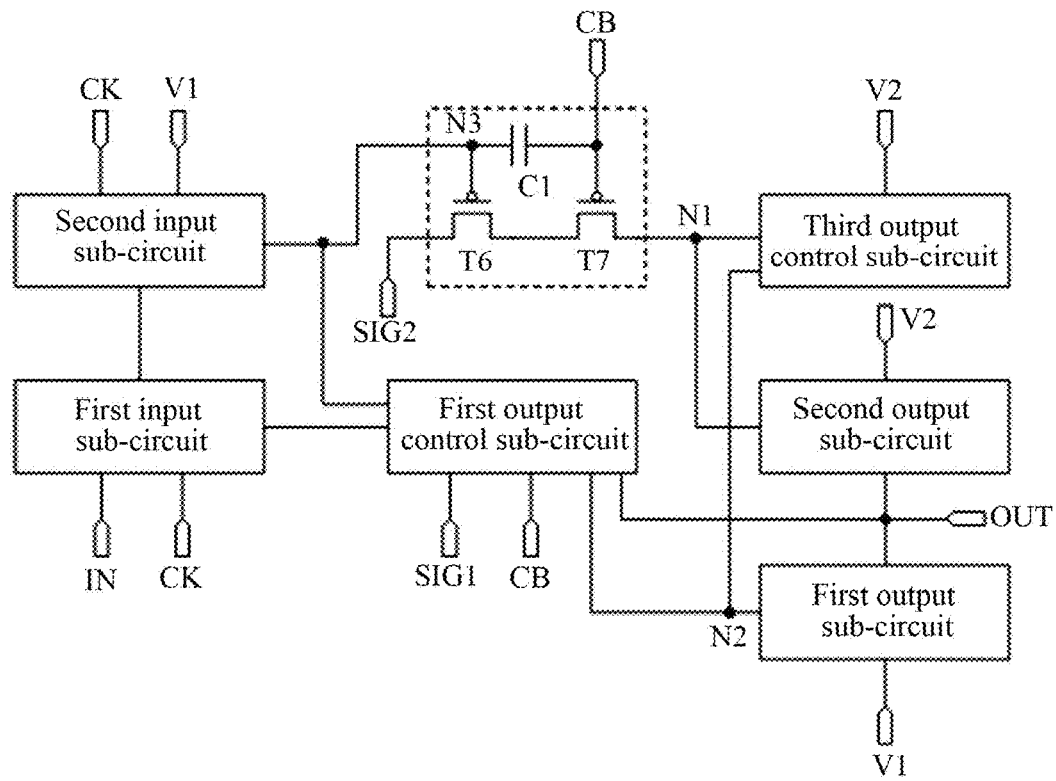
FIG. 5 is an equivalent circuit diagram of a second output control sub-circuit of a scan drive control circuit according to at least one embodiment of the present disclosure.

FIG. 5 is an equivalent circuit diagram of a second output control sub-circuit of a scan drive control circuit according to at least one embodiment of the present disclosure. As shown in FIG. 5, the second output control sub-circuit of the scan drive control circuit provided by this exemplary embodiment includes a sixth transistor T6, a seventh transistor T7 and a first capacitor C1. A control electrode of the sixth transistor T6 is connected to a third node N3, a first electrode of the sixth transistor T6 is connected to a second signal terminal SIG2, and a second electrode of the sixth transistor T6 is connected to a second electrode of the seventh transistor T7. A control electrode of the seventh transistor T7 is connected to a second clock signal terminal CB, and a first electrode of the seventh transistor T7 is connected to a first node N1. A first electrode of the first capacitor C1 is connected to the control electrode of the sixth transistor T6, and a second electrode of the first capacitor C1 is connected to the control electrode of the seventh transistor T7.

In some exemplary embodiments, the second signal terminal SIG2 may provide a low-level signal such that a potential of the first node N1 is kept stable when a transistor of the second output sub-circuit is turned on, so that the second output sub-circuit provides a stable output.

In this exemplary embodiment, an exemplary structure of the second output control sub-circuit is shown in FIG. 5. Those skilled in the art may easily understand that implementations of the second output control sub-circuit are not limited thereto as long as its functions can be achieved.

Figure 6:
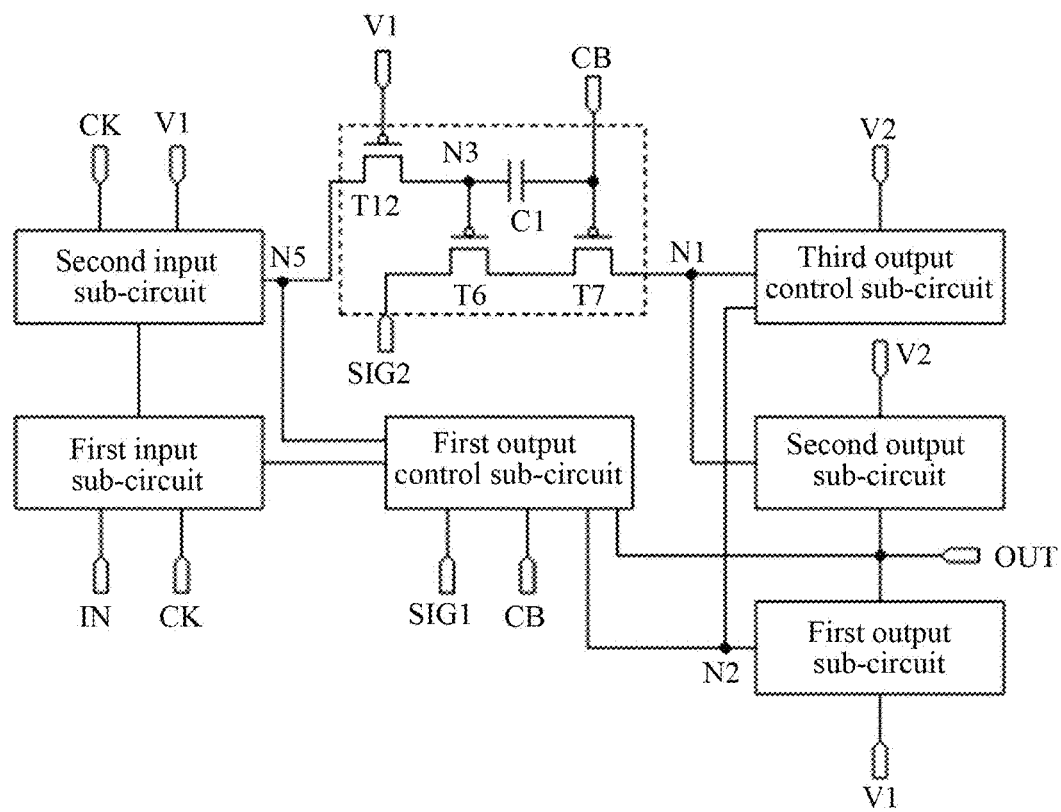
FIG. 6 is another equivalent circuit diagram of a second output control sub-circuit of a scan drive control circuit according to at least one embodiment of the present disclosure.

FIG. 6 is another equivalent circuit diagram of a second output control sub-circuit of a scan drive control circuit according to at least one embodiment of the present disclosure. As shown in FIG. 6, the second output control sub-circuit of the scan drive control circuit provided by this exemplary embodiment includes a sixth transistor T6, a seventh transistor T7, a twelfth transistor T12 and a first capacitor C1. A control electrode of the sixth transistor T6 is connected to a third node N3, a first electrode of the sixth transistor T6 is connected to a second signal terminal SIG2, and a second electrode of the sixth transistor T6 is connected to a second electrode of the seventh transistor T7. A control electrode of the seventh transistor T7 is connected to a second clock signal terminal CB, and a first electrode of the seventh transistor T7 is connected to a first node N1. A first electrode of the first capacitor C1 is connected to the control electrode of the sixth transistor T6, and a second electrode of the first capacitor C1 is connected to the control electrode of the seventh transistor T7. A control electrode of the twelfth transistor T12 is connected to the first voltage terminal V1, a first electrode of the twelfth transistor T12 is connected to a fifth node N5, and a second electrode of the twelfth transistor T12 is connected to the third node N3. The fifth node N5 is also connected to the first input sub-circuit and the first output control sub-circuit.

In some exemplary embodiments, the second signal terminal SIG2 may provide a low-level signal such that a potential of the first node N1 is kept stable when a transistor of the second output sub-circuit is turned on, so that the second output sub-circuit provides a stable output. In this exemplary embodiment, by providing the twelfth transistor T12, the fifth node N5 can be isolated from influence of the third node N3.

In this exemplary embodiment, another exemplary structure of the second output control sub-circuit is shown in FIG. 6. Those skilled in the art may easily understand that implementations of the second output control sub-circuit are not limited thereto as long as its functions can be achieved.

Figure 7:
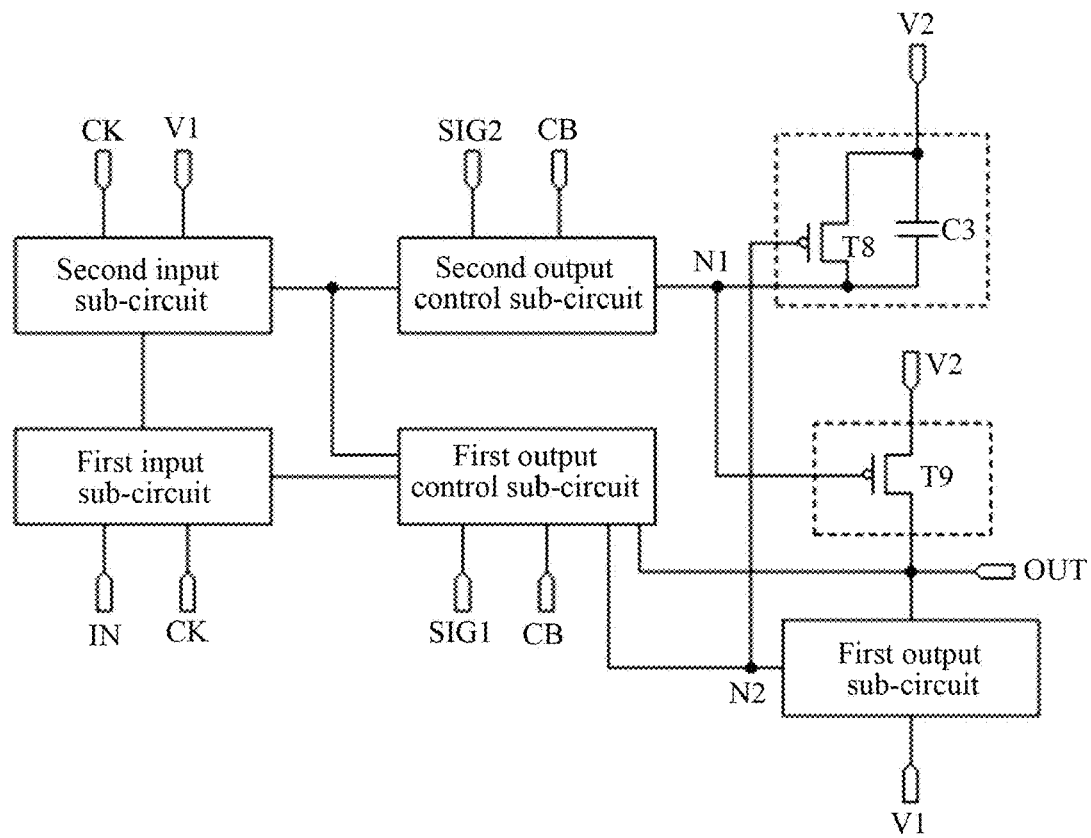
FIG. 7 is an equivalent circuit diagram of a third output control sub-circuit and a second output sub-circuit of a scan drive control circuit according to at least one embodiment of the present disclosure.

FIG. 7 is an equivalent circuit diagram of a third output control sub-circuit and a second output sub-circuit of a scan drive control circuit according to at least one embodiment of the present disclosure. As shown in FIG. 7, the third output control sub-circuit of the scan drive control circuit provided by this exemplary embodiment includes an eighth transistor T8 and a third capacitor C3. A control electrode of the eighth transistor T8 is connected to a second node N2, a first electrode of the eighth transistor T8 is connected to a second voltage terminal V2, and a second electrode of the eighth transistor T8 is connected to a first node N1. A first electrode of the third capacitor C3 is connected to the first node N1, and a second electrode of the third capacitor C3 is connected to the second voltage terminal V2.

As shown in FIG. 7, the second output sub-circuit includes a ninth transistor T9. A control electrode of the ninth transistor T9 is connected to the first node N1, a first electrode of the ninth transistor T9 is connected to the second voltage terminal V2, and a second electrode of the ninth transistor T9 is connected to a signal output terminal OUT.

In this exemplary embodiment, an exemplary structure of the third output control sub-circuit and the second output sub-circuit is shown in FIG. 7. Those skilled in the art may easily understand that implementations of the third output control sub-circuit and the second output sub-circuit are not limited thereto as long as their functions can be achieved.

Figure 8:
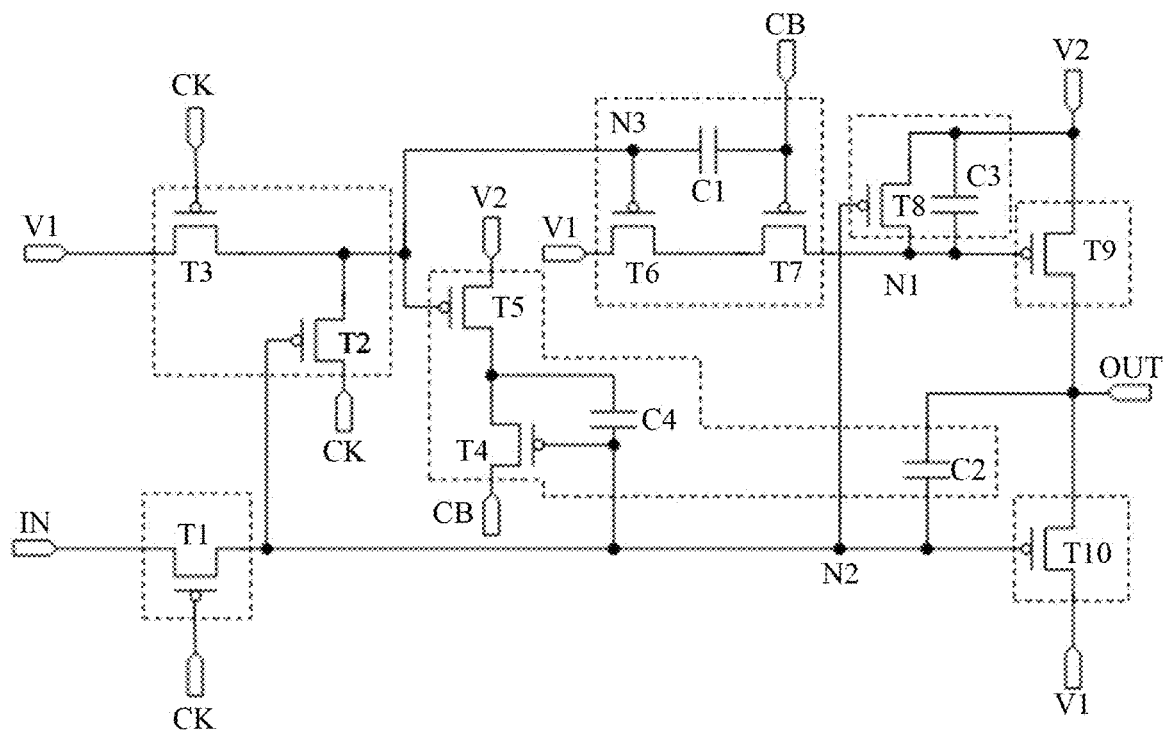
FIG. 8 is an equivalent circuit diagram of a scan drive control circuit according to at least one embodiment of the present disclosure.

FIG. 8 is an equivalent circuit diagram of a scan drive control circuit according to at least one embodiment of the present disclosure. As shown in FIG. 8, this exemplary embodiment provides a scan drive control circuit including a first input sub-circuit, a second input sub-circuit, a first output control sub-circuit, a second output control sub-circuit, a third output control sub-circuit, a first output sub-circuit, and a second output sub-circuit. The first input sub-circuit includes a first transistor T1. The second input sub-circuit includes a second transistor T2 and a third transistor T3. The first output control sub-circuit includes a fourth transistor T4, a fifth transistor T5, a second capacitor C2, and a fourth capacitor C4. The second output control sub-circuit includes: a sixth transistor T6, a seventh transistor T7 and a first capacitor C1. The third output control sub-circuit includes an eighth transistor T8 and a third capacitor C3. The first output sub-circuit includes a tenth transistor T10. The second output sub-circuit includes a ninth transistor T9. In this exemplary embodiment, a first signal terminal SIG1 is connected to a second voltage terminal V2, and a second signal terminal SIG2 is connected to a first voltage terminal V1.

In this exemplary embodiment, a control electrode of the first transistor T1 is connected to a first clock signal terminal CK, a first electrode of the first transistor T1 is connected to the signal input terminal IN, and a second electrode of the first transistor T1 is connected to a second node N2. A control electrode of the second transistor T2 is connected to the second node N2, a first electrode of the second transistor T2 is connected to the first clock signal terminal CK, and a second electrode of the second transistor T2 is connected to the third node N3. A control electrode of the third transistor T3 is connected to the first clock signal terminal CK, a first electrode of the third transistor T3 is connected to the first voltage terminal V1, and a second electrode of the third transistor T3 is connected to the third node N3. A control electrode of the fourth transistor T4 is connected to the second node N2, a first electrode of the fourth transistor T4 is connected to a second clock signal terminal CB, and a second electrode of the fourth transistor T4 is connected to a second electrode of the fifth transistor T5. A control electrode of the fifth transistor T5 is connected to the third node N3, and a first electrode of the fifth transistor T5 is connected to the second voltage terminal V2. A control electrode of the sixth transistor T6 is connected to the third node N3, a first electrode of the sixth transistor T6 is connected to the first voltage terminal V1, and a second electrode of the sixth transistor T6 is connected to a first electrode of the seventh transistor T7. A control electrode of the seventh transistor T7 is connected to the second clock signal terminal CB, and a second electrode of the seventh transistor T7 is connected to a first node N1. A control electrode of the eighth transistor T8 is connected to the second node N2, a first electrode of the eighth transistor T8 is connected to the second voltage terminal V2, and a second electrode of the eighth transistor T8 is connected to the first node N1. A control electrode of the ninth transistor T9 is connected to the first node N1, a first electrode of the ninth transistor T9 is connected to the second voltage terminal V2, and a second electrode of the ninth transistor T9 is connected to a signal output terminal OUT. A control electrode of the tenth transistor T10 is connected to the second node N2, a first electrode of the tenth transistor T10 is connected to the first voltage terminal V1, and a second electrode of the tenth transistor T10 is connected to the signal output terminal OUT. A first electrode of the first capacitor C1 is connected to the third node N3, and a second electrode of the first capacitor C1 is connected to the control electrode of the seventh transistor T7. A first electrode of the second capacitor C2 is connected to the second node N2, and a second electrode of the second capacitor C2 is connected to the signal output terminal OUT. A first electrode of the third capacitor C3 is connected to the first node N1, and a second electrode of the third capacitor C3 is connected to the second voltage terminal V2. A first electrode of the fourth capacitor C4 is connected to the second node N2, and a second electrode the fourth capacitor C4 is connected to the second electrode of the fifth transistor T5.

In this exemplary embodiment, the first node N1, the second node N2 and the third node N3 are meeting points representing related electrical connections in the circuit diagram, which means that these nodes are nodes equivalent to the convergence points of related electrical connections in the circuit diagram.

In some exemplary embodiments, the first transistor T1 to the tenth transistor T10 in the scan drive control circuit may all be P-type thin film transistors, such as LTPS (Low Temperature Poly-silicon) thin film transistors. In addition, a thin film transistor with a bottom gate structure or a thin film transistor with a top gate structure may be selected in the embodiment of the present disclosure as long as a switch function can be realized. This embodiment is not limited thereto.

Figure 9:
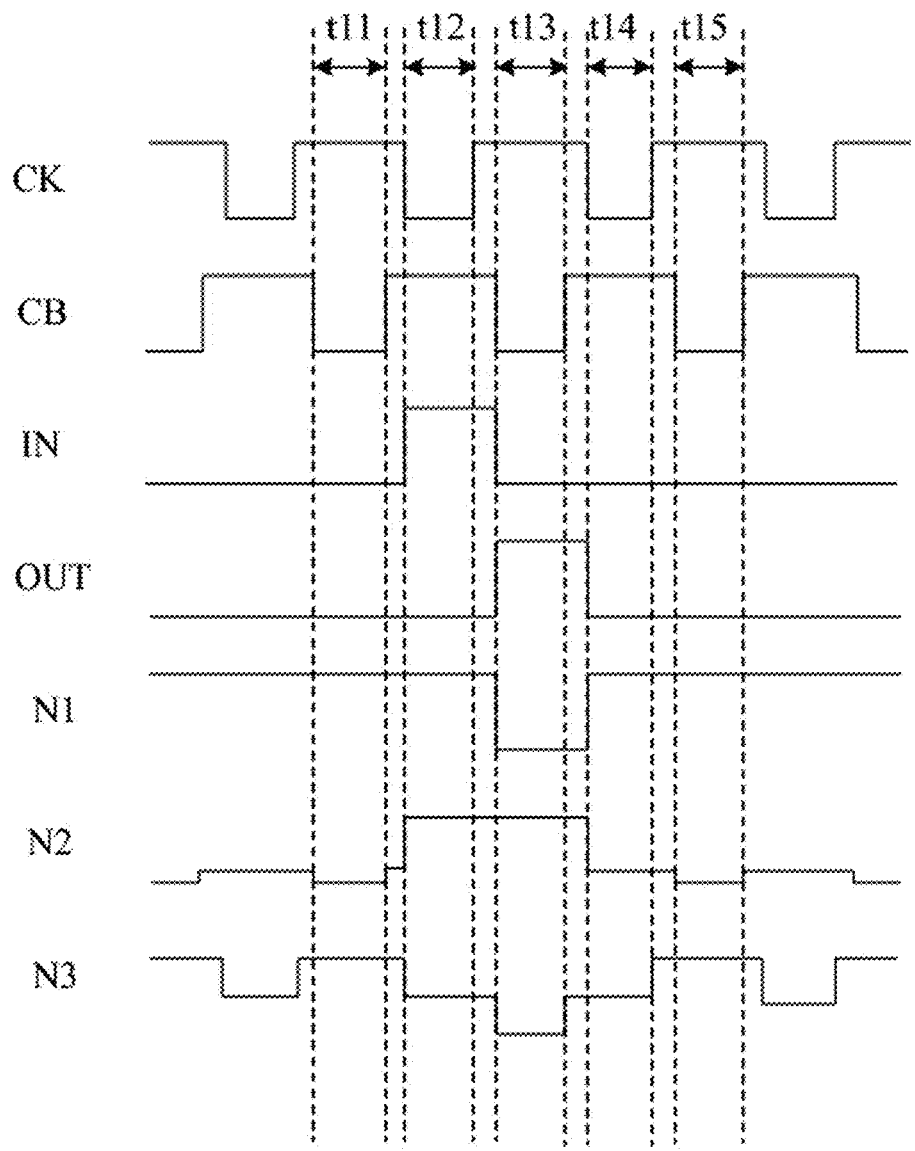
FIG. 9 is an operating timing diagram of the scan drive control circuit shown in FIG. 8.

The technical solution of this embodiment is further explained by an operating process of a scan drive control circuit. The operating process of a scan drive control circuit of first stage is described as an example, in which a signal input terminal IN of the scan drive control circuit of the first stage is connected to an initial signal line STV. FIG. 9 is an operating timing diagram of the scan drive control circuit shown in FIG. 8. As shown in FIGS. 8 and 9, the scan drive control circuit of this exemplary embodiment includes 10 transistor units (e.g. a first transistor T1 to a tenth transistor T10), 4 capacitor units (i.e. a first capacitor C1 to a fourth capacitor C4), 3 input terminals (i.e. a signal input terminal IN, a first clock signal terminal CK, a second clock signal terminal CB), 1 output terminal (i.e. a signal output terminal OUT), and 2 power supply terminals (i.e. a first voltage terminal V1 and a second voltage terminal V2). In some examples, the first voltage terminal V1 continuously provides a low-level signal, for example, its voltage is VGL, and the second voltage terminal V2 continuously provides a high level signal, for example, its voltage is VGH.

The operating process of the scan drive control circuit will be described below with the scan drive control circuit of this embodiment providing a scan signal or a reset signal to N-type transistors of a pixel circuit as an example. The operating process of the scan drive control circuit provided by this exemplary embodiment includes the following stages.

In a first stage t11, a high-level signal is input to the first clock signal terminal CK, a low-level signal is input to the second clock signal terminal CB, and a low-level signal is input to the signal input terminal IN.

The high-level signal is input to the first clock signal terminal CK, so that the first transistor T1 and the third transistor T3 are turned off, the second node N2 is maintained at a low potential of the previous stage, and the second transistor T2, the fourth transistor T4, the eighth transistor T8 and the tenth transistor T10 are turned on. The high-level signal input from the first clock signal terminal CK is transmitted to the third node N3 through the second transistor T2 which is turned-on, so that the fifth transistor T5 and the sixth transistor T6 are turned off. The low-level signal input from the second clock signal terminal CB is transmitted to the second electrode of the fourth capacitor C4 through the fourth transistor T4 which is turned on, and the first electrode of the fourth capacitor C4 (i.e., the second node N2) is maintained at a lower potential due to a holding effect of the capacitor. The eighth transistor T8 is turned on so that a potential of the first node N1 is high (for example, being VGH) and the ninth transistor T9 is turned off. The tenth transistor T10 is turned on so that the signal output terminal OUT outputs a low-level signal provided by the first voltage terminal V1.

In a second stage t12, a low-level signal is input to the first clock signal terminal CK, a high-level signal is input to the second clock signal terminal CB, and a high-level signal is input to the signal input terminal IN.

The low-level signal is input to the first clock signal terminal CK, so that the first transistor T1 and the third transistor T3 are turned on, and the turned-on first transistor T1 transmits the high-level signal provided by the signal input terminal IN to the second node N2, so that a potential of the second node N2 is pulled up to VGH. The second transistor T2, the fourth transistor T4, the eighth transistor T8, and the tenth transistor T10 are turned off. The turned-on third transistor T3 transmits the low-level signal input by the first voltage terminal V1 to the third node N3, and the fifth transistor T5 and the sixth transistor T6 are turned on. The high-level signal provided by the second voltage terminal V2 is transmitted to the second electrode of the fourth capacitor C4 through the fifth transistor T5 which is turned-on, and the first electrode of the fourth capacitor (i.e. the second node N2) is maintained at a stable high potential under a jumping effect of the fourth capacitor C4. A high level signal is input by the second clock signal terminal CB, the seventh transistor T7 is turned off, the first node N1 is maintained at the high potential provided by the second voltage terminal V2 under the storage effect of the third capacitor C3, and the ninth transistor T9 is turned off. Since both the ninth transistor T9 and the tenth transistor T10 are turned off, the signal output terminal OUT is kept outputting the previous low-level.

In a third stage t13, a high-level signal is input to the first clock signal terminal CK, a low-level signal is input to the second clock signal terminal CB, and a low-level signal is input to the signal input terminal IN.

The high level signal is input to the first clock signal terminal CK, so that the first transistor T1 and the third transistor T3 are turned off, and the second node N2 is maintained at the high potential of the previous stage. The second transistor T2, the fourth transistor T4, the eighth transistor T8, and the tenth transistor T10 are turned off. The low-level signal is input to the second clock signal terminal CB, and a potential of the first electrode (i.e. the third node N3) of the first capacitor C1 jumps from the low potential VGL of the previous stage to a even lower potential 2VGL-VGH. The fifth transistor T5 and the sixth transistor T6 are turned on. The high-level signal provided by the second voltage terminal V2 is transmitted to the second electrode of the fourth capacitor C4 through the turned-on fifth transistor T5, so that the second node N2 is maintained at a stable high potential. The low-level signal is input to the second clock signal terminal CB, so that the seventh transistor T7 is turned on, the low-level signal input from the first voltage terminal V1 is transmitted to the first node N1 through the sixth transistor T6 and the seventh transistor T7 which are turned-on, the ninth transistor T9 is turned on, and the high-level signal provided by the second voltage terminal V2 is output to the signal output terminal OUT.

In a fourth stage t14, a low-level signal is input to the first clock signal terminal CK, a high-level signal is input to the second clock signal terminal CB, and a low-level signal is input to the signal input terminal IN.

The low-level signal is input to the first clock signal terminal CK, the first transistor T1 and the third transistor T3 are turned on, and the turned-on first transistor T1 transmits the low-level signal input from the signal input terminal IN to the second node N2, so that a potential of the second node N2 is pulled down to VGL. The second transistor T2, the fourth transistor T4, the eighth transistor T8, and the tenth transistor T10 are turned on. The turned-on eighth transistor T8 transmits the high-level signal provided by the second voltage terminal V2 to the first node N1, and the ninth transistor T9 is turned off. The turned-on tenth transistor T10 transmits the low-level signal provided by the first voltage terminal V1 to the signal output terminal OUT. The turned-on second transistor T2 transmits the low-level signal provided by the first clock signal terminal CK to the third node N3, and the fifth transistor T5 and the sixth transistor T6 are turned on. The high-level signal is input to the second clock signal terminal CB, and the seventh transistor T7 is turned off.

In a fifth stage t15, a high-level signal is input to the first clock signal terminal CK, a low-level signal is input to the second clock signal terminal CB, and a low-level signal is input to the signal input terminal IN.

The high-level signal is input to the first clock signal terminal CK, and the first transistor T1 and the third transistor T3 are turned off. The second node N2 is maintained at a low potential of the previous node, and the second transistor T2, the fourth transistor T4, the eighth transistor T8, and the tenth transistor T10 are turned on. The turned-on fourth transistor T4 transmits the low-level signal input from the second clock signal terminal CB to the second electrode of the fourth capacitor C4, so that the potential of the first electrode of the fourth capacitor C4 (i.e. the second node N2) becomes lower than VGL. The turned-on second transistor T2 transmits the high-level signal provided by the first clock signal terminal CK to the third node N3, so that the fifth transistor T5 and the sixth transistor T6 are turned off. The turned-on eighth transistor T8 transmits the high-level signal provided by the second voltage terminal V2 to the first node N1, the potential of the first node N1 is VGH, and the ninth transistor T9 is turned off. The tenth transistor T10 is turned on and supplies a low-level signal provided by the first voltage terminal V1 to the signal output terminal OUT.

After the fifth stage t15, the fourth stage t14 and the fourth stage t15 can be repeated until a high-level signal is input by to signal input terminal IN, and then restart from the second stage t12.

According to the operating process of the scan drive control circuit, in the third stage t13, the signal output terminal OUT outputs a high-level signal, and in the other stages, the signal output terminal OUT outputs a low-level signal.

In some exemplary embodiments, the first clock signal input from the first clock signal terminal CK and the second clock signal input from the second clock signal terminal CB are both pulse signals, and pulse widths of the first clock signal and the second clock signal may be substantially the same. Duty cycles of the first clock signal and the second clock signal may be smaller than ½, e.g. may be about ⅓. In this embodiment, the duty cycle refers to a proportion of a high-level duration in a whole pulse period within one pulse period (including high-level duration and low-level duration).

Figure 10:
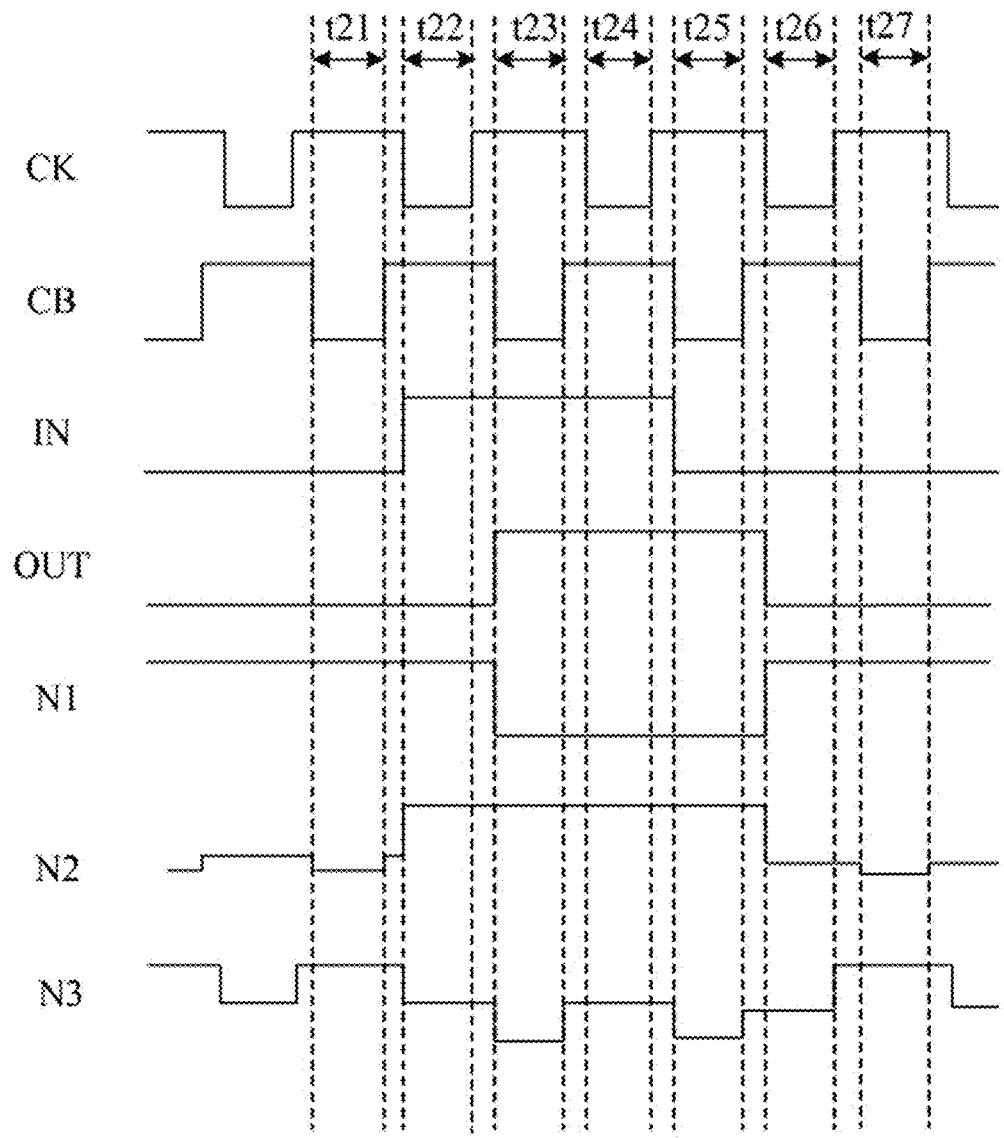
FIG. 10 is another operating timing diagram of the scan drive control circuit shown in FIG. 8.

FIG. 10 is another operating timing diagram of the scan drive control circuit shown in FIG. 8. Referring to FIGS. 8 and 10, the operating process of the scan drive control circuit will be explained by taking an example in which the scan drive control circuit of this embodiment provides a light emitting control signal to the pixel circuit. The operating process of the scan drive control circuit provided by this exemplary embodiment may include the following stages.

In a first stage t21, a high-level signal is input to the first clock signal terminal CK, a low-level signal is input to the second clock signal terminal CB, and a low-level signal is input to the signal input terminal IN.

The high-level signal is input to the first clock signal terminal CK, so that the first transistor T1 and the third transistor T3 are turned off, the second node N2 is maintained at a low potential of the previous stage, and the second transistor T2, the fourth transistor T4, the eighth transistor T8 and the tenth transistor T10 are turned on. The high-level signal input from the first clock signal terminal CK is transmitted to the third node N3 through the second transistor T2 which is turned-on, so that the fifth transistor T5 and the sixth transistor T6 are turned off. The low-level signal input from the second clock signal terminal CB is transmitted to the second electrode of the fourth capacitor C4 through the fourth transistor T4 which is turned on, and the first electrode of the fourth capacitor C4 (i.e., the second node N2) is maintained at a lower potential due to a holding effect of the capacitor. The eighth transistor T8 is turned on so that the potential of the first node N1 is pulled up to VGH and the ninth transistor T9 is turned off. The tenth transistor T10 is turned on so that the signal output terminal OUT outputs a low-level signal provided by the first voltage terminal V1.

In a second stage t22, a low-level signal is input to the first clock signal terminal CK, a high-level signal is input to the second clock signal terminal CB, and a high-level signal is input to the signal input terminal IN.

The low-level signal is input to the first clock signal terminal CK, and the first transistor T1 and the third transistor T3 are turned on. The first transistor T1 which is turned on transmits the high-level signal supplied by the signal input terminal IN to the second node N2, so that the potential of the second node N2 is pulled up to VGH. The second transistor T2, the fourth transistor T4, the eighth transistor T8, and the tenth transistor T10 are turned off. The turned-on third transistor T3 transmits the low-level signal input from the first voltage terminal V1 to the third node N3, and the fifth transistor T5 and the sixth transistor T6 are turned on. The high-level signal provided by the second voltage terminal V2 is transmitted to the second electrode of the fourth capacitor C4 through the fifth transistor T5 which is turned-on, and the first electrode of the fourth capacitor (i.e. the second node N2) is maintained at a stable high level under a jumping effect of the fourth capacitor C4. The high level signal is input to the second clock signal terminal CB, the seventh transistor T7 is turned off, the first node N1 is maintained at the high potential VGH provided by the second voltage terminal V2 under a storage effect of the third capacitor C3, and the ninth transistor T9 is turned off. Since both the ninth transistor T9 and the tenth transistor T10 are turned off, the signal output terminal OUT is kept outputting the previous low-level.

In a third stage t23, a high-level signal is input to the first clock signal terminal CK, a low-level signal is input to the second clock signal terminal CB, and a high-level signal is input to the signal input terminal IN.

The high level signal is input to the first clock signal terminal CK, so that the first transistor T1 and the third transistor T3 are turned off, and the second node N2 is maintained at the high potential of the previous stage. The second transistor T2, the fourth transistor T4, the eighth transistor T8, and the tenth transistor T10 are turned off. The low-level signal is input to the second clock signal terminal CB, and a potential of the first electrode (i.e. the third node N3) of the first capacitor C1 jumps from the low potential VGL of the previous stage to a even lower potential 2VGL-VGH. The fifth transistor T5 and the sixth transistor T6 are turned on. The high-level signal provided by the second voltage terminal V2 is transmitted to the second electrode of the fourth capacitor C4 through the turned-on fifth transistor T5, so that the second node N2 is maintained at a stable high potential. The low-level signal is input to the second clock signal terminal CB, the seventh transistor T7 is turned on, the low-level signal input from the first voltage terminal V1 is transmitted to the first node N1 through the sixth transistor T6 and the seventh transistor T7 which are turned-on, the ninth transistor T9 is turned on, and the high-level signal provided by the second voltage terminal V2 is provided to the signal output terminal OUT.

In a fourth stage t24, a low-level signal is input to the first clock signal terminal CK, a high-level signal is input to the second clock signal terminal CB, and a high-level signal is input to the signal input terminal IN.

The low-level signal is input to the first clock signal terminal CK, and the first transistor T1 and the third transistor T3 are turned on. The first transistor T1 which is turned on transmits the high-level signal input from the signal input terminal IN to the second node N2, and the potential of the second node N2 is maintained at the high potential VGH of the previous stage. The second transistor T2, the fourth transistor T4, the eighth transistor T8, and the tenth transistor T10 are turned off. The turned-on third transistor T3 transmits the low-level signal provided by the first voltage terminal V1 to the third node N3, and the fifth transistor T5 and the sixth transistor T6 are turned on. The fifth transistor T5 which is turned-on transmits the high level signal provided by the second voltage terminal V2 to the second electrode of the fourth capacitor C4, and the first electrode of the fourth capacitor C4 (i.e. the second node N2) is maintained at a stable high potential under a jumping effect of the fourth capacitor C4. The high-level signal is input to the second clock signal terminal CB, the seventh transistor T7 is turned off, the first node N1 is maintained at the low potential of the previous stage under a storage effect of the third capacitor C3, the ninth transistor T9 is turned on, and the signal output terminal OUT outputs the high-level signal provided by the second voltage terminal V2.

In a fifth stage t25, a high-level signal is input to the first clock signal terminal CK, a low-level signal is input to the second clock signal terminal CB, and a low-level signal is input to the signal input terminal IN.

The high level signal is input to the first clock signal terminal CK, so that the first transistor T1 and the third transistor T3 are turned off, and the second node N2 is maintained at the high potential of the previous stage. The second transistor T2, the fourth transistor T4, the eighth transistor T8, and the tenth transistor T10 are turned off. The low-level signal is input to the second clock signal terminal CB, and a potential of the second electrode of the first capacitor C1 jumps from VGH of the previous stage to VGL. Due to a jumping effect of the first capacitor C1, the potential of the first electrode of the first capacitor C1 (i.e. the third node N3) jumps from VGL of the previous stage to a even lower 2VGL-VGH, and the fifth transistor T5 and the sixth transistor T6 are turned on. The fifth transistor T5 which is turned on transmits the high level signal provided by the second voltage terminal V2 to the second electrode of the fourth capacitor C4, so that the second node N2 is maintained at a stable high potential. The low-level signal is input to the second clock signal terminal CB, and the seventh transistor T7 is turned on. The sixth transistor T6 and the seventh transistor T7 which are turned on transmit the low-level signal provided by the first voltage terminal V1 to the first node N1, the ninth transistor T9 is turned on, and the signal output terminal OUT outputs the high-level signal provided by the second voltage terminal V2.

In a sixth stage t26, a low-level signal is input to the first clock signal terminal CK, a high-level signal is input by the second clock signal terminal CB, and a low-level signal is input by the signal input terminal IN.

The low-level signal is input to the first clock signal terminal CK, and the first transistor T1 and the third transistor T3 are turned on. The first transistor T1 which is turned on transmits the low-level signal input from the signal input terminal IN to the second node N2, and the potential of the second node N2 is pulled down to VGL. The second transistor T2, the fourth transistor T4, the eighth transistor T8, and the tenth transistor T10 are turned on. The turned-on eighth transistor T8 transmits the high-level signal provided by the second voltage terminal V2 to the first node N1, and the ninth transistor T9 is turned off. The turned-on tenth transistor T10 is transmits the low-level signal provided by the first voltage terminal V1 to the signal output terminal OUT. The turned-on second transistor T2 transmits the low-level signal provided by the first clock signal terminal CK to the third node N3, and the fifth transistor T5 and the sixth transistor T6 are turned on. The high-level signal is input to the second clock signal terminal CB, and the seventh transistor T7 is turned off.

In a seventh stage t27, a high-level signal is input to the first clock signal terminal CK, a low-level signal is input to the second clock signal terminal CB, and a low-level signal is input to the signal input terminal IN.

The high-level signal is input to the first clock signal terminal CK, and the first transistor T1 and the third transistor T3 are turned off. The second node N2 is maintained at a low potential of the previous node, and the second transistor T2, the fourth transistor T4, the eighth transistor T8, and the tenth transistor T10 are turned on. The turned-on fourth transistor T4 transmits the low-level signal input from the second clock signal terminal CB to the second electrode of the fourth capacitor C4, so that the potential of the first electrode of the fourth capacitor C4 (i.e. the second node N2) becomes lower than VGL. The turned-on second transistor T2 transmits the high-level signal provided by the first clock signal terminal CK to the third node N3, so that the fifth transistor T5 and the sixth transistor T6 are turned off. The turned-on eighth transistor T8 transmits the high-level signal provided by the second voltage terminal V2 to the first node N1, the potential of the first node N1 is VGH, and the ninth transistor T9 is turned off. The tenth transistor T10 is turned on and outputs the low-level signal provided by the first voltage terminal V1 to the signal output terminal OUT.

After the seventh stage t27, the sixth stage t26 and the seventh stage t27 can be repeated until a high-level signal is input to the signal input terminal OUT, and then restart from the second stage t22.

According to the operating process of the scan drive control circuit, the signal output terminal OUT can output a high-level signal in the third stage t23 to the fifth stage t25, and the signal output terminal OUT can output a low-level signal in other stages.

The scan drive control circuit provided in this exemplary embodiment can maintain the potential of the second node N2 stable when the tenth transistor T10 is turned on by the first output control sub-circuit to improve output stability of the tenth transistor T10, and can maintain the potential of the first node N1 stable when the ninth transistor T9 is turned on by the second output control sub-circuit to improve output stability of the ninth transistor T9.

Figure 11:
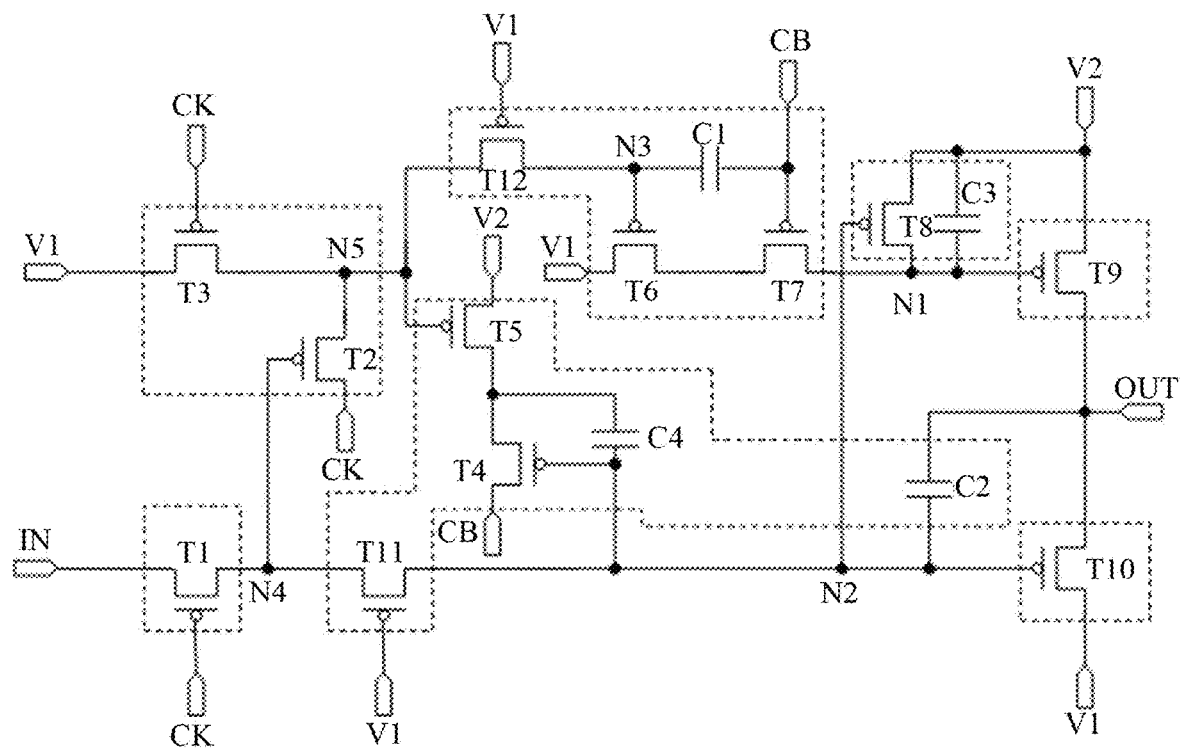
FIG. 11 is another equivalent circuit diagram of a scan drive control circuit according to at least one embodiment of the present disclosure.

FIG. 11 is another equivalent circuit diagram of a scan drive control circuit according to at least one embodiment of the present disclosure. As shown in FIG. 11, this exemplary embodiment provides a scan drive control circuit including a first input sub-circuit, a second input sub-circuit, a first output control sub-circuit, a second output control sub-circuit, a third output control sub-circuit, a first output sub-circuit, and a second output sub-circuit. The first input sub-circuit includes a first transistor T1. The second input sub-circuit includes a second transistor T2 and a third transistor T3. The first output control sub-circuit includes a fourth transistor T4, a fifth transistor T5, an eleventh transistor T11, a second capacitor C2, and a fourth capacitor C4. The second output control sub-circuit includes a twelfth transistor T12, a sixth transistor T6, a seventh transistor T7 and a first capacitor C1. The third output control sub-circuit includes an eighth transistor T8 and a third capacitor C3. The first output sub-circuit includes a tenth transistor T10. The second output sub-circuit includes a ninth transistor T9. In this exemplary embodiment, a first signal terminal is connected to a second voltage terminal V2, and a second signal terminal is connected to a first voltage terminal V1.

In this exemplary embodiment, a control electrode of the first transistor T1 is connected to a first clock signal terminal CK, a first electrode of the first transistor T1 is connected to a signal input terminal IN, and a second electrode of the first transistor T1 is connected to a fourth node N4. A control electrode of the second transistor T2 is connected to the fourth node N4, a first electrode of the second transistor T2 is connected to a first clock signal terminal CK, and a second electrode of the second transistor T2 is connected to a third node N3. A control electrode of the third transistor T3 is connected to the first clock signal terminal CK, a first electrode of the third transistor T3 is connected to the first voltage terminal V1, and a second electrode of the third transistor T3 is connected to a fifth node N5. A control electrode of the fourth transistor T4 is connected to a second node N2, a first electrode of the fourth transistor T4 is connected to a second clock signal terminal CB, and a second electrode of the fourth transistor T4 is connected to a second electrode of the fifth transistor T5. A control electrode of the fifth transistor T5 is connected to the fifth node N5, and a first electrode of the fifth transistor T5 is connected to the second voltage terminal V2. A control electrode of the sixth transistor T6 is connected to the third node N3, a first electrode of the sixth transistor T6 is connected to the first voltage terminal V1, and a second electrode of the sixth transistor T6 is connected to a first electrode of the seventh transistor T7. A control electrode of the seventh transistor T7 is connected to the second clock signal terminal CB, and a second electrode of the seventh transistor T7 is connected to the first node N1. A control electrode of the eighth transistor T8 is connected to the second node N2, a first electrode of the eighth transistor T8 is connected to the second voltage terminal V2, and a second electrode of the eighth transistor T8 is connected to the first node N1. A control electrode of the ninth transistor T9 is connected to the first node N1, a first electrode of the ninth transistor T9 is connected to the second voltage terminal V2, and a second electrode of the ninth transistor T9 is connected to the signal output terminal OUT. A control electrode of the tenth transistor T10 is connected to the second node N2, a first electrode of the tenth transistor T10 is connected to the first voltage terminal V1, and a second electrode of the tenth transistor T10 is connected to the signal output terminal OUT. A control electrode of the eleventh transistor T11 is connected to the first voltage terminal V1, a first electrode of the eleventh transistor T11 is connected to the fourth node N4, and a second electrode of the eleventh transistor T11 is connected to the second node N2. A control electrode of the twelfth transistor T12 is connected to the first voltage terminal V1, a first electrode of the twelfth transistor T12 is connected to the fifth node N5, and a second electrode of the twelfth transistor T12 is connected to the third node N3. A first electrode of the first capacitor C1 is connected to the third node N3, and a second electrode of the first capacitor C1 is connected to the control electrode of the seventh transistor T7. A first electrode of the second capacitor C2 is connected to the second node N2, and a second electrode of the second capacitor C2 is connected to the signal output terminal OUT. A first electrode of the third capacitor C3 is connected to the first node N1, and a second electrode of the third capacitor C3 is connected to the second voltage terminal V2. A first electrode of the fourth capacitor C4 is connected to the second node N2, and a second electrode the fourth capacitor C4 is connected to the second electrode of the fifth transistor T5.

In this exemplary embodiment, the first node N1, the second node N2, the third node N3, the fourth node N4, and the fifth node N5 represent meeting points of the relevant electrical connections in the circuit diagram, which means that these nodes are nodes equivalent to the convergence points of related electrical connections in the circuit diagram.

In some exemplary embodiments, the first transistor T1 to the twelfth transistor T12 in the scan drive control circuit may all be P-type thin film transistors, such as LTPS (Low Temperature Poly-silicon) thin film transistors. In addition, a thin film transistor with a bottom gate structure or a thin film transistor with a top gate structure may be selected in the embodiment of the present disclosure as long as a switch function may be realized. This embodiment is not limited thereto.

In the scan drive control circuit provided by this exemplary embodiment, the fourth node N4 can be isolated from the influence of the second node N2 by the eleventh transistor T11, and the fifth node N5 can be isolated from the influence of the third node N3 by the twelfth transistor T12.

The operating process of the scan drive control circuit of this embodiment can be referred to the description of the foregoing embodiment, which will not be repeated here.

Figure 12:
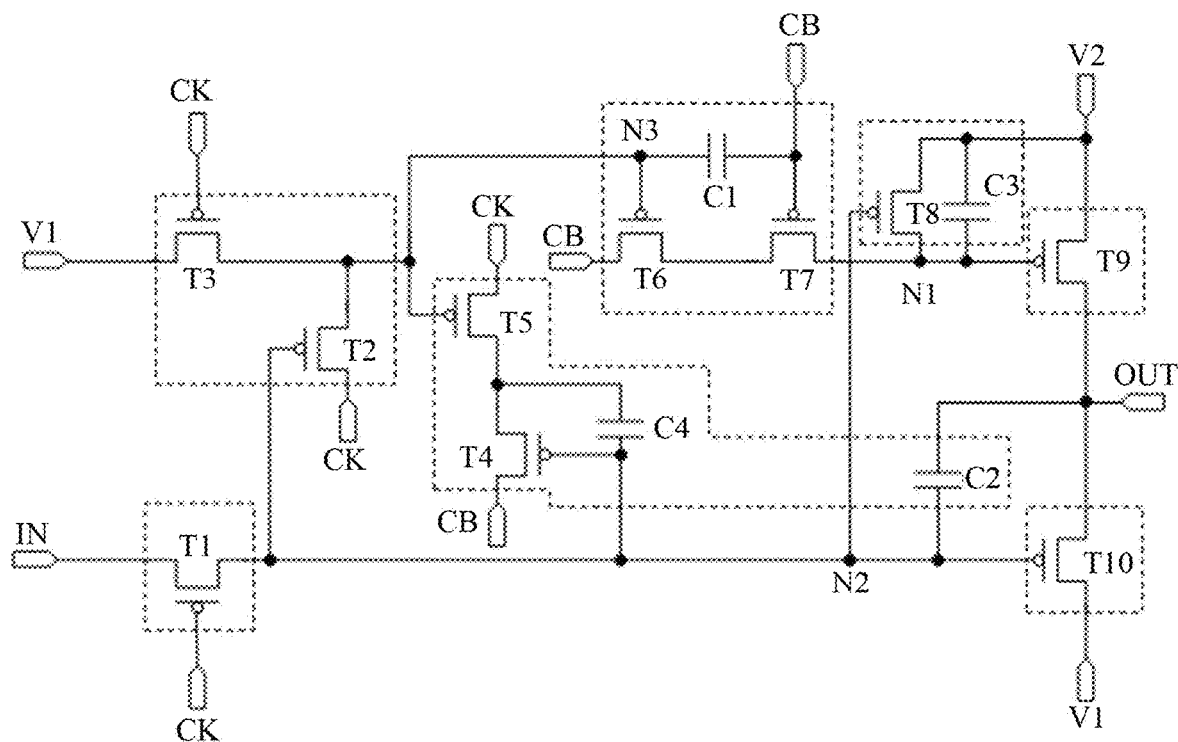
FIG. 12 is another equivalent circuit diagram of a scan drive control circuit according to at least one embodiment of the present disclosure.

FIG. 12 is another equivalent circuit diagram of a scan drive control circuit according to at least one embodiment of the present disclosure. As shown in FIG. 12, this exemplary embodiment provides a scan drive control circuit including a first input sub-circuit, a second input sub-circuit, a first output control sub-circuit, a second output control sub-circuit, a third output control sub-circuit, a first output sub-circuit, and a second output sub-circuit. The first input sub-circuit includes a first transistor T1. The second input sub-circuit includes a second transistor T2 and a third transistor T3. The first output control sub-circuit includes a fourth transistor T4, a fifth transistor T5, an eleventh transistor T11, a second capacitor C2, and a fourth capacitor C4. The second output control sub-circuit includes a twelfth transistor T12, a sixth transistor T6, a seventh transistor T7 and a first capacitor C1. The third output control sub-circuit includes an eighth transistor T8 and a third capacitor C3. The first output sub-circuit includes a tenth transistor T10. The second output sub-circuit includes a ninth transistor T9. In this exemplary embodiment, a first signal terminal is connected to a first clock signal terminal CK, and a second signal terminal is connected to a second clock signal terminal CB. That is, a second electrode of the fifth transistor T5 is connected to the first clock signal terminal CK, and a first electrode of the sixth transistor T6 is connected to the second clock signal terminal CB.

The circuit structure and operating process of the scan drive control circuit of this embodiment can be described with reference to the above-mentioned embodiments, which will not be repeated here.

In some other exemplary embodiments, the first signal terminal SIG1 of the scan drive control circuit may be connected to the first clock signal terminal CK, and the second signal terminal SIG2 may be connected to the first voltage terminal V1 or the second clock signal terminal CB. Or, the first signal terminal SIG1 may be connected to the second voltage terminal V2, and the second signal terminal SIG2 may be connected to the first voltage terminal V1 or the second clock signal terminal CB. However, this embodiment is not limited thereto.

Figure 13:
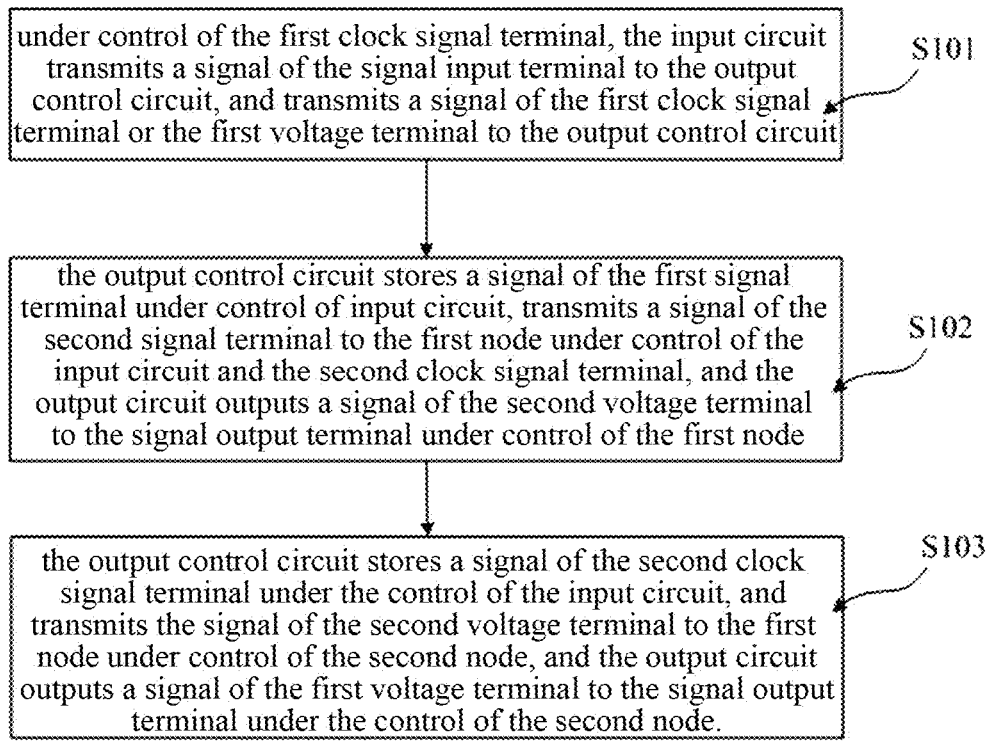
FIG. 13 is a flowchart of a method for driving a display substrate according to at least one embodiment of the present disclosure.

An embodiment of the present disclosure provides a method for driving a display substrate. FIG. 13 is a flowchart of a method for driving a display substrate according to an embodiment of the present disclosure. As shown in FIG. 13, the method for driving the display substrate provided in this embodiment is applied to the display substrate provided in the above embodiment. The method provided by this embodiment may include the following steps.

In a step S101, under control of the first clock signal terminal, the input circuit transmits a signal of the signal input terminal to the output control circuit, and transmits a signal of the first clock signal terminal or the first voltage terminal to the output control circuit.

In a step S102, the output control circuit stores a signal of the first signal terminal under control of the input circuit, transmits a signal of the second signal terminal to the first node under control of the input circuit and the second clock signal terminal, and the output circuit outputs the signal of the second voltage terminal to the signal output terminal under control of the first node.

In a step S103, the output control circuit stores a signal of the second clock signal terminal under the control of the input circuit, and transmits the signal of the second voltage terminal to the first node under the control of the second node, and the output circuit outputs a signal of the first voltage terminal to the signal output terminal under the control of the second node.

The method for driving the display substrate, the structure of the scan drive control circuit and the operating process thereof provided by this exemplary embodiment have been described in the above-mentioned embodiments, which will not be repeated here.

Figure 14:
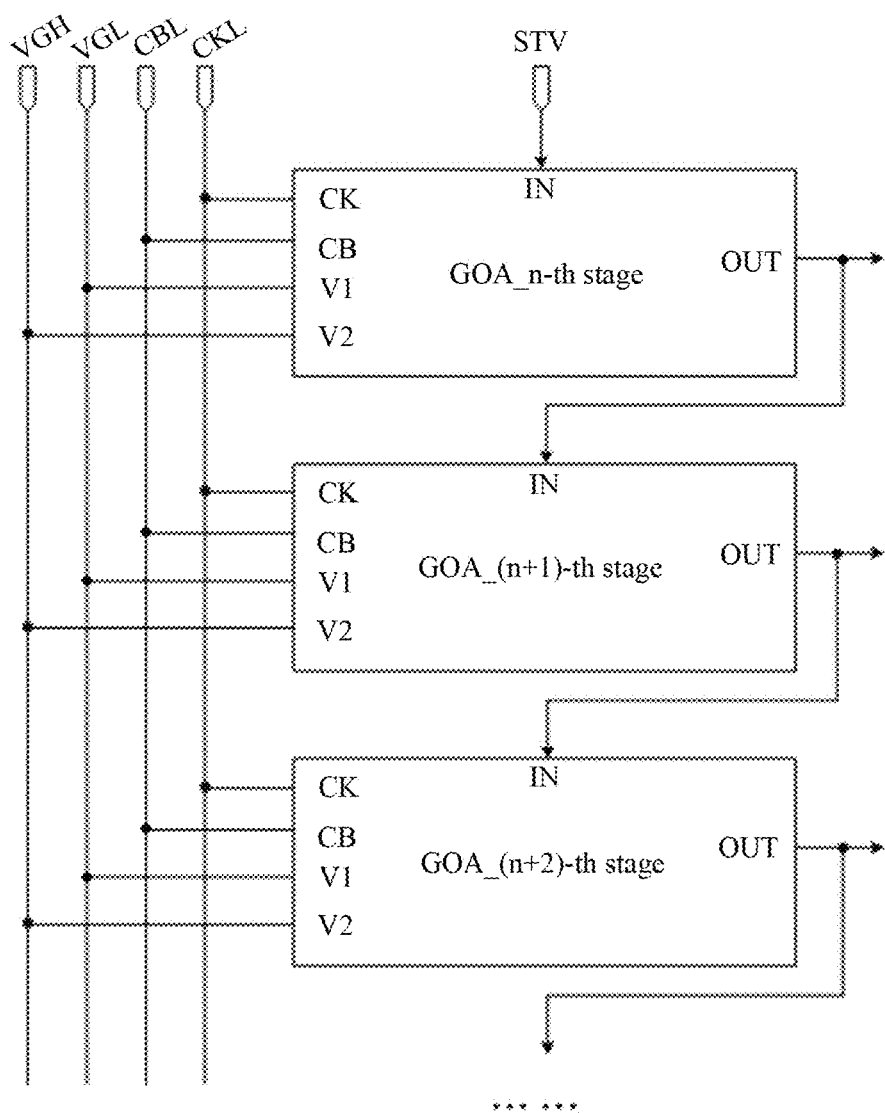
FIG. 14 is a schematic cascaded diagram of a scan drive control circuit according to at least one embodiment of the present disclosure.

An embodiment of the present disclosure further provides a gate driving circuit. FIG. 14 is a schematic diagram of a gate drive circuit according to at least one embodiment of the present disclosure. As shown in FIG. 14, the gate drive circuit provided by this exemplary embodiment includes a plurality of cascaded scan drive control circuits GOA. The scan drive control circuit may be the same as that described in the foregoing embodiment, and its realization principle and realization effect are similar, which will not be repeated here.

In this exemplary embodiment, a signal input terminal IN of a scan drive control circuit of first stage is connected to an initial signal line STV, and a signal input terminal of a scan drive control circuit of (n+1)-th stage is connected to a signal output terminal of a stage scan drive control circuit of n-th stage, where n is an integer.

In some exemplary embodiments, the first clock signal terminals CK of a plurality of scan drive control circuits are connected to a first clock signal line CKL and configured to receive a first clock signal, and the second clock signal terminals CB are connected to a second clock signal line CBL and configured to receive a second clock signal. The first voltage terminal V1 is connected to a power supply line continuously supplying a low-level signal VGL, and the second voltage terminal V2 is connected to a power supply line continuously supplying a high-level signal VGH. However, this embodiment is not limited thereto.

Figure 15:
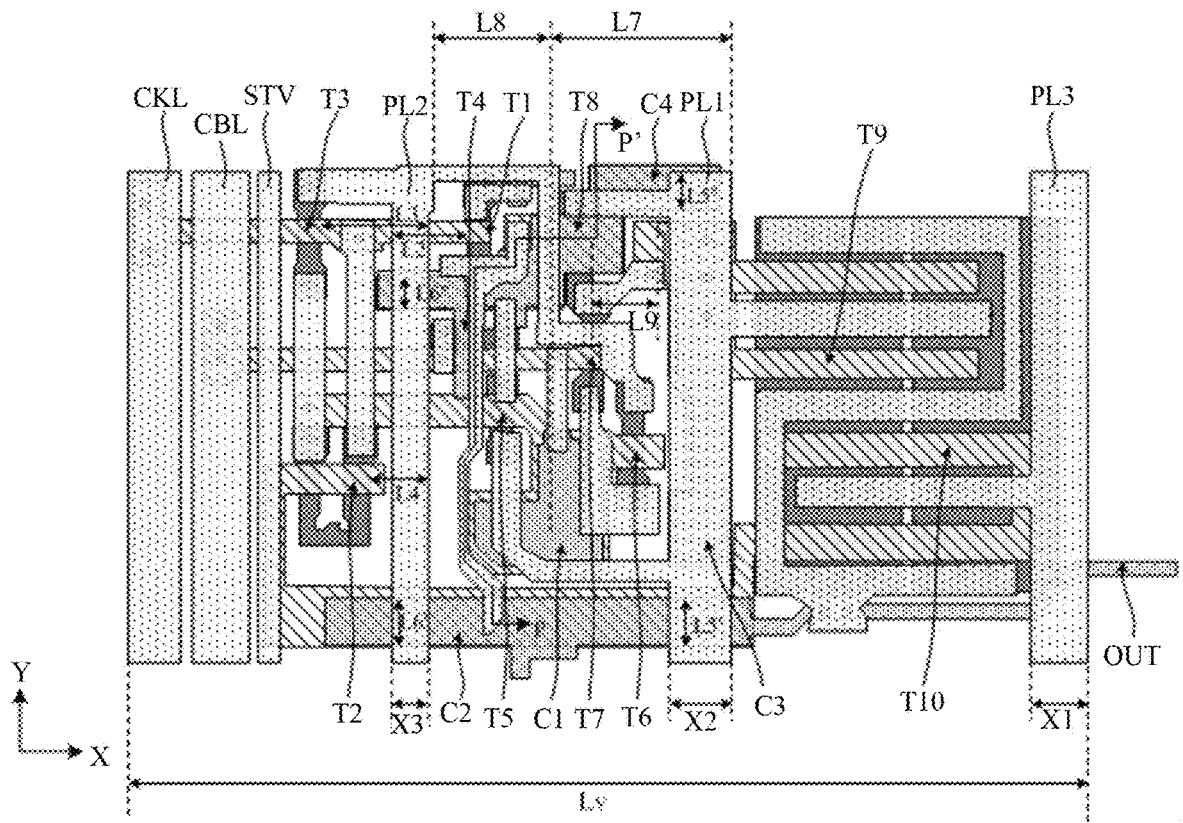
FIG. 15 is a schematic top view of a scan drive control circuit according to at least one embodiment of the present disclosure.
Figure 16:
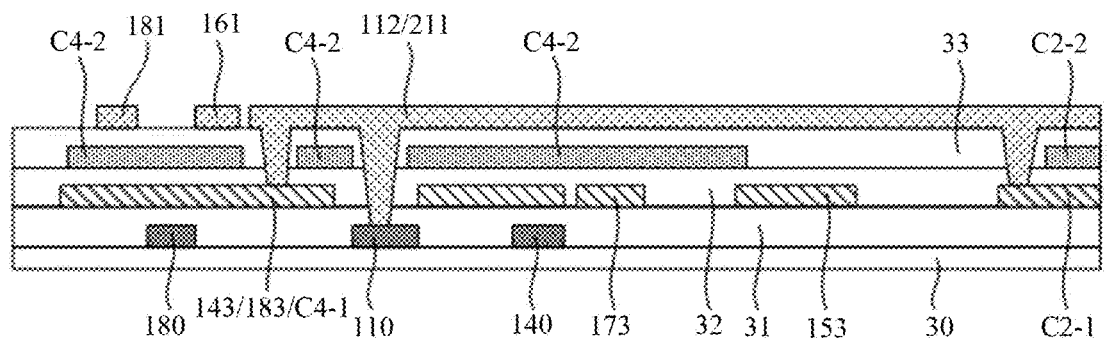
FIG. 16 is a partial cross-sectional view taken along a direction P-P' in FIG. 15.

FIG. 15 is a top view of a scan drive control circuit according to at least one embodiment of the present disclosure. FIG. 16 is a partial cross-sectional view taken along a direction P-P' in FIG. 15. An equivalent circuit diagram of the scan drive control circuit shown in FIG. 15 may be as shown in FIG. 8. In this exemplary embodiment, the first signal terminal is connected to the second voltage terminal, the second signal terminal is connected to the first voltage terminal, the first clock signal terminal CK is connected to the first clock signal line CKL, and the second clock signal terminal CB is connected to the second clock signal line CBL. The second voltage terminal is connected to a first power supply line PL1 supplying a high-level signal. The first voltage terminal connected to the first output sub-circuit is connected to a third power supply line PL3 supplying a low-level signal. The first voltage terminal which is connected to the second input sub-circuit and the second output control sub-circuit is connected to a second power supply line PL2 supplying a low-level signal.

In this exemplary embodiment, illustration is made by taking an example in which a plurality of transistors in the scan drive control circuit are all P-type transistors and are low-temperature polysilicon thin film transistors. However, this embodiment is not limited thereto.

In some exemplary embodiments, as shown in FIG. 15, the first clock signal line CKL, the second clock signal line CBL, the initial signal line STV, the second power supply line PL2, the first power supply line PL1, and the third power supply line PL3 are sequentially arranged along a first direction X in a plane parallel to the display substrate. The first clock signal line CKL, the second clock signal line CBL, the initial signal line STV, the second power supply line PL2, the first power supply line PL1, and the third power supply line PL3 all extend along a second direction Y. The first direction X intersects with the second direction Y, for example, the first direction X is perpendicular to the second direction Y.

In some exemplary embodiments, as shown in FIG. 15, the signal output terminal OUT is located at a side of the tenth transistor T10 away from the ninth transistor T9 in the second direction Y in a plane parallel to the display substrate. The signal output terminal OUT may extend along the first direction X. However, this embodiment is not limited thereto.

In some exemplary embodiments, as shown in FIG. 15, the second input sub-circuit (including a second transistor T2 and a third transistor T3) is located between the initial signal line STV and the second power supply line PL2 in the first direction X in a plane parallel to the display substrate. The first output sub-circuit (including the tenth transistor T10) and the second output sub-circuit (including the ninth transistor T9) are located between the first power supply line PL1 and the third power supply line PL3 in the first direction X. The second transistor T2 and the third transistor T3 are adjacent in the second direction Y. The ninth transistor T9 and the tenth transistor T10 are adjacent in the second direction Y. The first transistor T1, the fourth transistor T4, and the fifth transistor T5 are located at a side of the second power supply line PL2 away from the second clock signal line CBL. The seventh transistor T7 is adjacent to the first capacitor C1, and is located between the first capacitor C1 and the first power supply line PL1. The sixth transistor T6 is adjacent to the first power supply line PL1, and the sixth transistor T6 is located between the seventh transistor T7 and the first power supply line PL1. The eighth transistor T8 is located between the first power supply line PL1 and the first transistor T1. The first capacitor C1 is located between the first power supply line PL1 and the second power supply line PL2, an orthographic projection of the first capacitor C1 on the base substrate is located between projections of the first power supply line PL1 and a second power supply line PL2 on the base substrate, and the projection of the first capacitor C1 on the base substrate is not overlapped with the projection of the first power supply line PL1 or the projection of the second power supply line PL2 on the base substrate. In this embodiment, "A and B are adjacent" means that there are no other transistors or capacitors between A and B.

In some exemplary embodiments, as shown in FIG. 16, in a plane perpendicular to the display substrate, a non-display area of the display substrate may include: a base substrate 30, and a first semiconductor layer, a first conductive layer, a second conductive layer, a third conductive layer sequentially disposed on the base substrate 30. A first insulation layer 31 is disposed between the first conductive layer and the first semiconductor layer. A second insulation layer 32 is disposed between the first conductive layer and the second conductive layer. A third insulation layer 33 is disposed between the second conductive layer and the third conductive layer. In some examples, the first insulation layer 31 to the third insulation layer 33 may all be inorganic insulation layers. However, this embodiment is not limited thereto.

Figure 17:
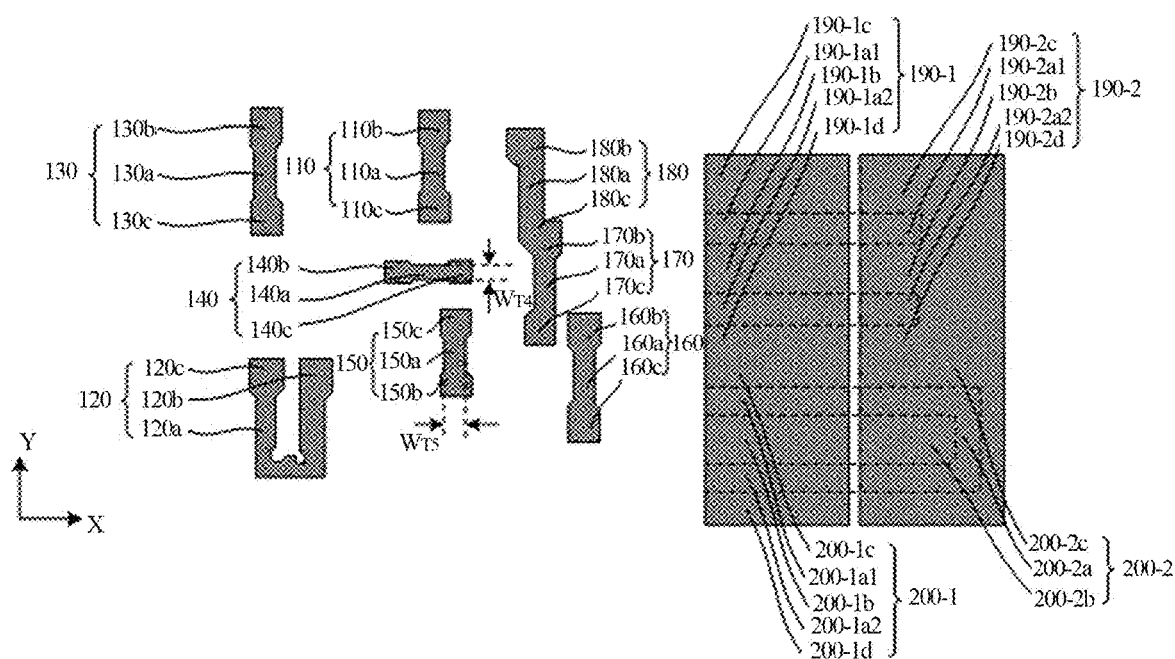
FIG. 17 is a top view of a scan drive control circuit after a first semiconductor layer is formed according to at least one embodiment of the present disclosure.

FIG. 17 is a top view of a scan drive control circuit after a first semiconductor layer is formed according to at least one embodiment of the present disclosure. As shown in FIGS. 15 to 17, the first semiconductor layer in the non-display area at least includes: active layers of a plurality of transistors of the scan drive control circuit. For example, the first semiconductor layer at least include: an active layer 110 of a first transistor T1, an active layer 120 of a second transistor T2, an active layer 130 of a third transistor T3, an active layer 140 of a fourth transistor T4, an active layer 150 of a fifth transistor T5, an active layer 160 of a sixth transistor T6, an active layer 170 of a seventh transistor T7, an active layer 180 of an eighth transistor T8, an active layer of a ninth transistor T9, and an active layer of a tenth transistor T10.

In some exemplary embodiments, as shown in FIG. 17, the active layer 130 of the third transistor T3, the active layer 110 of the first transistor T1, the active layer 150 of the fifth transistor T5, the active layer 160 of the sixth transistor T6, the active layer 170 of the seventh transistor T7, the active layer 180 of the eighth transistor T8, the active layer of the ninth transistor T9, and the active layer of the tenth transistor T10 may extend along the second direction Y. The active layer 140 of the fourth transistor T4 may extend in the first direction X. In some examples, an angle between an extension direction of the active layer 140 of the fourth transistor T4 and an extension direction of the active layer 110 of the first transistor T1 is greater than 85° and less than 95°. An angle between the extension direction of the active layer 140 of the fourth transistor T4 and an extension direction of the active layer 150 of the fifth transistor T5 is greater than 85° and less than 95°. However, this embodiment is not limited thereto.

In some exemplary embodiments, as shown in FIG. 17, the active layer 130 of the third transistor T3 and the active layer 120 of the second transistor T2 are adjacent in the second direction Y. The active layer 110 of the first transistor T1 is located between the active layer 130 of the third transistor T3 and the active layer 180 of the eighth transistor T8 in the first direction X. The active layer 140 of the fourth transistor T4 is located between the active layer 110 of the first transistor T1 and the active layer 150 of the fifth transistor T5 in the second direction Y. The active layer 160 of the sixth transistor T6 is located at a side of the active layer 170 of the seventh transistor T7 away from the active layer 150 of the fifth transistor T5 in the first direction X. The active layer of the ninth transistor T9 and the active layer of the tenth transistor T10 are sequentially arranged in the second direction Y. The active layer of the ninth transistor T9 is located at a side of the active layer 180 of the eighth transistor T8 away from the active layer 110 of the first transistor T1 in the first direction X, and the active layer of the tenth transistor T10 is located at a side of the active layer 160 of the sixth transistor T6 away from the active layer 170 of the seventh transistor T7 in the first direction X.

In some exemplary embodiments, as shown in FIG. 17, the active layer of the ninth transistor T9 includes a first partition 190-1 and a second partition 190-2, and the active layer of the tenth transistor T10 includes a third partition 200-1 and a fourth partition 200-2. The first partition 190-1 of the active layer of the ninth transistor T9 and the third partition 200-1 of the active layer of the tenth transistor T10 may form an integrated structure, for example, they may form an integrated rectangular structure. The second partition 190-2 of the active layer of the ninth transistor T9 and the fourth partition 200-2 of the active layer of the tenth transistor T10 may form an integrated structure, for example, they may form an integrated rectangular structure. In this exemplary embodiment, by partitioning the active layers of the ninth transistor T9 and the tenth transistor T10, a better heat dissipation effect can be achieved or overheating can be prevented. However, the number of partitions of the active layer of the ninth transistor T9 and the tenth transistor T10 and the shape of at least one partition are not limited in this embodiment.

In some exemplary embodiments, as shown in FIG. 17, an orthographic projection of the active layer 120 of the second transistor T2 on the base substrate may be U-shaped. Orthographic projections of the active layer 110 of the first transistor T1, the active layer 130 of the third transistor T3, the active layer 140 of the fourth transistor T4, the active layer 150 of the fifth transistor T5, and the active layer 160 of the sixth transistor T6 on the base substrate may be dumbbell-shaped. The active layer 170 of the seventh transistor T7 and the active layer 180 of the eighth transistor T8 may form an integrated structure. However, this embodiment is not limited thereto.

In some exemplary embodiments, a material of the first semiconductor layer may include, for example, poly-silicon. An active layer may include at least one channel area and a plurality of doped regions. The channel region may not be doped with an impurity, and has characteristics of a semiconductor. The plurality of doped regions may be located at two sides of the channel region and doped with impurities, and thus have conductivity. The impurities may be varied according to types of transistors.

In some exemplary embodiments, a doped region of an active layer may be interpreted as a source electrode or drain electrode of a transistor. For example, a source electrode of the first transistor T1 may correspond to a first doped region 110b doped with an impurity on a periphery of a channel region 110a of an active layer 110, and a drain electrode of the first transistor T1 may correspond to a second doped region 110c doped with an impurity on the periphery of the channel region 110a of the active layer 110. In addition, portions of the active layers between the transistors may be interpreted as wirings doped with impurities, and may be used for electrical connection with the transistors.

In some exemplary embodiments, output capability of a transistor is related to a ratio of width to length of the channel region of the transistor, and a transistor with strong output capability has a large ratio of width to length of the channel region. As shown in FIG. 17, a width of the channel region 140a (i.e., the length of the channel region 140a along the second direction Y) of the active layer 140 of the fourth transistor T4 is $W_{T4}$. A width of the channel region 150a (i.e., the length of the channel region 150a along the first direction X) of the active layer 150 of the fifth transistor T5 is $W_{T5}$. The width of the channel region 150a of the active layer 150 of the fifth transistor T5 and the width of the channel region 140a of the active layer 140 of the fourth transistor T4 satisfy $2\ W_{T4} < W_{T5}$.

In the embodiments of the present disclosure, the "width" of A represents a characteristic dimension of A in a direction perpendicular to the extension direction.

Figure 18:
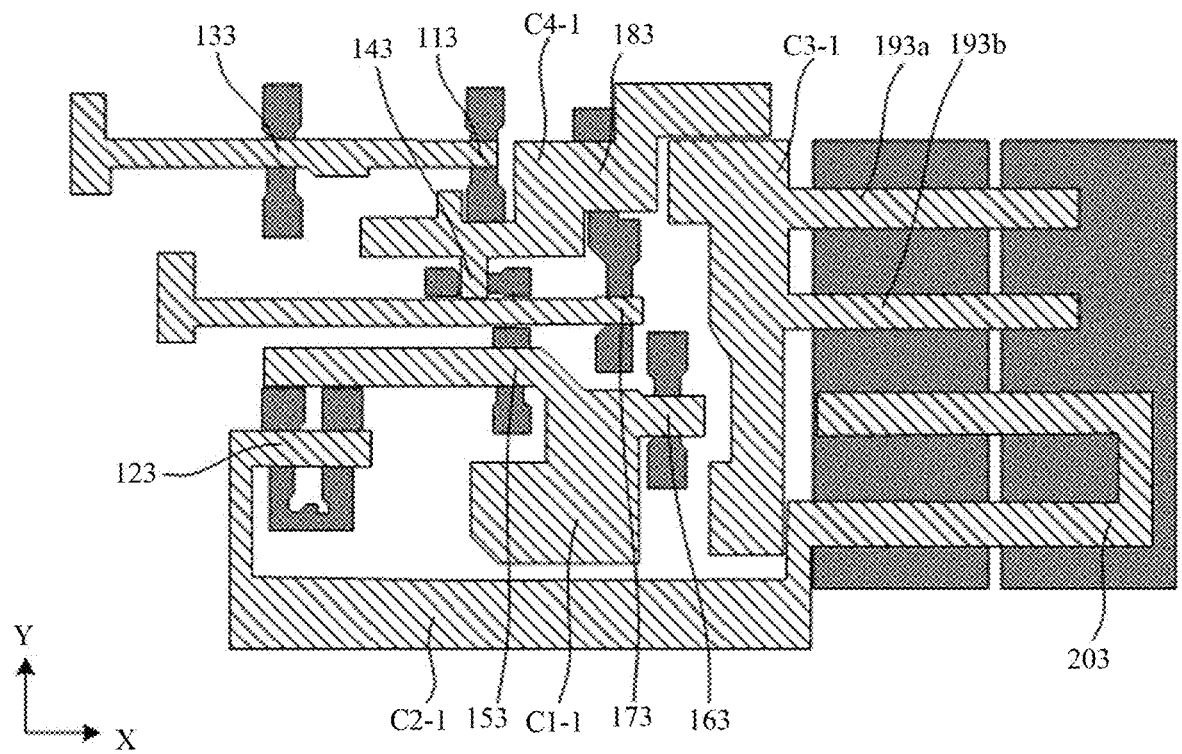
FIG. 18 is a top view of a scan drive control circuit after a first conductive layer is formed according to at least one embodiment of the present disclosure.

FIG. 18 is a top view of a scan drive control circuit after a first conductive layer is formed according to at least one embodiment of the present disclosure. As shown in FIG. 15 to FIG. 18, the first conductive layer in the non-display area at least includes: control electrodes of a plurality of transistors and first electrodes of a plurality of capacitors of the scan drive control circuit. For example, the first conductive layer may include a control electrode 113 of the first transistor T1, a control electrode 123 of the second transistor T2, a control electrode 133 of the third transistor T3, a control electrode 143 of the fourth transistor T4, a control electrode 153 of the fifth transistor T5, a control electrode 163 of the sixth transistor T6, a control electrode 173 of the seventh transistor T7, a control electrode 183 of the eighth transistor T8, control electrodes 193a and 193b of the ninth transistor T9, a control electrode 203 of the tenth transistor T10, a first electrode C1-1 of the first capacitor C1, a first electrode C2-1 of the second capacitor C2, a first electrode C3-1 of the third capacitor C3, and a first electrode C4-1 of the fourth capacitor C4.

In some exemplary embodiments, as shown in FIG. 18, the control electrode 133 of the third transistor T3 and the control electrode 113 of the first transistor T1 may form an integrated structure. The control electrode 123 of the second transistor T2, the control electrode 203 of the tenth transistor T10, and the first electrode C2-1 of the second capacitor C2 may form an integrated structure. The control electrode 153 of the fifth transistor T5, the control electrode 163 of the sixth transistor T6 and the first electrode C1-1 of the first capacitor C1 may form an integrated structure. The control electrode 183 of the eighth transistor T8, the control electrode 143 of the fourth transistor T4, and the first electrode C4-1 of the fourth capacitor C4 may form an integrated structure. The control electrodes 193a and 193b of the ninth transistor T9 and the first electrode C3-1 of the third capacitor C3 may form an integrated structure. However, this embodiment is not limited thereto.

In some exemplary embodiments, the ninth transistor T9 may be a transistor with double gates to prevent and reduce occurrence of a leakage current. However, this embodiment is not limited thereto.

Figure 19:
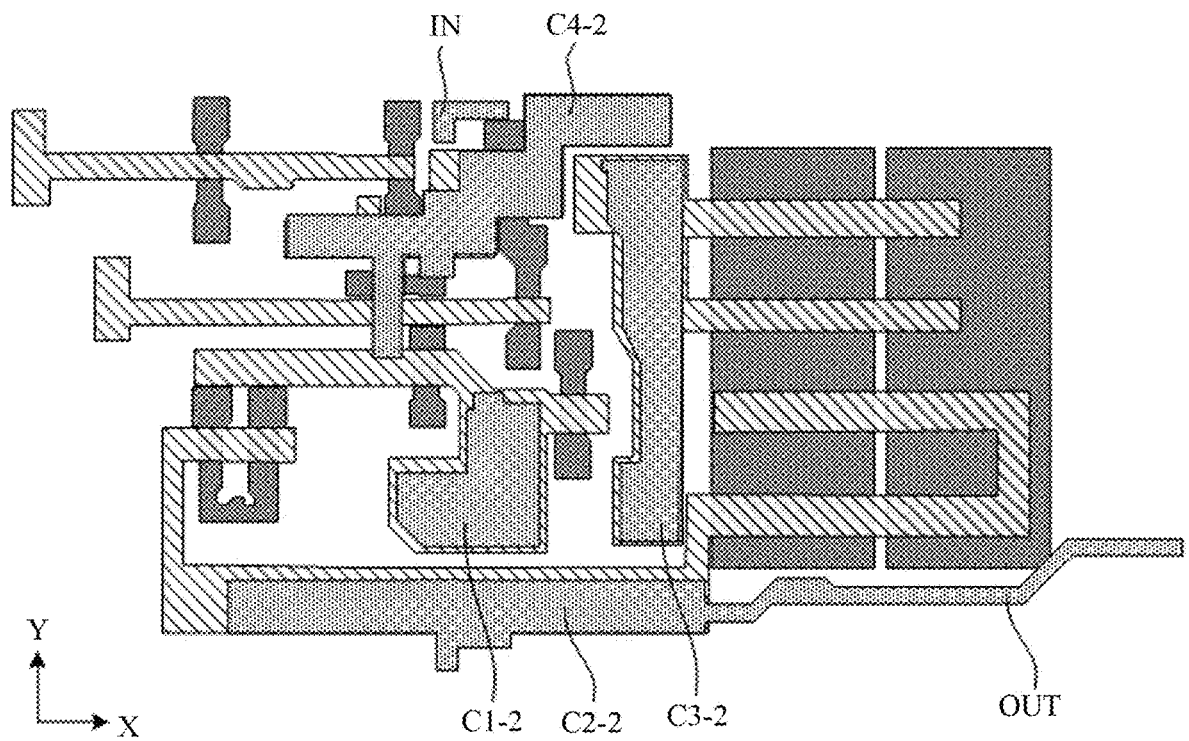
FIG. 19 is a top view of a scan drive control circuit after a second conductive layer is formed according to at least one embodiment of the present disclosure.

FIG. 19 is a top view of a scan drive control circuit after a second conductive layer is formed according to at least one embodiment of the present disclosure. As shown in FIGS. 15 to 19, the second conductive layer of the non-display area at least includes second electrodes of a plurality of capacitors of the scan drive control circuit, a signal input terminal, and a signal input terminal. For example, the second conductive layer may include a second electrode C1-2 of the first capacitor C1, a second electrode C2-2 of the second capacitor C2, a second electrode C3-2 of the third capacitor C3, a second electrode C4-2 of the fourth capacitor C4, a signal input terminal IN, and a signal output terminal OUT. The second electrode C2-2 of the second capacitor C2 and the signal output terminal OUT may form an integrated structure. However, this embodiment is not limited thereto.

In some exemplary embodiments, as shown in FIG. 19, a projection of the second electrode C1-2 of the first capacitor C1 on the base substrate is overlapped with a projection of the first electrode C1-1 of the first capacitor C1 on the base substrate. A projection of the second electrode C2-2 of the second capacitor C2 on the base substrate is overlapped with a projection of the first electrode C2-1 of the second capacitor C2 on the base substrate. A projection of the second electrode C3-2 of the third capacitor C3 on the base substrate is overlapped with a projection of the first electrode C3-1 of the third capacitor C3 on the base substrate. A projection of the second electrode C4-2 of the fourth capacitor C4 on the base substrate is overlapped with a projection of the first electrode C4-1 of the fourth capacitor C4 on the base substrate.

Figure 20:
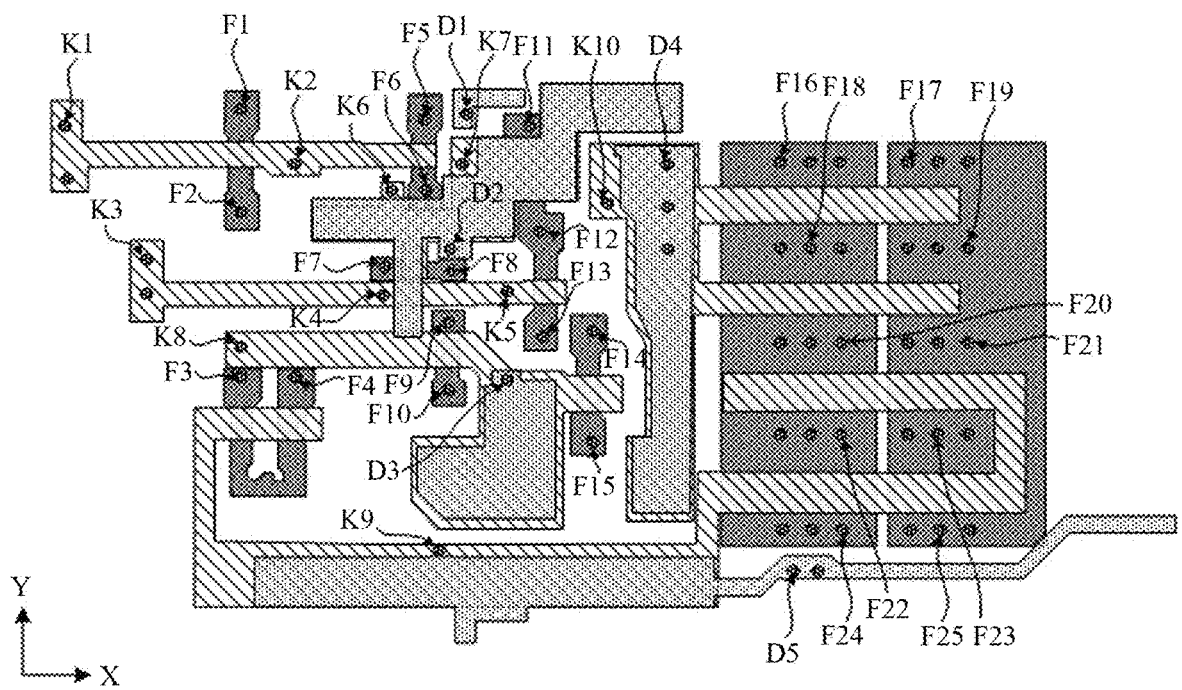
FIG. 20 is a top view of a scan drive control circuit after a third insulation layer is formed according to at least one embodiment of the present disclosure.

FIG. 20 is a top view of a scan drive control circuit after a third insulation layer is formed according to at least one embodiment of the present disclosure. As shown in FIG. 15 to FIG. 20, a plurality of vias are formed on the third insulation layer 33 of the non-display area. For example, the plurality of vias may include a plurality of first vias F1 to F25, a plurality of second vias K1 to K10, and a plurality of third vias D1 to D5. The third insulation layer 33, the second insulation layer 32 and the first insulation layer 31 within the plurality of first vias F1 to F25 are etched off to expose a surface of the first semiconductor layer. The third insulation layer 33 and the second insulation layer 32 within the plurality of second vias K1 to K10 are etched away to expose a surface of a first conductive layer. The third insulation layer 33 in the plurality of third vias D1 to D5 is etched away to expose a surface of the second conductive layer.

Figure 21:
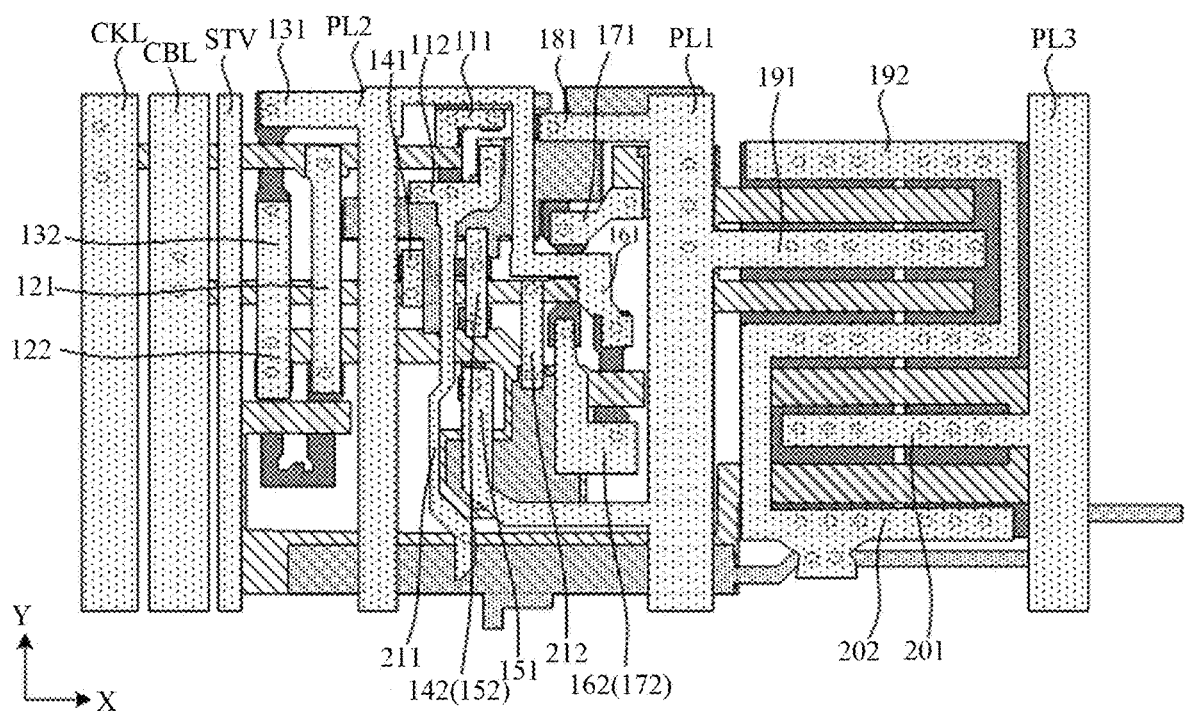
FIG. 21 is a top view of a scan drive control circuit after a third conductive layer is formed according to at least one embodiment of the present disclosure.

FIG. 21 is a top view of a scan drive control circuit after a third conductive layer is formed according to at least one embodiment of the present disclosure. As shown in FIGS. 15 to 21, the third conductive layer of the non-display area at least includes first electrodes and second electrodes of a plurality of transistors of the scan drive control circuit, a plurality of clock signal lines, and a plurality of power supply lines. For example, the third conductive layer may include first electrodes and second electrodes of the first to tenth transistors T1 to T10, a first clock signal line CKL, a second clock signal line CBL, an initial signal line STV, a first power supply line PL1, a second power supply line PL2, a third power supply line PL3, a first connection electrode 211, and a second connection electrode 212.

In some exemplary embodiments, as shown in FIG. 21, the first electrode 131 of the third transistor T3, the first electrode 161 of the sixth transistor T6, and the second power supply line PL2 may form an integrated structure. The second electrode 121 of the second transistor T2 and the second electrode 132 of the third transistor T3 may form an integrated structure. The second electrode 142 of the fourth transistor T4 and the second electrode 152 of the fifth transistor T5 may form an integrated structure. The first electrode 151 of the fifth transistor T5, the first electrode 181 of the eighth transistor T8, the first electrode 191 of the ninth transistor T9 and the first power supply line PL1 may form an integrated structure. The second electrode 162 of the sixth transistor T6 and the second electrode 172 of the seventh transistor T7 may form an integrated structure. The second electrode 192 of the ninth transistor T9 and the second electrode 202 of the tenth transistor T10 may form an integrated structure. The first electrode 201 of the tenth transistor T10 and the third power supply line PL3 may form an integrated structure.

In some exemplary embodiments, as shown in FIG. 21, a first connection electrode 211 is connected to the first electrode C2-1 of the second capacitor C2 through the second via K9, to the first electrode C4-1 of the fourth capacitor C4 through the second via K7, to the second doped region 110c of the active layer 110 of the first transistor T1 through the first via F6, and to the control electrode 143 of the fourth transistor T4 through the second via K6. A projection of the first connection electrode 211 on the base substrate is located between a projection of the first power supply line PL1 and a projection of the second power supply line PL2 on the base substrate. A second connection electrode 212 is connected to the second electrode C1-2 of the first capacitor C1 through the third via D3, and is also connected to the control electrode 173 of the seventh transistor T7 through the second via K5. The first power supply line PL1 is connected to the second electrode C3-2 of the third capacitor C3 through a plurality (e.g. three) of third vias D4 provided vertically. However, this embodiment is not limited thereto.

In some exemplary embodiments, as shown in FIGS. 15 to 21, the first transistor T1 includes an active layer 110, a control electrode 113, a first electrode 111, and a second electrode 112. The active layer 110 of the first transistor T1 includes a channel region 110a, a first doped region 110b, and a second doped region 110c. The active layer 110 of the first transistor T1 is adjacent to the second power supply line PL2. A distance L2 between a side edge of the channel region 110a of the active layer 110 of the first transistor T1 close to the second power supply line PL2 and a side edge of the second power supply line PL2 away from the first transistor T1 satisfies: $0 \leq L2 \leq 4W_{PL2}$; where $W_{PL2}$ is a width of the second power supply line PL2 (i.e. a length X3 of the second power supply line PL2 along the first direction X). The first electrode 111 of the first transistor T1 is connected to the first doped region 110b of the active layer 110 of the first transistor T1 through the first via F5 and connected to the signal input terminal IN through the third via D1. The control electrode 113 of the first transistor T1 and the control electrode 133 of the third transistor T3 form an integrated structure. The first clock signal line CKL is connected to the control electrode 113 of the first transistor T1 through two second vias K1 provided vertically, so that the control electrode 113 of the first transistor T1 receives the first clock signal.

In the embodiments of the present disclosure, "disposed side by side" may mean being disposed in sequence along the first direction X, and "disposed vertically" may mean being disposed in sequence along the second direction Y.

In some exemplary embodiments, as shown in FIGS. 15-21, the second transistor T2 includes an active layer 120, a control electrode 123, a first electrode 121, and a second electrode 122. The active layer 120 of the second transistor T2 includes a channel region 120a, a first doped region 120b, and a second doped region 120c. The control electrode 123 of the second transistor T2, the first electrode C2-1 of the second capacitor C2, and the control electrode 203 of the tenth transistor T10 form an integrated structure. The first electrode 121 of the second transistor T2 is connected to the first doped region 120b of the active layer 120 of the second transistor T2 through the first via F4, and is also connected to the control electrode 113 of the first transistor T1 through the second via K2 to realize an electrical connection with the first clock signal line CKL. The second electrode 122 of the second transistor T2 and the second electrode 132 of the third transistor T3 may form an integrated structure. The second electrode 122 of the second transistor T2 is connected to the second doped region 120c of the active layer 120 of the second transistor T2 through the first via F3, and is also connected to the control electrode 153 of the fifth transistor T5 through the second via K8.

In some examples, the second power supply line PL2 is located at a side of the second transistor T2 away from the first clock signal line CKL. The active layer 120 of the second transistor T2 is adjacent to the second power supply line PL2. A distance L4 between a side edge of the channel region 120a of the active layer 120 of the second transistor T2 close to the second power supply line PL2 and a side edge of the second power supply line PL2 away from the second transistor T2 satisfies: $0 \leq L4 \leq W_{PL2}$; where $W_{PL2}$ is the width of the second power supply line PL2.

In some exemplary embodiments, as shown in FIGS. 15 to 21, the third transistor T3 includes an active layer 130, a control electrode 133, a first electrode 131 and a second electrode 132. The active layer 130 of the third transistor T3 includes a channel region 130a, a first doped region 130b, and a second doped region 130c. The first electrode 131 of the third transistor T3 and the second power supply line PL2 form an integrated structure. The first electrode 131 of the third transistor T3 is connected to the first doped region 130b of the active layer 130 of the third transistor T3 through the first via F1. The second electrode 132 of the third transistor T3 is connected to the second doped region 130c of the active layer 130 of the third transistor T3 through the first via F2. In some examples, the second power supply line PL2 is located at a side of the third transistor T3 away from the initial signal line STV. A distance L3 between a side edge of the channel region 130a of the active layer 130 of the third transistor T3 close to the second power supply line PL2 and a side edge of the second power supply line PL2 away from the third transistor T3 satisfies: $0 \leq L3 \leq 4W_{PL2}$; where $W_{PL2}$ is the width of the second power supply line PL2.

In some exemplary embodiments, as shown in FIGS. 15-21, the fourth transistor T4 includes an active layer 140, a control electrode 143, a first electrode 141, and a second electrode 142. The active layer 140 of the fourth transistor T4 includes a channel region 140a, a first doped region 140b, and a second doped region 140c. The control electrode 143 of the fourth transistor T4 and the first electrode C4-1 of the fourth capacitor C4 form an integrated structure. The first electrode 141 of the fourth transistor T4 is connected to the first doped region 140b of the active layer 140 of the fourth transistor T4 through the first via F7, and is also connected to the control electrode 173 of the seventh transistor T7 through the second via K4. The second electrode 142 of the fourth transistor T4 and the second electrode 152 of the fifth transistor T5 may form an integrated structure. The second pole 142 of the fourth transistor T4 is connected to the second doped region 140c of the active layer 140 of the fourth transistor T4 through the first via F8, and is also connected to the second pole C4-2 of the fourth capacitor C4 through the third via D2.

In some exemplary embodiments, as shown in FIGS. 15 to 21, the fifth transistor T5 includes an active layer 150, a control electrode 153, a first electrode 151, and a second electrode 152. The active layer 150 of the fifth transistor T5 includes a channel region 150a, a first doped region 150b, and a second doped region 150c. The control electrode 153 of the fifth transistor T5 and the control electrode 163 of the sixth transistor T6 form an integrated structure. The first electrode 151 of the fifth transistor T5 and the first power supply line PL1 form an integrated structure. The first electrode 151 of the fifth transistor T5 is connected to the first doped region 150b of the active layer 150 of the fifth transistor T5 through the first via F10. The second electrode 152 of the fifth transistor T5 is connected to the second doped region 150c of the active layer 150 of the fifth transistor T5 through the first via F9.

In some exemplary embodiments, as shown in FIGS. 15-21, the sixth transistor T6 includes an active layer 160, a control electrode 163, a first electrode 161, and a second electrode 162. The active layer 160 of the sixth transistor T6 includes a channel region 160a, a first doped region 160b, and a second doped region 160c. The first electrode 161 of the sixth transistor T6 and the second power supply line PL2 form an integrated structure. The first electrode 161 of the sixth transistor T6 is connected to the first doped region 160b of the active layer 160 of the sixth transistor T6 through the first via F14. The second electrode 162 of the sixth transistor T6 and the second electrode 172 of the seventh transistor T7 form an integrated structure. The second electrode 162 of the sixth transistor T6 is connected to the second doped region 160c of the active layer 160 of the sixth transistor T6 through the first via F15.

In some exemplary embodiments, as shown in FIGS. 15 to 21, the seventh transistor T7 includes an active layer 170, a control electrode 173, a first electrode 171, and a second electrode 172. The active layer 170 of the seventh transistor T7 and the active layer 180 of the eighth transistor T8 form an integrated structure. The active layer 170 of the seventh transistor T7 includes a channel region 170a, a first doped region 170b, and a second doped region 170c. The first doped region 170b of the active layer 170 of the seventh transistor T7 is connected to the second doped region 180c of the active layer 180 of the eighth transistor T8. The first electrode 171 of the seventh transistor T7 is connected to the first doped region 170b of the active layer 170 of the seventh transistor T7 through the first via F12, and is also connected to the first electrode C3-1 of the third capacitor C3 through the second via K10. The second electrode 172 of the seventh transistor T7 is connected to the second doped region 170c of the active layer 170 of the seventh transistor T7 through the first via F13. The second clock signal line CBL is connected to the control electrode 173 of the seventh transistor T7 through two second vias K3 provided vertically.

In some exemplary embodiments, as shown in FIGS. 15 to 21, the eighth transistor T8 includes an active layer 180, a control electrode 183, and a first electrode 181. The active layer 180 of the eighth transistor T8 includes a channel region 180a, a first doped region 180b, and a second doped region 180c. The control electrode 183 of the eighth transistor T8 and the first electrode C4-1 of the fourth capacitor C4 form an integrated structure. The first electrode 181 of the eighth transistor T8 and the first power supply line PL1 form an integrated structure. The first electrode 181 of the eighth transistor T8 is connected to the first doped region 180b of the active layer 180 of the eighth transistor T8 through the first via F11.

In some exemplary embodiments, as shown in FIGS. 15-21, the ninth transistor T9 includes an active layer, control electrodes 193a and 193b, a first electrode 191, and a second electrode 192. The active layer of the ninth transistor T9 includes a first partition 190-1 and a second partition 190-2. The first partition 190-1 of the ninth transistor T9 includes channel regions 190-1a1 and 190-1a2, a first doped region 190-1b, a second doped region 190-1c, and a third doped region 190-1d. The second partition 190-2 of the ninth transistor T9 includes channel regions 190-2a1 and 190-2a2, a first doped region 190-2b, a second doped region 190-2c, and a third doped region 190-2d. The first electrode 191 of the ninth transistor T9 and the first power supply line PL1 form an integrated structure. The first electrode 191 of the ninth transistor T9 is connected to the first doped region 190-1b of the first partition 190-1 of the ninth transistor T9 through a plurality of (e.g. three) first vias F18 provided side by side, and is also connected to the first doped region 190-2b of the second partition 190-2 of the ninth transistor T9 through a plurality of (e.g. three) first vias F19 provided side by side. The second electrode 192 of the ninth transistor T9 and the second electrode 202 of the tenth transistor T10 form an integrated structure. The second electrode 192 of the ninth transistor T9 is connected to the second doped region 190-1c of the first partition 190-1 of the ninth transistor T9 through a plurality of (e.g. three) first vias F16 provided side by side, and is also connected to the second doped region 190-2c of the second partition 190-2 of the ninth transistor T9 through a plurality of (e.g. three) first vias F17 provided side by side, and is also connected to the third doped region 190-1d of the first partition 190-1 of the ninth transistor T9 through a plurality of (e.g. three) first vias F20 provided side by side, and is also connected to the third doped region 190-2d of the second partition 190-2 of the ninth transistor T9 through a plurality of (e.g. three) first vias F21 provided side by side.

In some exemplary embodiments, as shown in FIGS. 15 to 21, the tenth transistor T10 includes an active layer, a control electrode 203, a first electrode 201, and a second electrode 202. The active layer of the tenth transistor T10 includes a third partition 200-1 and a fourth partition 200-2. The third partition 200-1 of the tenth transistor T10 includes channel regions 200-1a1 and 200-1a2, a first doped region 200-1b, a second doped region 200-1c, and a third doped region 200-1d. The fourth partition 200-2 of the tenth transistor T10 includes a channel region 200-2a, a first doped region 200-2b, and a second doped region 200-2c. The third partition 200-1 of the tenth transistor T10 and the first partition 190-1 of the ninth transistor T9 form an integrated structure, and the second doped region 200-1c of the third partition 200-1 is connected to the third doped region 190-1d of the first partition 190-1 of the ninth transistor. The fourth partition 200-2 of the tenth transistor T10 and the second partition 190-2 of the ninth transistor T9 form an integrated structure, and the second doped region 200-2c of the fourth partition 200-2 is connected to the third doped region 190-2d of the second partition 190-2 of the ninth transistor T9. The first electrode 201 of the tenth transistor T10 and the third power supply line PL3 form an integrated structure. The first electrode 201 of the tenth transistor T10 is connected to the first doped region 200-1b of the third partition 200-1 of the tenth transistor T10 through a plurality of (e.g. three) first vias F22 provided side by side, and is also connected to the first doped region 200-2b of the fourth partition 200-2 of the tenth transistor T10 through a plurality of (e.g. three) first vias F23 provided side by side. The second electrode 202 of the tenth transistor T10 is connected to the third doped region 200-1d of the third partition 200-1 of the tenth transistor T10 through a plurality of (e.g. three) first vias F24 provided side by side, and is also connected to the second doped region 200-2c of the fourth partition 200-2 of the tenth transistor T10 through a plurality of (e.g. three) first vias F25 provided side by side. The second electrode 202 of the tenth transistor T10 is also connected to the signal output terminal OUT through two third vias D5 provided side by side.

In some exemplary embodiments, the output control circuit of the scan drive control circuit includes a first node control capacitor and a second node control capacitor. The first node control capacitor may be configured to control a potential of the first node N1, and the second node control capacitor may be configured to control a potential of the second node N2. The first node control capacitor includes the first capacitor C1 and the third capacitor C3. The second node control capacitor includes the second capacitor C2 and the fourth capacitor C4. In this exemplary embodiment, through a series design of the second capacitor C2 and the fourth capacitor C4, it is possible to make the potential of the second node N2 more stable, thereby making the tenth transistor T10 achieve a stable output.

In some exemplary embodiments, a capacitor generally functions to stabilize the potential of a node, and an area of the capacitor is related to a range in which the potential of the node controlled by this capacitor needs to be maintained. In order to achieve a narrow bezel, it is necessary to rationally arrange capacitors in a smaller space to achieve the function thereof. For the display substrate provided in this embodiment, by setting a ratio of the width of the capacitor (for example, the length in the first direction) to a width of the scan drive control circuit to meet certain conditions, it is possible to ensure or even optimize performance of the scan drive control circuit on the premise of efficient space utilization.

In some exemplary embodiments, lengths of the first node control capacitor, the second node control capacitor, and the scan drive control circuit in the first direction satisfy:

$$\frac{L_{C1k}}{L_Y} < \frac{L_{C2k}}{L_Y};$$

$$\frac{L_{C1k}}{L_Y} < 0.20;$$

where $L_{C1k}$ is a length of the first node control capacitor in the first direction, $L_{C2k}$ is a length of the second node control capacitor in the first direction, $L_Y$ is a length of the scan drive control circuit in the first direction.

In some exemplary embodiments, the length $L_Y$ of the scan drive control circuit in the first direction is a distance between a side of a clock signal line or the initial signal line away from the display area and a side of the power supply line close to the display area. When there is a clock signal line and an initial signal line at a side away from the display area, traces at a side away from the display area shall prevail. When there is a power supply line and other traces (e.g. traces extending from the signal output terminal to the display area) at a side close to the display area, the traces close to the display area shall prevail. In some examples, as shown in FIG. 15, the length $L_Y$ of the scan drive control circuit in the first direction X is a distance between a side edge of the first clock signal line CKL away from the display area and a side edge of the third power supply line PL3 close to the display area.

In some exemplary embodiments, the length $L_{C1k}$ of the first node control capacitor in the first direction may be the larger one of the length of the first capacitor C1 in the first direction and the length of the third capacitor C3 in the first direction. The length $L_{C2k}$ of second node control capacitor in the first direction may be the larger one of the length of the second capacitor C2 in the first direction and the length of the fourth capacitor C4 in the first direction. For an irregularly shaped capacitor, a length of the capacitor in the first direction may be the maximum of a length of the capacitor in the first direction.

In some exemplary embodiments, lengths of the first capacitor, the third capacitor, the second node control capacitor, and the scan drive control circuit in the first direction satisfy:

$$\frac{L_{C3}}{L_Y} < \frac{L_{C1}}{L_Y} < \frac{L_{C2k}}{L_Y};$$

$$\frac{L_{C3}}{L_Y} < \frac{L_{C1}}{L_Y} < 0.20;$$

where $L_{C1}$ is a length of the first capacitor in the first direction, $L_{C3}$ is a length of the third capacitor in the first direction, $L_{C2k}$ is the length of the second node control capacitor in the first direction, $L_Y$ is the length of the scan drive control circuit in the first direction.

In some exemplary embodiments, the lengths of the first capacitor and the scan drive control circuit in the first direction satisfies:

$$0.07 \le \frac{L_{C1}}{L_Y} < 0.20;$$

the lengths of the second node control capacitor and the scan drive control circuit in the first direction satisfies:

$$0.20 \le \frac{L_{C2k}}{L_Y} \le 0.60;$$

the lengths of the third capacitor and the scan drive control circuit in the first direction satisfies:

$$0.04 \leq \frac{L_{C3}}{L_Y} \leq 0.09.$$

In some exemplary embodiments, $$\frac{L_{C1}}{L_Y}$$

is one of the following: 0.09, 0.10, 0.14;

$$\frac{L_{C2k}}{L_Y}$$

is one of the following: 0.22, 0.35, 0.48;

$$\frac{L_{C3}}{L_Y}$$

is one of the following: 0.07, 0.06, 0.05.
In some exemplary embodiments.

$$0.07 \leq \frac{L_{C1}}{L_Y} \leq 0.09.$$

In some exemplary embodiments, $$0.48 \leq \frac{L_{C2k}}{L_Y} \leq 0.60.$$

In some exemplary embodiments, $$0.06 \leq \frac{L_{C3}}{L_Y} \leq 0.09.$$

Further, in order to improve the space utilization, projections of the power supply line or the clock signal line and the capacitor on the base substrate may be overlapped with each other.

In some exemplary embodiments, projections of the first power supply line and the third capacitor on the base substrate are overlapped with each other, and an overlapped area between the first power supply line and the third capacitor satisfies:

$$\tfrac{1}{5}S_{C3} < S_{C3\_1} \leq S_{C2};$$

where $S_{C3}$ is an area of the projection of the third capacitor on the base substrate, $S_{C3\_1}$ is the overlapped area between the projections of the third capacitor and the first power supply line on the base substrate, $S_{C2}$ is an area of the projection of the second capacitor on the base substrate.

In some exemplary embodiments, projections of the second node control capacitor and the first power supply line on the base substrate are overlapped with each other, and an overlapped area between the second node control capacitor and the first power supply line satisfies:

$$\tfrac{1}{4}X2*L5 < S_{C2k-1} \leq X2*L5;$$

where, $S_{C2k-1}$ is the overlapped area between the projections of the second node control capacitor and the first power supply line on the base substrate, X2 is the length of the first power supply line in the first direction, L5 is a length in the second direction of the overlapped area between a projection of one of capacitors in the second node control capacitor on the base substrate and a projection of the first power supply line on the base substrate. In some exemplary embodiments, the area of the projection of the second node control capacitor may be a sum of the areas of the projections of the second capacitor and the fourth capacitor.

In some exemplary embodiments, as shown in FIG. 15, L5' is a length in the second direction Y of the overlapped area between the projections of the second capacitor C2 and the first power supply line PL1 on the base substrate. L5" is a length in the second direction Y of the overlapped area between the projections of the fourth capacitor C4 and the first power supply line PL1 on the base substrate. A length L5 in the second direction of the overlapped area between the projection of one of the capacitors in the second node control capacitor on the base substrate and the projection of the first power supply line on the base substrate may be L5' or L5".

In some exemplary embodiments, projections of the second node control capacitor and the second power supply line on the base substrate are overlapped with each other, and the overlapped area between the second node control capacitor and the second power supply line satisfies:

$$\tfrac{1}{4}X3*L6 < S_{C2k-2} \leq X3*L6;$$

where $S_{C2k-2}$ is the overlapped area between the projections of the second node control capacitor and the second power supply line on the base substrate, X3 is the length of the second power supply line in the first direction, L6 is a length in the second direction of an overlapped area between a projection of one of the capacitors in the second node control capacitor on the base substrate and a projection of the second power supply line on the base substrate.

In some exemplary embodiments, as shown in FIG. 15, L6' is a length in the second direction Y of the overlapped area between the projections of the second capacitor C2 and the second power supply line PL2 on the base substrate. L6" is a length in the second direction Y of the overlapped area between the projections of the fourth capacitor C4 and the second power supply line PL2 on the base substrate. A length L6 in the second direction of the overlapped area between the projection of one of the capacitors in the second node control capacitor on the base substrate and the projection of the second power supply line on the base substrate may be L6' or L6".

In some exemplary embodiments, as shown in FIG. 15, a distance L7 between a center of the first capacitor C1 in the first direction X and a side edge of the first power supply line PL1 away from the first capacitor C1 in the first direction X is greater than a distance L8 between the center of the first capacitor C1 in the first direction X and a side edge of the second power supply line PL2 close to the first capacitor C1 in the first direction X, and L7≥2*L8.

In some exemplary embodiments, as shown in FIG. 15, a distance L9 between a side edge of the active layer 180 of the eighth transistor T8 close to the third capacitor C3 and a side edge of the third capacitor C3 close to the eighth transistor T8 satisfies: $W_{CLK} < L9 \leq W_{PL1}$; where $W_{CLK}$ is a width of the clock signal line, $W_{PL1}$ is a width of the first power supply line. In some examples, $W_{CLK}$ may be a width of the first clock signal line CKL or a width of the second clock signal line CBL. The width $W_{PL1}$ of the first power supply line PL1 is the length X2 of the first power supply line PL1 in the first direction X. For an irregularly shaped capacitor, a side edge of the capacitor is the extreme side edge. For example, L9 may be a distance between a side edge of the active layer 180 of the eighth transistor T8 close to the third capacitor C3 and a side edge of the third capacitor C3 closest to the eighth transistor T8.

In some exemplary embodiments, capacitance values of the first capacitor, the third capacitor, and the second node control capacitor satisfy:

$$C_1 < C_3 < C_{2k};$$

$$\frac{C_1}{C_{2k}} < \frac{C_3}{C_{2k}} < \frac{C_1}{C_3};$$

where $C_1$ is the capacitance value of the first capacitor, $C_3$ is the capacitance value of the third capacitor, $C_{2k}$ is the capacitance value of the second node control capacitor. In some examples, the capacitance value of the second node control capacitor may be a sum of the capacitance values of the second capacitor C2 and the fourth capacitor C4.

Figure 22:
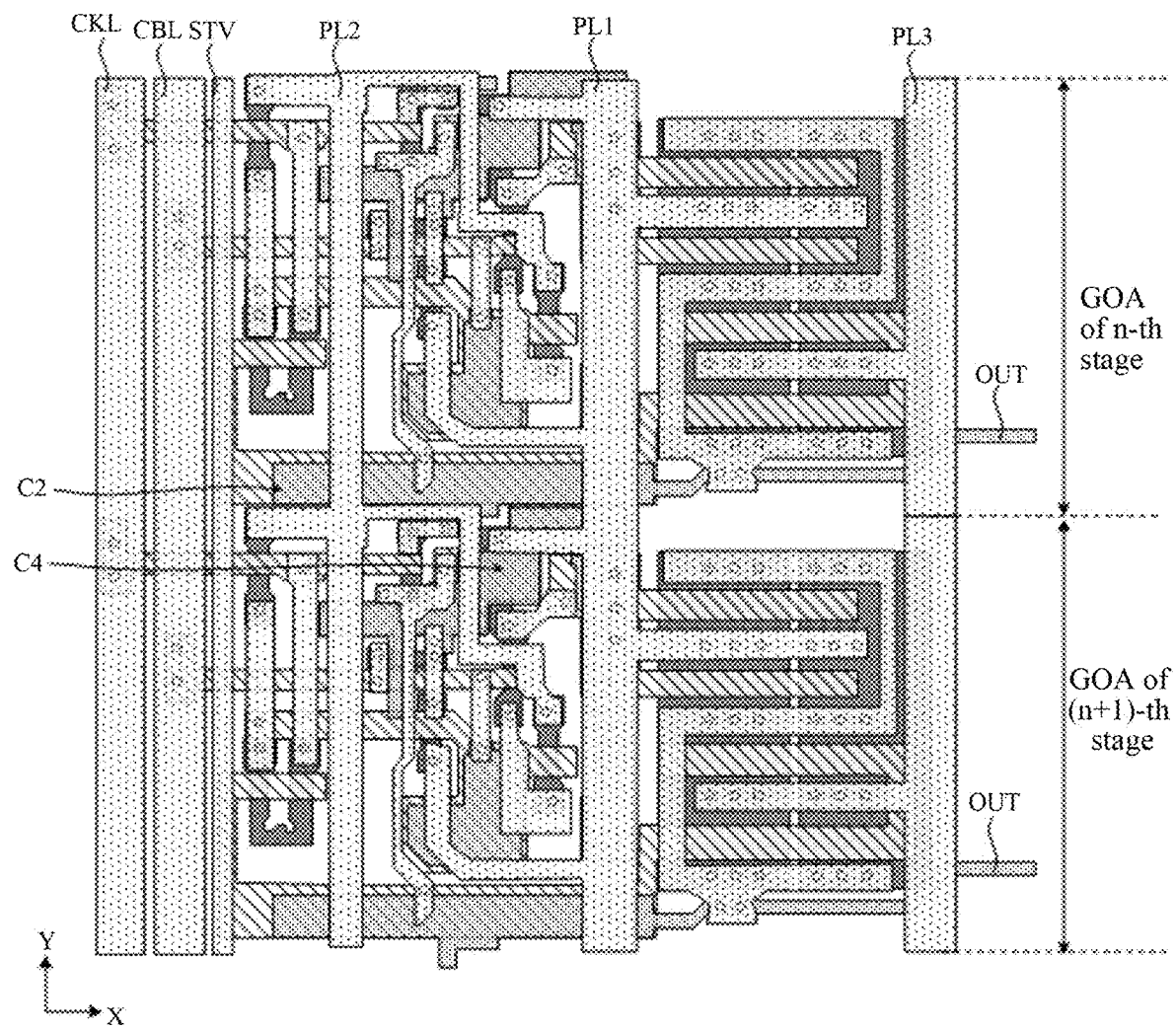
FIG. 22 is a top view of two cascaded scan drive control circuits according to at least one embodiment of the present disclosure.
Figure 23:
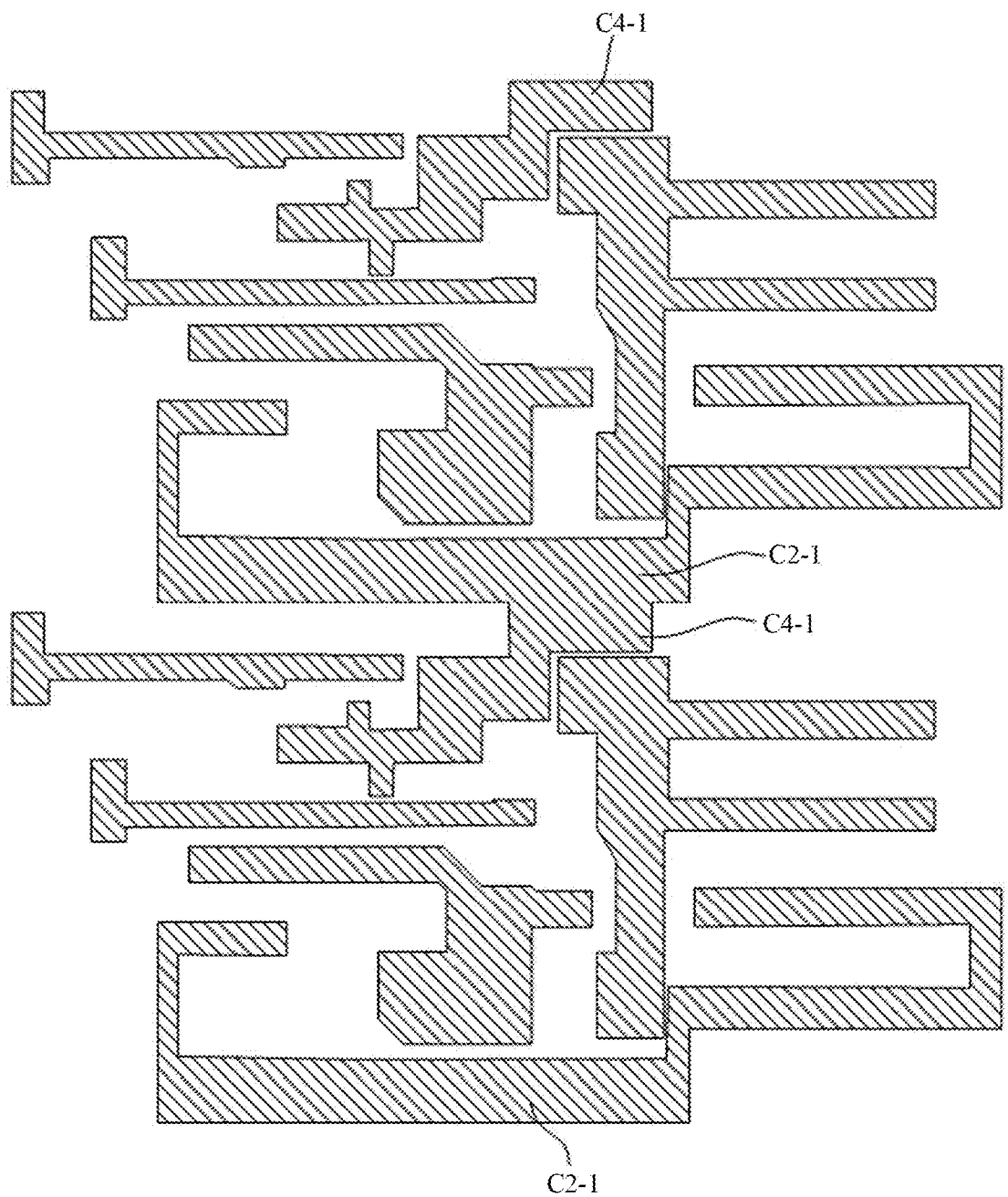
FIG. 23 is a top view of a first conductive layer in FIG. 22.

FIG. 22 is a top view of a cascaded scan drive control circuit according to at least one embodiment of the present disclosure. FIG. 23 is a schematic diagram of the first conductive layer shown in FIG. 22. In some exemplary embodiments, as shown in FIGS. 22 and 23, a first electrode C2-1 of a second capacitor C2 of a scan drive control circuit of n-th stage and a first electrode C4-1 of a fourth capacitor C4 of a scan drive control circuit of (n+1)-th stage may form an integrated structure. In this exemplary embodiment, stability of the second node may be improved while the process is simplified.

In some exemplary embodiments, as shown in FIG. 22, a signal output terminal OUT of the scan drive control circuit of n-th stage and an input terminal IN of the scan drive control circuit of (n+1)-th stage may form an integrated structure.

Rest of the structure of the scan drive control circuit according to this embodiment may be referred to descriptions of the aforementioned embodiments, and thus will not be repeated here.

Figure 24:
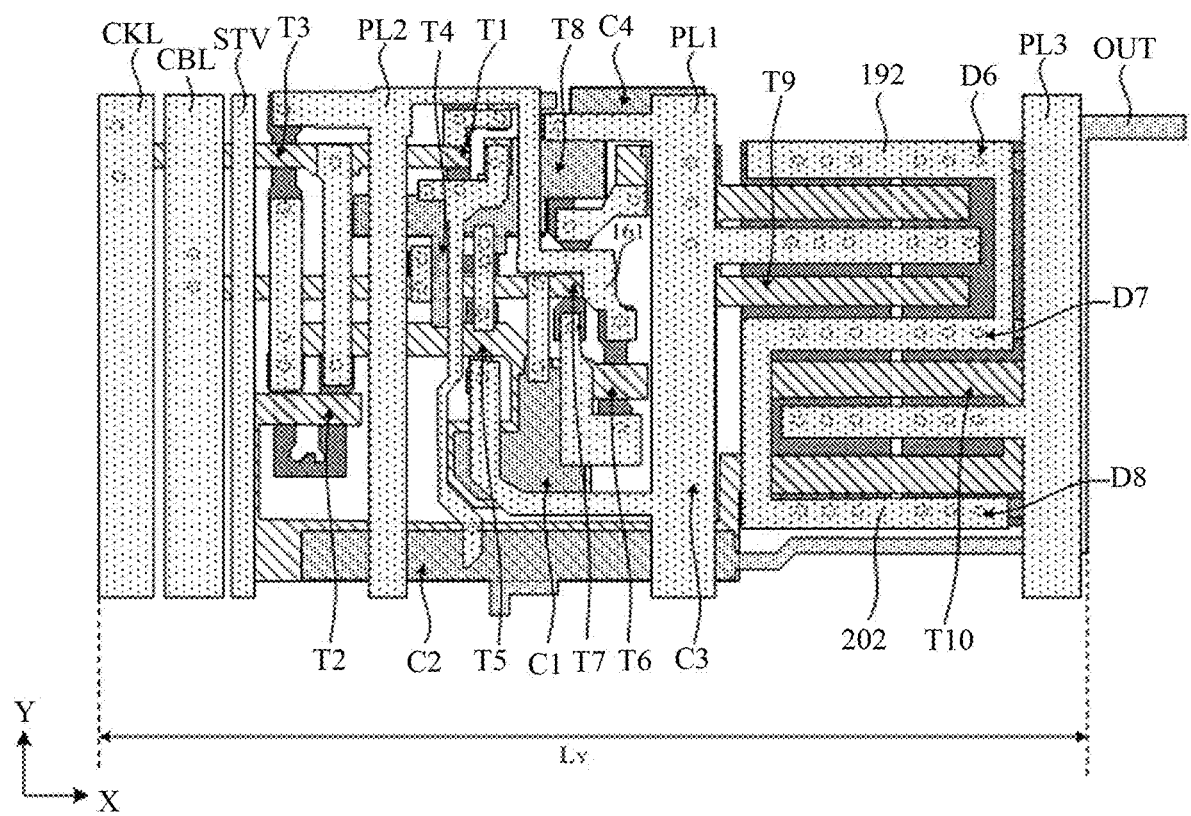
FIG. 24 is another top view of a scan drive control circuit according to at least one embodiment of the present disclosure.

FIG. 24 is another top view of a scan drive control circuit according to at least one embodiment of the present disclosure. In some exemplary embodiments, as shown in FIG. 24, the signal output terminal OUT is located at a side of the ninth transistor T9 and the tenth transistor T10 away from the first power supply line PL1. The signal output terminal OUT and the second electrode of the second capacitor C2 may form an integrated structure. The signal output terminal OUT may have three protrusions protruding along the first direction X toward a side close to the first power supply line PL1. The second electrode 192 of the ninth transistor T9 may be connected to a first protrusion of the signal output terminal OUT through the third via D6, and may also be connected to a second protrusion of the signal output terminal OUT through the third via D7, and the second electrode 202 of the tenth transistor T10 may be connected to a third protrusion of the signal output terminal OUT through the third via D8. However, this embodiment is not limited thereto.

In this exemplary embodiment, as shown in FIG. 24, the length $L_Y$ of the scan drive control circuit in the first direction X may be a distance between a side edge of the first clock signal line CKL away from the display area and a side edge of an extended trace of the signal output terminal OUT close to the display area.

Rest of the structure of the scan drive control circuit according to this embodiment may be referred to descriptions of the aforementioned embodiments, and thus will not be repeated here.

Figure 25:
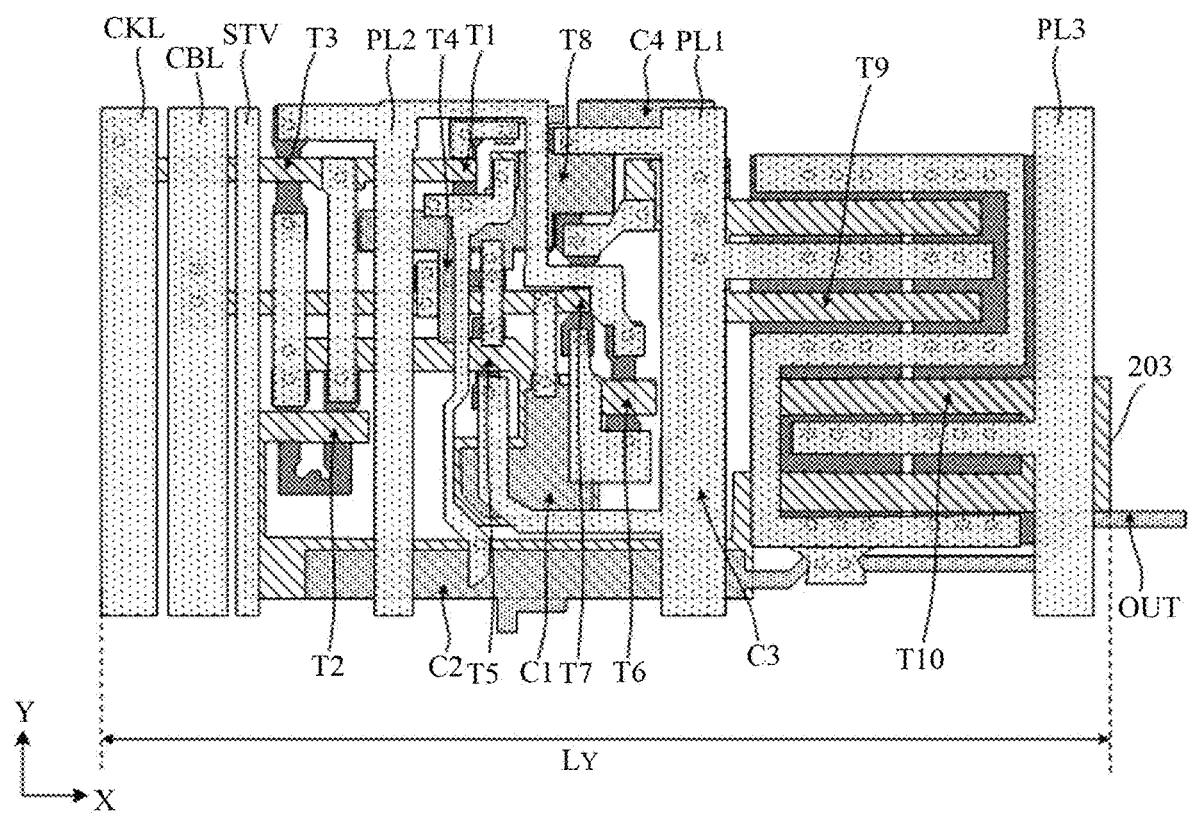
FIG. 25 is another top view of a scan drive control circuit according to at least one embodiment of the present disclosure.
Figure 26:
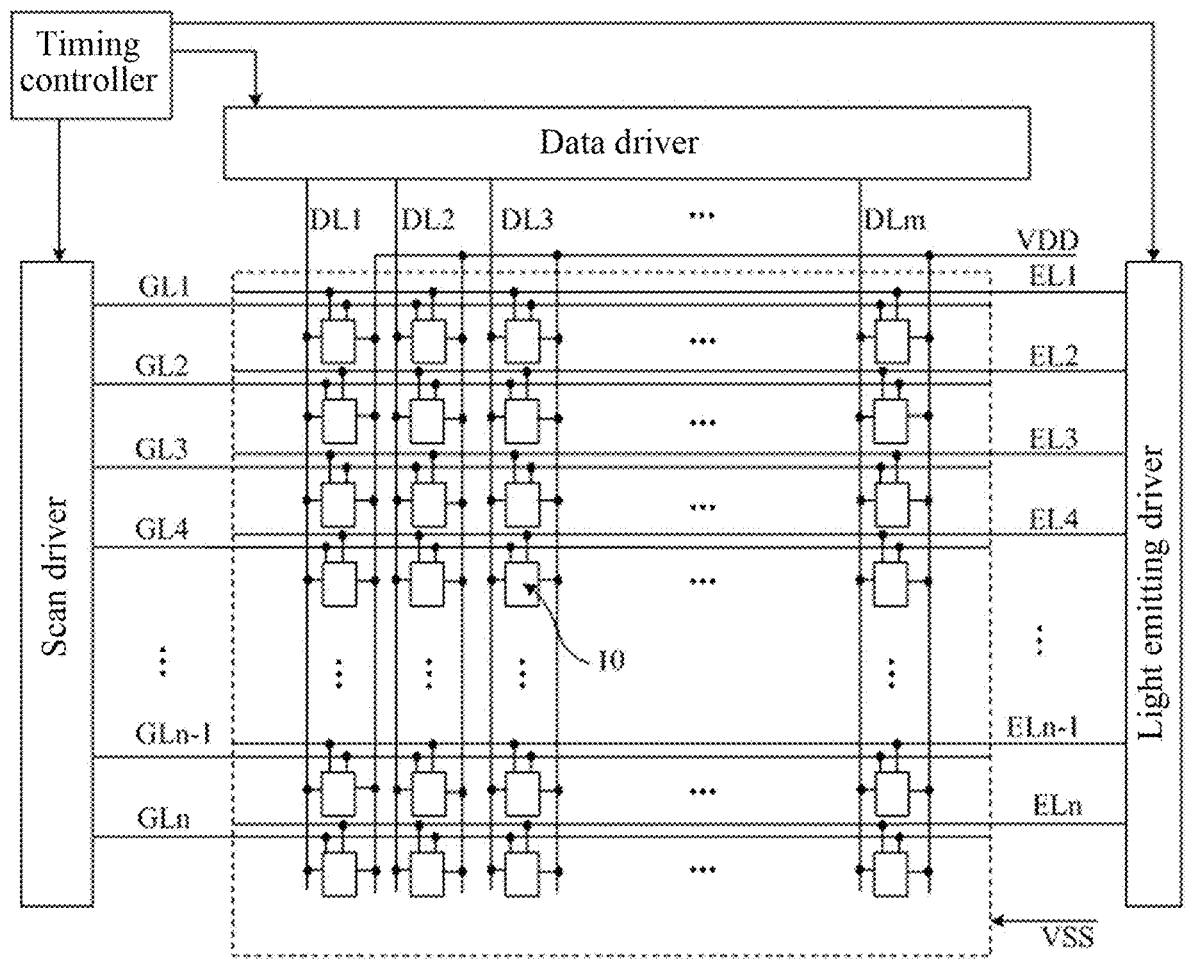
FIG. 26 is a schematic diagram of a structure of a display device according to at least one embodiment of the present disclosure.

FIG. 25 is another top view of a scan drive control circuit according to at least one embodiment of the present disclosure. In some exemplary embodiments, as shown in FIG. 25, in the first direction X, a boundary of the first conductive layer of the scan drive control circuit is closer to the display area than the side edge of the third power supply line PL3. In this example, the length $L_Y$ of the scan drive control circuit in the first direction X may be a distance between a side edge of the first clock signal line CKL away from the display area and a side edge of the first conductive layer of the scan drive control circuit close to the display area (for example, a side edge of the control electrode 203 of the tenth transistor T10 close to the display area).

Rest of the structure of the scan drive control circuit according to this embodiment may be referred to descriptions of the aforementioned embodiments, and thus will not be repeated here.

The structure of the display substrate will now be described with reference to FIGS. 15 to 21 through an example of a preparation process of the display substrate. A "patterning process" mentioned in the present disclosure includes processes, such as deposition of a film layer, photoresist coating, mask exposure, development, etching, and photoresist stripping. The deposition may be any one or more of sputtering, evaporation, and chemical vapor deposition. The coating may be any one or more of spray coating and spin coating. The etching may be any one or more of dry etching and wet etching. A "thin film" refers to a layer of a thin film prepared from a material on a base substrate using a process of deposition or coating. If a patterning process is not needed for the "thin film" during a whole preparation process, the "thin film" may be referred to as a "layer". When a patterning process is needed for the "thin film" during the whole preparation process, the thin film is referred to as a "thin film" before the patterning process and referred to as a "layer" after the patterning process. The "layer" after the patterning process includes at least one "pattern".

"A and B are arranged in the same layer" mentioned in the present disclosure refers to that A and B are simultaneously formed by the same patterning process. The "thickness" of the thin film layer is a size of the film layer in a direction perpendicular to the display substrate. In the exemplary embodiment of the present disclosure, "a projection of A includes a projection of B" refers to that a boundary of a projection of B falls within a range of a boundary of a projection of A or the boundary of a projection of A is overlapped with the boundary of a projection of B.

A preparation process of the display substrate according to the exemplary embodiment may include following steps.

(1) A base substrate is provided.

In some exemplary embodiments, a base substrate 30 may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber.

(2) A pattern of a first semiconductor layer is formed.

In some exemplary embodiments, a first semiconductor thin film is deposited on the base substrate 30, and the first semiconductor thin film is patterned through a patterning process to form a pattern of a first semiconductor layer, as shown in FIG. 17. The pattern of the first semiconductor layer at least includes active layers of a plurality of transistors (e.g. transistors T1 to T10) in the scan drive control circuit. An active layer may include at least one channel area and a plurality of doped regions. The channel region may not be doped with an impurity, and has characteristics of a semiconductor. A doped region is doped with an impurity and therefore has conductivity. The impurity may be varied according to a type (e.g., an N type or a P type) of a transistor. In some examples, a material of the first semiconductor thin film may be poly-silicon.

(3) A pattern of a first conductive layer is formed.

In some exemplary embodiments, a first insulation thin film and a first conductive thin film are sequentially deposited on the base substrate 30 where the aforementioned pattern is formed, and the first conductive thin film is patterned through a patterning process to form a first insulation layer 31 covering the pattern of the first semiconductor layer and the pattern of the first conductive layer disposed on the first insulation layer 31, as shown in FIG. 18. In some examples, the pattern of the first conductive layer may include control electrodes of a plurality of transistors (e.g. transistors T1 to T10) of the scan drive control circuit, and first electrodes of a plurality of capacitors (e.g. first capacitors C1 to fourth capacitors C4) of the scan drive control circuit.

(4) A pattern of a second conductive layer is formed.

In some exemplary embodiments, a second insulation thin film and a second conductive thin film are sequentially deposited on the base substrate 30 where the aforementioned patterns are formed, and the second conductive thin film is patterned through a patterning process to form a second insulation layer 32 covering the first conductive layer and the pattern of the second conductive layer disposed on the second insulation layer 32, as shown in FIG. 19. In some examples, the pattern of the second conductive layer may include second electrodes of a plurality of capacitors (e.g. a first capacitor C1 to a fourth capacitor C4) of the scan drive control circuit, the signal input terminal IN, and the signal output terminal OUT.

(5) A pattern of a third insulation layer is formed.

In some exemplary embodiments, a third insulating thin film is deposited on the base substrate 30 where the aforementioned patterns are formed, and the third insulating thin film is patterned through a patterning process to form a pattern of a third insulation layer covering the second conductive layer, as shown in FIGS. 20. In some examples, a plurality of vias are formed on the third insulation layer 33. The plurality of vias at least include a plurality of first vias F1 to F25, a plurality of second vias K1 to K10, and a plurality of third vias D1 to D5. The third insulation layer 33, the second insulation layer 32 and the first insulation layer 31 within the plurality of first vias F1 to F25 are etched off to expose a surface of the first semiconductor layer. The third insulation layer 33 and the second insulation layer 32 within the plurality of second vias K1 to K10 are etched away to expose a surface of a first conductive layer. The third insulation layer 33 in the plurality of third vias D1 to D5 is etched away to expose a surface of the second conductive layer.

(6) A pattern of a third conductive layer is formed.

In some exemplary embodiments, a third conductive thin film is deposited on the base substrate 30 where the aforementioned patterns are formed, and the third conductive thin film is patterned by a patterning process, to form a pattern of a third conductive layer on the third insulation layer 33, as shown in FIG. 21. In some examples, the pattern of the third conductive layer may include the first electrodes and the second electrodes of a plurality of transistors (e.g. transistors T1 to T10) of the scan drive control circuit, the first electrode 211 and the second connection electrode 212.

In some exemplary embodiments, a pixel circuit may be formed in the display area while a scan drive control circuit is formed in the non-display area. For example, a first semiconductor layer of the display area may include active layers of transistors of a pixel circuit, a first conductive layer of the display area may include control electrodes of the transistors of the pixel circuit and a first electrode of a storage capacitor, a second conductive layer of the display area may at least include a second electrode of the storage capacitor of the pixel circuit, and a third conductive layer of the display area may at least include a first electrode and a second electrode of the transistor of the pixel circuit. After the first conductive layer is formed, a second semiconductor layer may be formed in the display area, and an insulation layer is disposed between the second semiconductor layer and the first conductive layer. A material of the second semiconductor film may be a metal oxide, for example, In—Ga—Zn—O (IGZO). However, a position of the second semiconductor layer is not limited in the embodiment.

In some exemplary embodiments, after the third conductive layer is formed, patterns of a fourth insulation layer, an anode layer, a pixel definition layer, an organic light emitting layer, a cathode layer, and an encapsulation layer may be sequentially formed in the display area. In some examples, on a substrate where the aforementioned patterns are formed, a fourth insulation thin film is coated, and a pattern of a fourth insulation layer is formed through masking, exposing, and developing for the fourth insulation thin film. Then, an anode thin film is deposited on the base substrate where the display area of the aforementioned patterns is formed, and the anode thin film is patterned through a patterning process to form a pattern of an anode on the fourth insulation layer. Next, on the base substrate where the aforementioned patterns are formed, a pixel definition thin film is coated, and a pattern of a Pixel Definition layer (PDL) is formed through masking, exposure, and development processes. The pixel definition layer is formed in each sub-pixel in the display area. A pixel opening exposing the anode is formed in the pixel definition layer in each sub-pixel. Subsequently, an organic emitting layer is formed in the aforementioned pixel openings, and the organic emitting layer is connected to an anode. Subsequently, a cathode thin film is deposited, and the cathode thin film is patterned through a patterning process to form a pattern of a cathode. Then, an encapsulation layer is formed on the cathode. The encapsulation layer may include a stacked structure of an inorganic material/an organic material/an inorganic material.

In some exemplary embodiments, the first conductive layer, the second conductive layer, and the third conductive layer may be made of metal materials, e.g., any one or more of Argentum (Ag), Copper (Cu), Aluminum (Al), and Molybdenum (Mo), or alloy materials of the aforementioned metals, e.g., an Aluminum-Neodymium alloy (AlNd) or a Molybdenum-Niobium alloy (MoNb), and may have a single-layer structure, or a multilayer composite structure such as Mo/Cu/Mo. The first insulation layer 31, the second insulation layer 32, and the third insulation layer 33 may be made of any one or more of Silicon Oxide (SiOx), Silicon Nitride (SiNx), and Silicon Oxynitride (SiON), and may be a single layer, a multi-layer, or a composite layer. The fourth insulation layer may be made of an organic material, e.g., polyimide (PI), acrylic, or polyethylene terephthalate (PET).

The first insulation layer 31 and the second insulation layer 32 is referred to as Gate Insulation (GI) layers, the third insulation layer 33 is referred to as an Interlayer Dielectric (ILD) layer, and the fourth insulation layer is referred to as a planarization layer. The pixel definition layer may be made of an organic material, such as polyimide, acrylic, or polyethylene terephthalate. The anode may be made of a transparent conductive material, e.g., Indium Tin Oxide (ITO) or Indium Zinc Oxide (IZO). The cathode may be made of any one or more of Magnesium (Mg), Argentum (Ag), Aluminum (Al), Copper (Cu), and Lithium (Li), or an alloy made of any one or more of the aforementioned metals. However, this embodiment is not limited thereto. For example, the anode may be made of a reflective material such as a metal, and the cathode may be made of a transparent conductive material.

The structure shown in the exemplary embodiment and the preparation process thereof are merely illustrative. In some exemplary embodiments, a corresponding structure may be changed and a patterning process may be added or reduced according to actual needs. The preparation process of the exemplary embodiment may be implemented using an existing mature preparation device, and may be compatible well with an existing preparation process, simple in process implementation, easy to implement, high in a production efficiency, low in a production cost, and high in a yield.

An embodiment of the present disclosure further provides a display device, which includes the display substrate as described above. In some exemplary embodiments, the display substrate may be a flexible OLED display substrate, a QLED display substrate, a Micro-LED display substrate or a Mini-LED display substrate. The display device may be any product or component with a display function, such as an OLED display device, a watch, a mobile phone, a tablet computer, a television, a display, a laptop computer, a digital photo frame, and a navigator. However, this embodiment is not limited thereto.

FIG. 25 is a schematic diagram of a structure of a display device according to at least one embodiment of the present disclosure. In some exemplary embodiments, as shown in FIG. 25, the display device may include a timing controller, a data driver, a scan driver, a light emitting driver, and a pixel array, the pixel array may include a plurality of scan lines (e.g. GL1 to GLn), a plurality of data signal lines (e.g. DL1 to DLn), a plurality of light emitting control lines (e.g. EL1 to ELn), and a plurality of sub-pixels 10. Each sub-pixel 10 may be connected to a corresponding data signal line, a corresponding scan line, and a corresponding light emitting control line.

In some exemplary embodiments, the timing controller may provide a gray-scale value and control signal suitable for a specification of the data driver for the data driver, provide a clock signal, scanning starting signal, etc., suitable for a specification of the scanning driver for the scanning driver, and provide a clock signal, transmission stopping signal, etc., suitable for a specification of the light emitting driver for the light emitting driver. The data driver may generate data voltages to be supplied to the data signal lines DL1, DL2, DL3, . . . and DLm by means of the gray-scale value and the control signal received from the timing controller, and m may be an integer. For example, the data driver may sample the gray-scale value by using a clock signal, and apply a data voltage corresponding to the gray-scale value to the data signal lines DL1 to Dn by taking a pixel row as a unit. The scan driver may generate a scan signal to be supplied to the scan lines GL1, GL2, GL3, . . . and GLn by receiving a clock signal, a scan initial signal, etc. from the timing controller, where n may be an integer. For example, the scan driver may sequentially provide the scan signals with on-level pulses to the scan lines GL1 to GLn. For example, the scan driver may be constructed in a form of a shift register and may generate a scan signal by sequentially transmitting a scan initial signal provided in a form of an on-level pulse to a next-stage circuit under control of a clock signal. The light emitting driver may generate an emission signal to be provided to the light emitting signal lines EL1, EL2, EL3, . . . , and ELn by receiving the clock signal and the emission stop signal from the timing controller. For example, the light emitting driver may sequentially provide an emission signal with off-level pulse to the light emitting signal lines EL1 to ELn. For example, the light emitting driver may be constructed in a form of the shift register and generate a light emitting signal by sequentially transmitting emission stop signals provided in the form of the off-level pulse to the next-stage circuit under the control of the clock signal. In some examples, the light emitting driver may include a plurality of cascaded scan drive control circuits as provided in the above embodiments. In this example, the operating timing of the scan drive control circuit can refer to FIG. 10.

In some exemplary embodiments, a shape of a sub-pixel 10 may be rectangular, diamond, pentagonal, or hexagonal. When a pixel unit includes three sub-pixels, the three sub-pixels may be arranged side by side horizontally, side by side vertically, or in a triangle-shaped arrangement. When a pixel unit includes four sub-pixels, the four sub-pixels may be arranged side by side horizontally, side by side vertically, or arranged in a shape of a square. However, this embodiment is not limited thereto.

In some exemplary embodiments, one pixel unit in the display area may include three sub-pixels, and the three sub-pixels may be a red sub-pixel, a green sub-pixel, and a blue sub-pixel respectively. However, this embodiment is not limited thereto. In some examples, one pixel unit may include four sub-pixels, wherein the four sub-pixels are respectively a red sub-pixel, a green sub-pixel, a blue sub-pixel, and a white sub-pixel.

In some example embodiments, a timing controller, a data driver a scan driver and a light emitting driver may be disposed in a non-display area. The scan driver and the light emitting driver may be arranged on two opposite sides of the display area respectively, such as left and right sides of the display area. The timing controller and the data driver may be arranged on a side of the display area, such as a lower side of the display area. However, this embodiment is not limited thereto.

In some exemplary embodiments, a sub-pixel includes a pixel circuit. The pixel circuit may be a 3T1C, 4T1C, 5T1C, 5T2C, 6T1C, or 7T1C structure. However, this embodiment is not limited thereto. For example, the pixel circuit may include an N-type transistor and a P-type transistor. The N-type transistor may be, for example, an oxide thin film transistor and the P-type transistor may be, for example, a Low Temperature Poly Silicon thin film transistor. A Low temperature Poly-Silicon thin film transistor has advantages such as a high mobility and fast charging, while an oxide thin film transistor has an advantage such as a low leakage current. The Low Temperature Poly-Silicon thin film transistor and the oxide thin film transistor form an integrated structure on one display substrate to form a Low Temperature Polycrystalline Oxide (LTPO) display substrate, and advantages of both the Low Temperature Poly-Silicon thin film transistor and the oxide thin film transistor may be utilized, which may achieve low frequency drive, reduce power consumption, and improve display quality.

Figure 27:
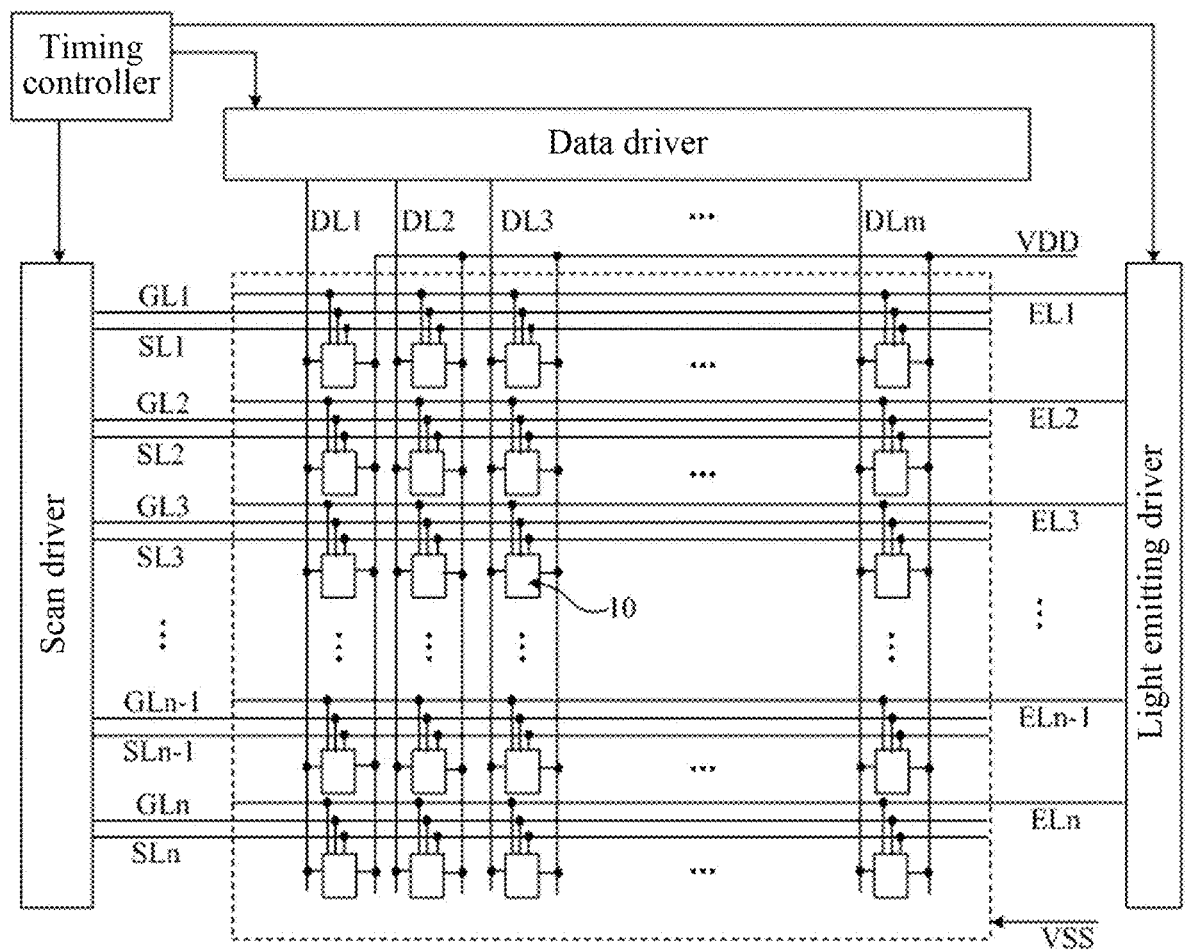
FIG. 27 is another schematic diagram of a structure of a display device according to at least one embodiment of the present disclosure.

FIG. 27 is another schematic diagram of a structure of a display device according to at least one embodiment of the present disclosure. In some exemplary embodiments, as shown in FIG. 27, the scan driver may provide a drive signal to the P-type transistor of the pixel circuit through the first group of scan lines GL1 to GLn, and may also provide a drive signal to the N-type transistor of the pixel circuit through the second group of scan lines SL1 to SLn. The light emitting driver may provide a light emitting signal to the pixel circuit through the light emitting control lines EL1 to ELn. In some examples, the scan driver may include a plurality of cascaded scan drive control circuits as described in the above-described embodiments to provide a drive signal to the N-type transistor of the pixel circuit through the second group of scan lines SL1 to SLn. In this example, the operating timing of the scan drive control circuit can refer to FIG. 9. Regarding other descriptions of the display device in this embodiment, reference may be made to the descriptions of the previous embodiments, and thus will not be repeated here.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:
a base substrate;
a scan drive control circuit disposed in a non-display area of the base substrate;
the scan drive control circuit comprises an input circuit, an output control circuit and an output circuit; the output control circuit is connected to the input circuit and the output circuit;
the output control circuit comprises a first node control capacitor and a second node control capacitor;
lengths of the first node control capacitor, the second node control capacitor and the scan drive control circuit in a first direction satisfy:

$$\frac{L_{C1k}}{L_Y} < \frac{L_{C2k}}{L_Y};$$

$$\frac{L_{C1k}}{L_Y} < 0.20;$$

where, $L_{C1k}$ is a length of the first node control capacitor in the first direction, $L_{C2k}$ is a length of the second node control capacitor in the first direction, $L_Y$ is a length of the scan drive control circuit in the first direction.

2. The display substrate according to claim 1, wherein the first node control capacitor comprises: a first capacitor and a third capacitor;
lengths of the first capacitor, the third capacitor, the second node control capacitor and the scan drive control circuit in the first direction satisfy:

$$\frac{L_{C3}}{L_Y} < \frac{L_{C1}}{L_Y} < \frac{L_{C2k}}{L_Y};$$

$$\frac{L_{C3}}{L_Y} < \frac{L_{C1}}{L_Y} < 0.20;$$

where $L_{C1}$ is a length of the first capacitor in the first direction, $L_{C3}$ is a length of the third capacitor in the first direction, $L_{C2k}$ is the length of the second node control capacitor in the first direction, and $L_Y$ is the length of the scan drive control circuit in the first direction.

3. The display substrate according to claim 2, wherein, the lengths of the first capacitor and the scan drive control circuit in the first direction satisfy:

$$0.07 \le \frac{L_{C1}}{L_Y} < 0.20;$$

the lengths of the second node control capacitor and the scan drive control circuit in the first direction satisfy:

$$0.20 \le \frac{L_{C2k}}{L_Y} \le 0.60;$$

the lengths of the third capacitor and the scan drive control circuit in the first direction satisfy:

$$0.03 \le \frac{L_{C3}}{L_Y} \le 0.09.$$

4. The display substrate according to claim 2, wherein, $$\frac{L_{C1}}{L_Y}$$

is one of the following: 0.09, 0.10, 0.14;

$$\frac{L_{C2k}}{L_Y}$$

is one of the following: 0.22, 0.35, 0.48;

$$\frac{L_{C3}}{L_Y}$$

is one of the following: 0.07, 0.06, 0.05; or $$\frac{L_{C1}}{L_Y} \le 0.09; \text{ or}$$

$$\frac{L_{C2k}}{L_Y} \ge 0.48; \text{ or}$$

$$\frac{L_{C3}}{L_Y} \ge 0.06.$$

5. The display substrate according to claim 2, wherein the lengths of the first capacitor, the second node control capacitor, and the third capacitor in the first direction satisfy:

$$\frac{L_{C3}}{L_{C2k}} < \frac{L_{C1}}{L_{C2k}} < \frac{L_{C3}}{L_{C1}}.$$

6. The display substrate according to claim 2, wherein the third capacitor is connected to a first power supply line; a projection of the third capacitor on the base substrate is overlapped with a projection of the first power supply line on the base substrate, and an overlapped area between the projections of the third capacitor and the first power supply line satisfies:

$$\tfrac{1}{5}S_{C3} < S_{C3\text{-}1} \leq S_{C2};$$

where $S_{C3}$ is an area of the projection of the third capacitor on the base substrate, $S_{C3\text{-}1}$ is the overlapped area between the projections of the third capacitor and the first power supply line on the base substrate; and the second node control capacitor comprises a second capacitor, $S_{C2}$ is an area of the projection of the second capacitor on the base substrate;

or, wherein a projection of the second node control capacitor on the base substrate is overlapped with a projection of the first power supply line on the base substrate an overlapped area between the projections of the second capacitor and the first power supply line satisfies:

$$\tfrac{1}{4}X2*L5 < S_{C2k\text{-}1} < X2*L5;$$

where $S_{C2k\text{-}1}$ is the overlapped area between the projections of the second node control capacitor and the first power supply line on the base substrate, X2 is a length of the first power supply line in the first direction, L5 is a length of an overlapped area between a projection of one of capacitors in the second node control capacitor on the base substrate and a projection of the first power supply line on the base substrate in a second direction; the second direction intersects the first direction;

or, wherein the input circuit is connected to a second power supply line; a projection of the second node control capacitor on the base substrate is overlapped with a projection of the second power supply line on the base substrate, and an overlapped area between the projections of the second node control capacitor and the second power supply line satisfies:

$$\tfrac{1}{4}X3*L6 < S_{C2k\text{-}2} < X3*L6;$$

where $S_{C2k\text{-}2}$ is the overlapped area between the projections of the second node control capacitor and the second power supply line on the base substrate, X3 is a length of the second power supply line in the first direction, L6 is a length of an overlapped area between a projection of one of capacitors in the second node control capacitor on the base substrate and a projection of the second power supply line on the base substrate in a second direction; the second direction intersects the first direction.

7. The display substrate according to claim 2, wherein a projection of the first capacitor on the base substrate is between projections of the first power supply line and the second power supply line on the base substrate;

a distance L7 between a center of the first capacitor in the first direction and a side edge of the first power supply line away from the first capacitor in the first direction is greater than a distance L8 between the center of the first capacitor in the first direction and a side edge of the second power supply line close to the first capacitor in the first direction, and L7>2*L8.

8. The display substrate according to claim 2, wherein the input circuit comprises: a first transistor; a control electrode of the first transistor is connected to a first clock signal line, a first electrode of the first transistor is connected to a signal input terminal, and a second electrode of the first transistor is connected to a second node;

an active layer of the first transistor is adjacent to a second power supply line;

a distance L2 between a side edge of a channel region of the active layer of the first transistor close to the second power supply line and a side edge of the second power supply line away from the first transistor satisfies: $0 \leq L2 \leq 4W_{PL2}$;

where $W_{PL2}$ is a width of the second power supply line; or wherein the input circuit comprises: a third transistor; a control electrode of the third transistor is connected to a first clock signal line, a first electrode of the third transistor is connected to a second power supply line, and a second electrode of the third transistor is connected to a third node;

the second power supply line is located at a side of the third transistor away from the first clock signal line or a second clock signal line;

a distance L3 between a side edge of a channel region of an active layer of the third transistor close to the second power supply line and a side edge of the second power supply line away from the third transistor satisfies: $0 \leq L3 \leq 4W_{PL2}$;

where $W_{PL2}$ is a width of the second power supply line.

9. The display substrate according to claim 2, wherein the input circuit is connected to a first clock signal line and a second power supply line, and the output control circuit is connected to a second clock signal line; the input circuit comprises a second transistor; a control electrode of the second transistor is connected to the second node, a first electrode of the second transistor is connected to a first clock signal line, and a second electrode of the second transistor is connected to a third node; ands the second power supply line is located at a side of the second transistor away from the first clock signal line; an active layer of the second transistor is adjacent to the second power supply line; a distance L4 between a side edge of a channel region of the active layer of the second transistor close to the second power supply line and a side edge of the second power supply line away from the second transistor satisfies: $0 \leq L4 \leq 3W_{PL2}$; where $W_{PL2}$ is a width of the second power supply line.

10. The display substrate according to claim 2, wherein the output control circuit comprises: a first output control sub-circuit;

the first output control sub-circuit comprises a fourth transistor and a fifth transistor; a control electrode of the fourth transistor is connected to the second node, a first electrode of the fourth transistor is connected to a second electrode of the fifth transistor, and a second electrode of the fourth transistor is connected to a second clock signal line; a control electrode of the fifth transistor is connected to a third node, and a first electrode of the fifth transistor is connected to a first power supply line;

the fourth transistor and the fifth transistor are located at a side of the second power supply line away from the second clock signal line; and an angle between an extension direction of an active layer of the fourth transistor and an extension direction of an active layer of the fifth transistor is greater than 85° and less than 95°.

11. The display substrate according to claim 10, wherein, a width $W_{T4}$ of a channel region of the active layer of the fourth transistor and a width $W_{T5}$ of a channel region of the active layer of the fifth transistor satisfy: $2W_{T4} < W_{T5}$; or
wherein an angle between the extension direction of the active layer of the fourth transistor and an extension direction of an active layer of the first transistor of the input circuit is greater than 85° and less than 95°.

12. The display substrate according to claim 2, wherein the output control circuit comprises a second output control sub-circuit, the second output control sub-circuit comprises a seventh transistor;
a control electrode of the seventh transistor is connected to a second electrode of the first capacitor, and a first electrode of the seventh transistor is connected to the first node; and
the seventh transistor is adjacent to the first capacitor, and the seventh transistor is located between the first capacitor and the first power supply line.

13. The display substrate according to claim 12, wherein the second output control sub-circuit further comprises a sixth transistor, a control electrode of the sixth transistor is connected to a first electrode of the first capacitor, a second electrode of the sixth transistor is connected to a second electrode of the seventh transistor, and a first electrode of the sixth transistor is connected to a second signal terminal; and
an extension direction of an active layer of the seventh transistor is approximately parallel to an extension direction of an active layer of the sixth transistor.

14. The display substrate according to claim 2, wherein the output control circuit comprises a third output control sub-circuit which comprises an eighth transistor and a third capacitor; a control electrode of the eighth transistor is connected to the second node, a first electrode of the eighth transistor is connected to a first power supply line, and a second electrode of the eighth transistor is connected to the first node; a first electrode of the third capacitor is connected to the first node, and a second electrode of the third capacitor is connected to the first power supply line;
the input circuit comprises a first transistor;
the first transistor, the eighth transistor, and the third capacitor are sequentially arranged along the first direction, and an extension direction of an active layer of the first transistor is approximately parallel to an extension direction of an active layer of the eighth transistor.

15. The display substrate according to claim 14, wherein a distance L9 between a side edge of the active layer of the eighth transistor close to the third capacitor and a side edge of the third capacitor close to the eighth transistor satisfies: $W_{CLK} < L9 \leq W_{PL1}$; where $W_{CLK}$ is a width of a clock signal line, $W_{PL1}$ is a width of the first power supply line.

16. The display substrate according to claim 2, wherein capacitance values of the first capacitor, the third capacitor and the second node control capacitor satisfy:

$$C_1 < C_3 < C_{2k};$$
$$\frac{C_1}{C_{2k}} < \frac{C_3}{C_{2k}} < \frac{C_1}{C_3};$$

where $C_1$ is a capacitance value of the first capacitor, $C_3$ is a capacitance value of the third capacitor, $C_{2k}$ is a capacitance value of the second node control capacitor.

17. The display substrate according to claim 16, wherein a first electrode of the first capacitor is connected to a third node, and a second electrode of the first capacitor is connected to a seventh transistor;
a first electrode of the third capacitor is connected to the first node, and a second electrode of the third capacitor is connected to a first power supply line;
a first electrode of the second node control capacitor is connected to the second node; and
a sum of the capacitance values of the first capacitor and the third capacitor is smaller than the capacitance value of the second node control capacitor; or
wherein the output circuit comprises a tenth transistor, the second node control capacitor comprises a second capacitor, and a first electrode of the second capacitor is integrated with a control electrode of the tenth transistor.

18. The display substrate according to claim 17, wherein the second node control capacitor comprises a second capacitor, a first electrode of the second capacitor is connected to the second node, and a second electrode of the second capacitor is connected to a signal output terminal; and
the second node control capacitor further comprises: a fourth capacitor, a first electrode of the fourth capacitor is connected to the second node, and a second electrode of the fourth capacitor is connected to a fourth transistor and a fifth transistor; and
the first electrode of the second capacitor of the scan drive control circuit of present stage and a first electrode of a fourth capacitor of a scan drive control circuit of a next stage form an integrated structure.

19. The display substrate according to claim 1, wherein the input circuit is connected to a first clock signal line; the output control circuit is connected to a second clock signal line and a first power supply line; the output circuit is connected to the first power supply line and a third power supply line; and
the first clock signal line, the second clock signal line, an initial signal line, the first power supply line and the third power supply line are sequentially arranged along the first direction.

20. A display device, comprising the display substrate according to claim 1.

* * * * *